(12) United States Patent
Uochi et al.

(10) Patent No.: US 9,184,189 B2
(45) Date of Patent: Nov. 10, 2015

(54) SEMICONDUCTOR DEVICE, DISPLAY DEVICE, AND ELECTRONIC APPLIANCE

(71) Applicant: Semiconductor Energy Laboratory Co., Ltd., Atsugi-shi, Kanagawa-ken (JP)

(72) Inventors: Hideki Uochi, Atsugi (JP); Daisuke Kawae, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 14/311,924

(22) Filed: Jun. 23, 2014

(65) Prior Publication Data
US 2014/0302639 A1    Oct. 9, 2014

Related U.S. Application Data

(60) Division of application No. 13/585,077, filed on Aug. 14, 2012, now Pat. No. 8,759,829, which is a continuation of application No. 12/726,370, filed on Mar. 18, 2010, now Pat. No. 8,253,135.

(30) Foreign Application Priority Data

Mar. 27, 2009    (JP) ................................. 2009-078084

(51) Int. Cl.
*H01L 21/00* (2006.01)
*H01L 27/12* (2006.01)
(Continued)

(52) U.S. Cl.
CPC .......... *H01L 27/127* (2013.01); *G02F 1/13454* (2013.01); *G02F 1/13458* (2013.01); *H01L 27/1225* (2013.01); *H01L 29/7869* (2013.01); *G02F 2001/13629* (2013.01)

(58) Field of Classification Search
CPC .......................... H01L 27/1225; H01L 27/127
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 101335304 A | 12/2008 |
| CN | 101356652 A | 1/2009 |

(Continued)

OTHER PUBLICATIONS

Prins.M et al., "A Ferroelectric Transparent Thin-Film Transistor", Appl. Phys. Lett. (Applied Physics Letters), Jun. 17, 1996, vol. 68, No. 25, pp. 3650-3652.

(Continued)

*Primary Examiner* — Bilkis Jahan
(74) *Attorney, Agent, or Firm* — Eric J. Robinson; Robinson Intellectual Property Law Office, P.C.

(57) ABSTRACT

To reduce adverse effects on actual operation and to reduce adverse effects of noise. A structure including an electrode, a wiring electrically connected to the electrode, an oxide semiconductor layer overlapping with the electrode in a plane view, an insulating layer provided between the electrode and the oxide semiconductor layer in a cross-sectional view, and a functional circuit to which a signal is inputted from the electrode through the wiring and in which operation is controlled in accordance with the signal inputted. A capacitor is formed using an oxide semiconductor layer, an insulating layer, and a wiring or an electrode.

15 Claims, 30 Drawing Sheets

(51) Int. Cl.
　　*G02F 1/1345* (2006.01)
　　*H01L 29/786* (2006.01)
　　*G02F 1/1362* (2006.01)

(56) References Cited

U.S. PATENT DOCUMENTS

| | | | |
|---|---|---|---|
| 5,835,177 A | 11/1998 | Dohjo et al. | |
| 5,847,410 A | 12/1998 | Nakajima | |
| 5,928,766 A | 7/1999 | Hanamura | |
| 5,966,190 A | 10/1999 | Dohjo et al. | |
| 6,028,652 A | 2/2000 | Dohjo et al. | |
| 6,078,366 A | 6/2000 | Dohjo et al. | |
| 6,140,198 A | 10/2000 | Liou | |
| 6,197,663 B1 | 3/2001 | Chandross et al. | |
| 6,294,274 B1 | 9/2001 | Kawazoe et al. | |
| 6,407,393 B1 * | 6/2002 | Kim et al. | 250/370.09 |
| 6,563,174 B2 | 5/2003 | Kawasaki et al. | |
| 6,586,346 B1 | 7/2003 | Yamazaki et al. | |
| 6,621,536 B1 | 9/2003 | Taguchi | |
| 6,727,522 B1 | 4/2004 | Kawasaki et al. | |
| 6,960,812 B2 | 11/2005 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,279,765 B2 * | 10/2007 | Ahn et al. | 257/449 |
| 7,282,782 B2 | 10/2007 | Hoffman et al. | |
| 7,297,977 B2 | 11/2007 | Hoffman et al. | |
| 7,301,211 B2 | 11/2007 | Yamazaki et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,423,343 B2 | 9/2008 | Kurokawa | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,598,520 B2 | 10/2009 | Hirao et al. | |
| 7,635,889 B2 | 12/2009 | Isa et al. | |
| 7,655,560 B2 | 2/2010 | Kurokawa | |
| 7,674,650 B2 | 3/2010 | Akimoto et al. | |
| 7,732,819 B2 | 6/2010 | Akimoto et al. | |
| 7,768,008 B2 | 8/2010 | Ishizaki et al. | |
| 7,855,379 B2 | 12/2010 | Hayashi et al. | |
| 7,910,490 B2 | 3/2011 | Akimoto et al. | |
| 7,932,521 B2 | 4/2011 | Akimoto et al. | |
| 7,993,964 B2 | 8/2011 | Hirao et al. | |
| 7,998,372 B2 | 8/2011 | Yano et al. | |
| 8,003,981 B2 | 8/2011 | Iwasaki et al. | |
| 8,008,658 B2 | 8/2011 | Park et al. | |
| 8,072,554 B2 * | 12/2011 | Yang et al. | 349/38 |
| 8,088,652 B2 | 1/2012 | Hayashi et al. | |
| 8,093,589 B2 | 1/2012 | Sugihara et al. | |
| 8,102,476 B2 | 1/2012 | Son et al. | |
| 8,158,974 B2 | 4/2012 | Yano et al. | |
| 8,274,077 B2 | 9/2012 | Akimoto et al. | |
| 8,324,018 B2 | 12/2012 | Isa et al. | |
| 8,436,349 B2 | 5/2013 | Sano et al. | |
| 8,466,463 B2 | 6/2013 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218221 A1 | 11/2003 | Wager, III et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0195204 A1 | 10/2004 | Ahn et al. | |
| 2005/0017246 A1 * | 1/2005 | Sekiguchi et al. | 257/72 |
| 2005/0017302 A1 | 1/2005 | Hoffman | |
| 2005/0117078 A1 * | 6/2005 | Lai et al. | 349/38 |
| 2005/0122755 A1 | 6/2005 | Tsutsumi et al. | |
| 2005/0199880 A1 | 9/2005 | Hoffman et al. | |
| 2005/0199959 A1 | 9/2005 | Chiang et al. | |
| 2006/0035452 A1 | 2/2006 | Carcia et al. | |
| 2006/0043370 A1 * | 3/2006 | Lai | 257/71 |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 * | 3/2007 | Akimoto et al. | 438/795 |
| 2007/0090365 A1 | 4/2007 | Hayashi et al. | |
| 2007/0108446 A1 | 5/2007 | Akimoto | |
| 2007/0115219 A1 | 5/2007 | Inoue | |
| 2007/0141784 A1 | 6/2007 | Wager, III et al. | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0278490 A1 | 12/2007 | Hirao et al. | |
| 2007/0287296 A1 | 12/2007 | Chang | |
| 2008/0006877 A1 | 1/2008 | Mardilovich et al. | |
| 2008/0018229 A1 * | 1/2008 | Yamazaki | 313/498 |
| 2008/0023703 A1 * | 1/2008 | Hoffman et al. | 257/59 |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0128857 A1 | 6/2008 | Bi | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0203387 A1 | 8/2008 | Kang et al. | |
| 2008/0224133 A1 | 9/2008 | Park et al. | |
| 2008/0230821 A1 * | 9/2008 | Shionoiri | 257/296 |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0291350 A1 | 11/2008 | Hayashi et al. | |
| 2008/0296568 A1 | 12/2008 | Ryu et al. | |
| 2008/0303020 A1 | 12/2008 | Shin et al. | |
| 2008/0308796 A1 | 12/2008 | Akimoto et al. | |
| 2008/0308797 A1 | 12/2008 | Akimoto et al. | |
| 2008/0308804 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0045397 A1 | 2/2009 | Iwasaki | |
| 2009/0065771 A1 | 3/2009 | Iwasaki et al. | |
| 2009/0068773 A1 | 3/2009 | Lai et al. | |
| 2009/0073325 A1 | 3/2009 | Kuwabara et al. | |
| 2009/0101895 A1 | 4/2009 | Kawamura et al. | |
| 2009/0114910 A1 | 5/2009 | Chang | |

(56) References Cited

U.S. PATENT DOCUMENTS

| | | | |
|---|---|---|---|
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0237000 A1 | 9/2009 | Inoue | |
| 2009/0278122 A1 | 11/2009 | Hosono et al. | |
| 2009/0280600 A1 | 11/2009 | Hosono et al. | |
| 2009/0305461 A1 | 12/2009 | Akimoto et al. | |
| 2010/0025677 A1 | 2/2010 | Yamazaki et al. | |
| 2010/0025678 A1 | 2/2010 | Yamazaki et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0136743 A1 | 6/2010 | Akimoto et al. | |
| 2010/0224871 A1* | 9/2010 | Yamaguchi et al. | 257/43 |
| 2010/0301326 A1* | 12/2010 | Miyairi et al. | 257/43 |
| 2011/0104851 A1 | 5/2011 | Akimoto et al. | |
| 2011/0117697 A1 | 5/2011 | Akimoto et al. | |
| 2011/0121290 A1 | 5/2011 | Akimoto et al. | |
| 2012/0168748 A1 | 7/2012 | Yano et al. | |
| 2012/0305914 A1 | 12/2012 | Uochi et al. | |

FOREIGN PATENT DOCUMENTS

| | | |
|---|---|---|
| CN | 101369542 A | 2/2009 |
| EP | 1737044 A | 12/2006 |
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| EP | 2579237 A | 4/2013 |
| GB | 2425401 | 10/2006 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-198806 A | 8/1993 |
| JP | 05-251705 A | 9/1993 |
| JP | 07-104312 A | 4/1995 |
| JP | 08-264794 A | 10/1996 |
| JP | 09-160076 A | 6/1997 |
| JP | 11-505377 | 5/1999 |
| JP | 11-150275 A | 6/1999 |
| JP | 2000-044236 A | 2/2000 |
| JP | 2000-150900 A | 5/2000 |
| JP | 2000-194009 A | 7/2000 |
| JP | 2001-183992 A | 7/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-077822 A | 3/2005 |
| JP | 2005-302808 A | 10/2005 |
| JP | 2006-165532 A | 6/2006 |
| JP | 2006-237586 A | 9/2006 |
| JP | 2007-096055 A | 4/2007 |
| JP | 2007-115808 A | 5/2007 |
| JP | 2007-123861 A | 5/2007 |
| JP | 2007-142195 A | 6/2007 |
| JP | 2007-194594 A | 8/2007 |
| JP | 2007-220817 A | 8/2007 |
| JP | 2007-250983 A | 9/2007 |
| JP | 2007-293072 A | 11/2007 |
| WO | WO-2004/114391 | 12/2004 |
| WO | WO-2007/119386 | 10/2007 |
| WO | WO-2007/142167 | 12/2007 |
| WO | WO-2008/105347 | 9/2008 |
| WO | WO-2008/133345 | 11/2008 |

OTHER PUBLICATIONS

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nakamura.M et al., "Syntheses and crystal structures of new homologous compounds, indium iron zinc oxides (InFeO3(ZnO)m) (m natural number) and related compounds", Kotai Butsuri (Solid State Physics), 1993, vol. 28, No. 5, pp. 317-327.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White TANDEM OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCUPS on Flexible and Glass Substrates for Secure RFID Systems", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

(56) References Cited

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3—In2O3-ZnO) TFT", SID Digest '08 : SID International Symposium Digest of Technical Papers, May 20, 2008, vol. 39, pp. 633-636.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Nakamura.M, "Synthesis of Homologous Compound with New Long-Period Structure", NIRIM Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

(56) References Cited

OTHER PUBLICATIONS

Janotti.A et al., "Oxygen Vacancies In ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Chinese Office Action (Application No. 201010142780.5) Dated Nov. 26, 2013.

Taiwanese Office Action (Application No. 099108712) Dated Feb. 25, 2015.

\* cited by examiner

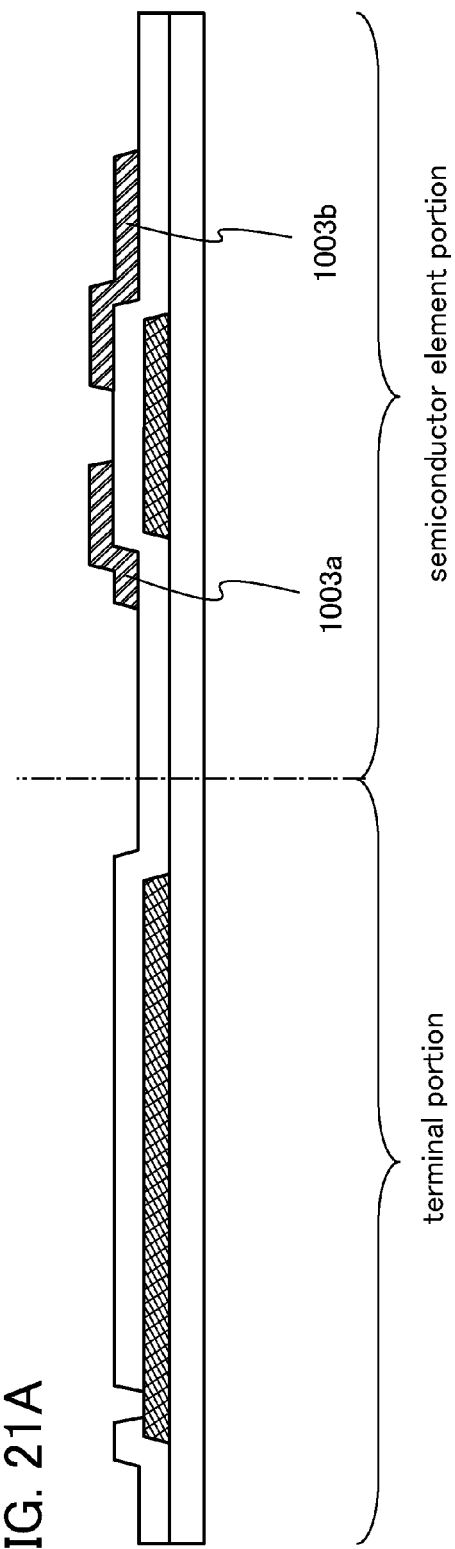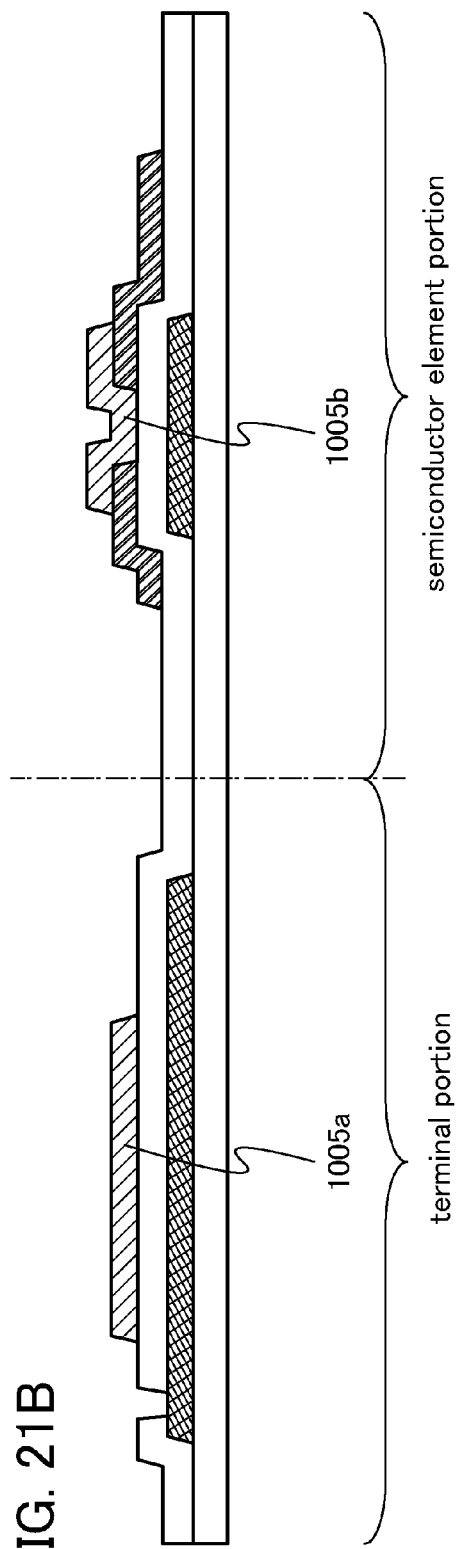

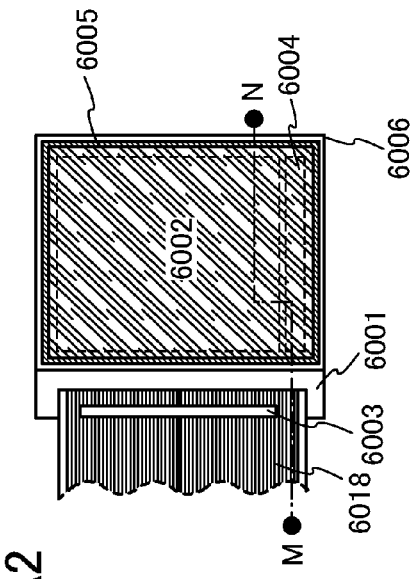
FIG. 24A1
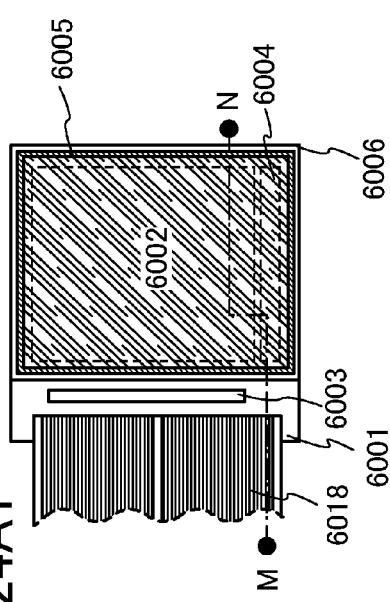
FIG. 24A2
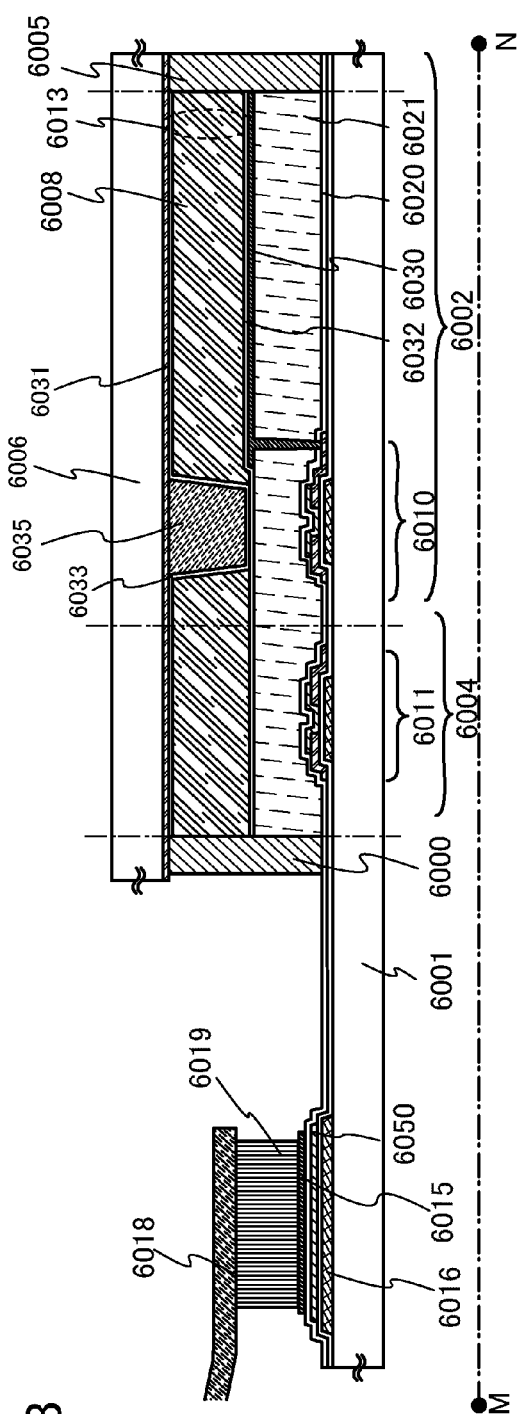
FIG. 24B

SEMICONDUCTOR DEVICE, DISPLAY DEVICE, AND ELECTRONIC APPLIANCE

BACKGROUND OF THE INVENTION

1. Field of the Invention

The present invention relates to a semiconductor device. Further, the present invention relates to a display device. Furthermore, the present invention relates to an electronic appliance including a display device in a display portion.

2. Description of the Related Art

Various metal oxides are used for a variety of applications. For example, indium oxide is a well-known material and used for a material of a transparent electrode which is needed in a liquid crystal display or the like.

Some metal oxides have semiconductor characteristics. As metal oxides exhibiting semiconductor characteristics, for example, tungsten oxide, tin oxide, indium oxide, zinc oxide, and the like can be given. References disclose a thin film transistor in which such a metal oxide exhibiting semiconductor characteristics is used for a channel formation region (Patent Documents 1 to 4, and Non-Patent Document 1).

Further, not only unitary oxides but also multiple oxides are known as metal oxides. For example, $InGaO_3(ZnO)_m$ (m is a natural number) belonging to homologous series has been known as a multi-component oxide semiconductor including In, Ga, and Zn (Non-Patent Documents 2 to 4).

In addition, it has been confirmed that an oxide semiconductor including such an In—Ga—Zn-based oxide can be used as a channel layer of a thin film transistor (Patent Document 5, and Non-Patent Documents 5 and 6).

A TFT in which a channel formation layer is formed using an oxide semiconductor has a higher electric field mobility than a TFT using amorphous silicon.

TFTs which are formed using such an oxide semiconductor over a glass substrate, a plastic substrate, or the like are expected to be applied to display devices such as a liquid crystal display, an electroluminescence display (also referred to as an EL display), and electronic paper.

A semiconductor device such as a display device has a problem in that malfunction occurs or a circuit in a display device is damaged due to noise.

Examples of the noise include conductive noise, emission noise, and the like. Examples of the conductive noise include a high-speed burst wave and the like. Examples of the emission noise include electrostatic discharge and the like.

In order to reduce adverse effects of the noise, display devices provided with a variety of protective means against noise have been proposed (Patent Document 6).

REFERENCES

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957
[Patent Document 6] Japanese Published Patent Application No. H11-150275

Non-Patent Document

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68, pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178
[Non-Patent Document 4] M. Nakamura, N. Kimizuka, T. Mohri, and M. Isobe, "Syntheses and crystal structures of new homologous compound, indium iron zinc oxides ($InFeO_3(ZnO)_m$ (m: natural number) and related compounds", *KOTAI BUTSURI (SOLID STATE PHYSICS)*, 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432, pp. 488-492

SUMMARY OF THE INVENTION

It is an object of one embodiment of the present invention to reduce adverse effects on actual operation and to reduce adverse effects of noise.

One embodiment of the present invention is to include a capacitor formed using a conductive layer to be a terminal electrode or a wiring, an oxide semiconductor layer, and an insulating layer, and to reduce adverse effects of noise by filtering with the use of a filter circuit formed using the capacitor and a resistor.

One embodiment of the present invention is a semiconductor device including a terminal electrode, a wiring electrically connected to the terminal electrode, an oxide semiconductor layer overlapping with the terminal electrode in a plane view, an insulating layer provided between the terminal electrode and the oxide semiconductor layer in a cross-sectional view, and a functional circuit to which a signal is inputted from the terminal electrode through the wiring and in which operation is controlled in accordance with the signal inputted.

One embodiment of the present invention is a semiconductor device including a terminal electrode, a wiring electrically connected to the terminal electrode, an oxide semiconductor layer overlapping with the wiring in a plane view, an insulating layer provided between the wiring and the oxide semiconductor layer in a cross-sectional view, and a functional circuit to which a signal is inputted from the terminal electrode through the wiring and in which operation is controlled in accordance with the signal inputted.

In the embodiment of the present invention, power supply voltage may be applied to the oxide semiconductor layer.

One embodiment of the present invention is a semiconductor device including a terminal electrode, a first wiring, a second wiring electrically connected to the terminal electrode, an oxide semiconductor layer which is electrically connected to the second wiring and which overlaps with the first wiring in a plane view, an insulating layer provided between the first wiring and the oxide semiconductor layer in a cross-sectional view, and a functional circuit to which a signal is inputted from the terminal electrode through the second wiring and in which operation is controlled in accordance with the signal inputted.

In the embodiment of the present invention, power supply voltage may be applied to the first wiring.

In the embodiment of the present invention, the functional circuit can include a semiconductor element using an oxide semiconductor layer.

One embodiment of the present invention is a display device including a substrate, a wiring provided over the substrate, a first insulating layer provided over the substrate with the wiring interposed therebetween, a first oxide semiconductor layer provided over the first insulating layer, a second insulating layer provided over the first insulating layer with the oxide semiconductor layer interposed therebetween, a terminal electrode which is provided over the second insulating layer and is electrically connected to the wiring through an opening portion provided in the first insulating layer and the second insulating layer, a driver circuit to which a signal is inputted from the terminal electrode through the wiring and in which operation is controlled in accordance with the signal inputted, and a pixel whose operation is controlled by the driver circuit. In addition, in the embodiment, the driver circuit and the pixel each include a transistor, and the transistor includes a gate electrode provided over the substrate, a gate insulating layer provided over the substrate with the gate electrode interposed therebetween, a source electrode and a drain electrode which are provided over the gate insulating layer, a second oxide semiconductor layer which is provided over the gate electrode with the gate insulating layer interposed therebetween and is provided over the gate insulating layer with the source electrode and the drain electrode interposed therebetween, a protective layer provided over the gate insulating layer with the source electrode, the drain electrode, and the second oxide semiconductor layer interposed therebetween, and an electrode which is provided over the protective layer and is electrically connected to one of the source electrode and the drain electrode through an opening portion provided in the protective layer.

In the embodiment of the present invention, the first oxide semiconductor layer can be provided over the wiring with the first insulating layer interposed therebetween.

In the embodiment of the present invention, the terminal electrode can be provided over the first oxide semiconductor layer with the second insulating layer interposed therebetween.

In the embodiment of the present invention, the first insulating layer can be in a same layer as the gate insulating layer, and the second insulating layer can be in a same layer as the protective layer.

One embodiment of the present invention is an electronic appliance including the above-described display device in a display portion.

One embodiment of the present invention is a method for manufacturing a display device including the steps of forming a first conductive film over a substrate and selectively etching the first conductive film to form a first conductive layer and a second conductive layer; forming a first insulating layer over the substrate with the first conductive layer and the second conductive layer interposed therebetween and selectively etching the first insulating layer to expose part of the first conductive layer; forming a second conductive film over the first insulating layer and selectively etching the second conductive film to form a third conductive layer and a fourth conductive layer; forming an oxide semiconductor film over the first insulating layer with the third conductive layer and the fourth conductive layer interposed therebetween and selectively etching the oxide semiconductor film to form a first oxide semiconductor layer over the first insulating layer and to form a second oxide semiconductor layer over the second conductive layer with the second conductive layer, the third conductive layer, and the fourth conductive layer interposed therebetween; forming a second insulating layer over the first insulating layer with the third conductive layer, the fourth conductive layer, the first oxide semiconductor layer, and the second oxide semiconductor layer interposed therebetween and selectively etching the second insulating layer to expose part of the first conductive layer and part of the fourth conductive layer; and forming a third conductive film over the exposed part of the first conductive layer, the exposed part of the fourth conductive layer, and the second insulating layer and selectively etching the third conductive film to form a fifth conductive layer which is electrically connected to the first conductive layer and has a function as a terminal electrode and to form a sixth conductive layer electrically connected to the fourth conductive layer.

In the embodiment of the present invention, the first oxide semiconductor layer may be formed over the wiring with the first insulating layer interposed therebetween.

In the embodiment of the present invention, the terminal electrode may be formed over the oxide semiconductor layer with the second insulating layer interposed therebetween.

According to one embodiment of the present invention, adverse effects on actual operation can be reduced and adverse effects of noise can be reduced.

BRIEF DESCRIPTION OF THE DRAWINGS

FIGS. 21A and 21B are cross-sectional views illustrating an example of a method for manufacturing a terminal portion and a semiconductor element portion of the display device in Embodiment 3.

FIGS. 24A1, 24A2, and 24B illustrate examples of a structure of a liquid crystal panel in Embodiment 4.

DETAILED DESCRIPTION OF THE INVENTION

Embodiments of the present invention will be described below with reference to accompanying drawings. However, the present invention is not limited to the description given below, and it will be readily apparent to those skilled in the art that various changes and modifications in modes and details thereof can be made without departing from the purpose and scope of the present invention. Therefore, the present invention should not be interpreted as being limited to the description of Embodiments given below.

(Embodiment 1)

In Embodiment 1, a semiconductor device which is an embodiment of the present invention is described.

Figure 1A:
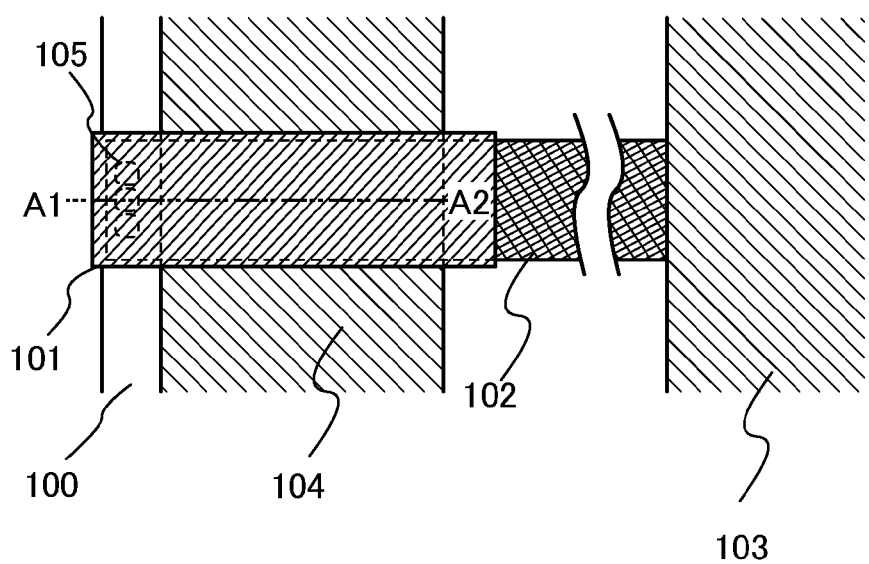
FIGS. 1A and 1B illustrate an example of a structure of a semiconductor device in Embodiment 1.
Figure 1B:
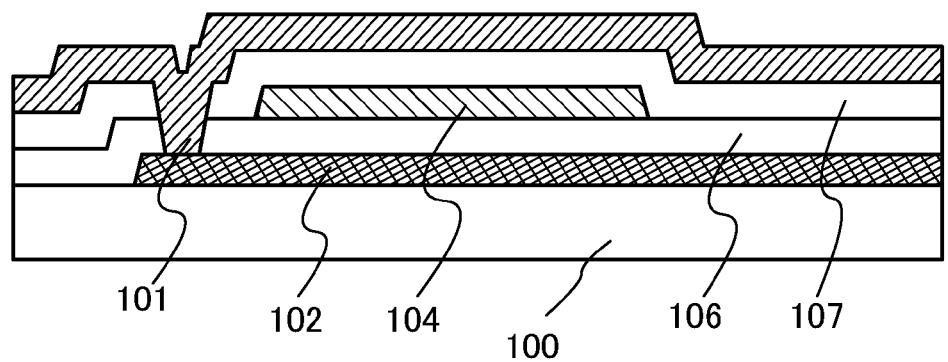

An example of a structure of a semiconductor device in Embodiment 1 is described with reference to FIGS. 1A and 1B. FIGS. 1A and 1B illustrate the example of the structure of the semiconductor device in Embodiment 1. FIG. 1A is a top view and FIG. 1B is a cross-sectional view taken along line A1-A2 of FIG. 1A.

The semiconductor device illustrated in FIGS. 1A and 1B includes a substrate 100, an electrode 101, a wiring 102, a functional circuit 103, and an oxide semiconductor layer 104 as illustrated in FIG. 1A, and further includes an insulating layer 106 and an insulating layer 107 as illustrated in FIG. 1B.

As illustrated in FIG. 1B, the wiring 102 is provided over the substrate 100; the insulating layer 106 is provided over the substrate 100 with the wiring 102 interposed therebetween; the oxide semiconductor layer 104 is provided over the insulating layer 106; and the insulating layer 107 is provided over the insulating layer 106 with the oxide semiconductor layer 104 interposed therebetween.

Note that when it is described that "A is provided over B" in this specification, it does not necessarily mean that B is provided over and in direct contact with A unless otherwise specified. For example, the case where another object is interposed between A and B in the cross-sectional view is also included. Here, each of A and B corresponds to an object (e.g., a device, an element, a circuit, a wiring, an electrode, a terminal, a film, or a layer).

Similarly, when it is described that "A is provided under B", it does not necessarily mean that A is provided under and in direct contact with B, and, for example, the case where another object is interposed between A and B in the cross-sectional view is also included.

The electrode 101 is electrically connected to the wiring 102 via an opening portion 105 provided in the insulating layer 106 and the insulating layer 107. The electrode 101 has a function as a terminal electrode of the semiconductor device. The terminal electrode can have a function as a terminal to which a signal is inputted from outside (such a terminal is also referred to as a signal input terminal), a terminal to which a power is supplied (such a terminal is also referred to as a power supply terminal), or a terminal used as a connection portion with another element, another circuit, or the like (such a terminal is also referred to as a connection terminal). The electrode 101 can be formed using a conductive material, for example.

The wiring 102 can be formed using a conductive material, for example.

The functional circuit 103 is a circuit having a given function. For example, a signal is inputted via the electrode 101 and the wiring 102 to the functional circuit 103, and, in accordance with the signal inputted, the operation of the functional circuit 103 is controlled. For example, voltage is applied to the functional circuit 103 via the electrode 101 and the wiring 102. The functional circuit 103 can be formed using an electronic circuit including a semiconductor element, for example. Further, the semiconductor element can be formed using an oxide semiconductor material, for example. Some oxide semiconductor materials have a light-transmitting property, and have mobility higher than amorphous silicon or the like, for example.

Note that in general, voltage refers to the difference between potentials of two points (also referred to as the potential difference), and a potential refers to the amount of work which is needed for transferring a unit charge from one point to another point in an electric field. However, in an electric circuit, even when only one point is used, the potential difference between a potential at the one point and a potential serving as a reference (also referred to as a reference potential) is sometimes used as a value in a circuit diagram or the like, for example. Moreover, both the level of voltage and the value of a potential are represented by volts (V) in a circuit diagram or the like in some cases; therefore, it is difficult to distinguish them. Thus, in the document (the specification and the scope of claims) of the present application, the phrase "voltage at one point" refers to a potential difference between the one point and a reference potential unless otherwise specified.

As power supply voltage, voltage on the comparatively high voltage side or voltage on the comparatively low voltage side can be used, for example. Power supply voltage on the high voltage side is referred to as high power supply voltage (also referred to as $V_{dd}$), and power supply voltage on the low voltage side is referred to as low power supply voltage (also referred to as $V_{ss}$). Further, a ground potential can be used as the high power supply voltage or the low power supply voltage. For example, in the case where a ground potential is used as the high power supply voltage, the low power supply voltage is voltage lower than the ground potential, and in the case where a ground potential is used as the low power supply voltage, the high power supply voltage is voltage higher than the ground potential.

For the oxide semiconductor layer 104, an oxide semiconductor material can be used, for example. Therefore, in the case where a semiconductor element using an oxide semiconductor material is applied to the functional circuit 103, for example, it is possible to form a semiconductor layer used for the semiconductor element of the functional circuit 103 and the oxide semiconductor layer 104 by selective etching of a semiconductor film formed using the same oxide semiconductor material (such a semiconductor film is also referred to as an oxide semiconductor film), so that the semiconductor layer used for the semiconductor element of the functional circuit 103 and the oxide semiconductor layer 104 are formed in the same layer. Thus, the oxide semiconductor layer 104 can be formed without increasing the number of steps.

As the oxide semiconductor film, an oxide semiconductor film including any of Sn, In, or Zn can be used, for example. Further, in the case where an oxide semiconductor film is used, an oxide semiconductor film including an amorphous component can be used. Furthermore, an oxide semiconductor film including a crystal grain (also referred to as nanocrystal) can be used. At this time, the crystal grain (also referred to as nanocrystal) in the oxide semiconductor film has a diameter of 1 nm to 10 nm, typically approximately 2 nm to 4 nm.

As the oxide semiconductor, an oxide semiconductor having a structure represented by $InMO_3(ZnO)_m$ (m>0) can be alternatively used, for example. Note that M represents one or more of metal elements selected from gallium (Ga), iron (Fe), nickel (Ni), manganese (Mn), or cobalt (Co). As an example, M may be Ga or may include the above metal element in addition to Ga; for example, M may be Ga and Ni, or Ga and Fe. Moreover, in the above oxide semiconductor, in some cases, a transition metal element such as Fe or Ni or an oxide of the transition metal is contained as an impurity element in addition to a metal element contained as M. In this specification, among the oxide semiconductors whose composition formulas are represented by $InMO_3(ZnO)_m$ (m>0), an oxide semiconductor whose composition formula includes at least Ga as M is referred to as an In—Ga—Zn—O-based oxide semiconductor, and a thin film of the In—Ga—Zn—O-based oxide semiconductor is also referred to as an In—Ga—Zn—O-based non-single-crystal film.

As the oxide semiconductor film, any of the following oxide semiconductor films can be applied as well as the above: an In—Sn—Zn—O-based oxide semiconductor film; an Al—In—Zn—O-based oxide semiconductor film; a Ga—Sn—Zn—O-based oxide semiconductor film; an Al—Ga—Zn—O-based oxide semiconductor film; an Al—Sn—Zn—O-based oxide semiconductor film; an In—Zn—O-based oxide semiconductor film; a Sn—Zn—O-based oxide semiconductor film; an Al—Zn—O-based oxide semiconductor film; an In—O-based oxide semiconductor film; a Sn—O-based oxide semiconductor film; and a Zn—O-based oxide semiconductor film.

As illustrated in FIGS. 1A and 1B as an example, the semiconductor device of Embodiment 1 includes a capacitor formed using an oxide semiconductor layer, a conductive layer which forms a wiring or an electrode, and an insulating layer provided between the oxide semiconductor layer and the conductive layer. This capacitor has a function as part of a protection circuit. Further, this capacitor has a function as part of a filter circuit for reducing the adverse effects of noise.

Figure 2A:
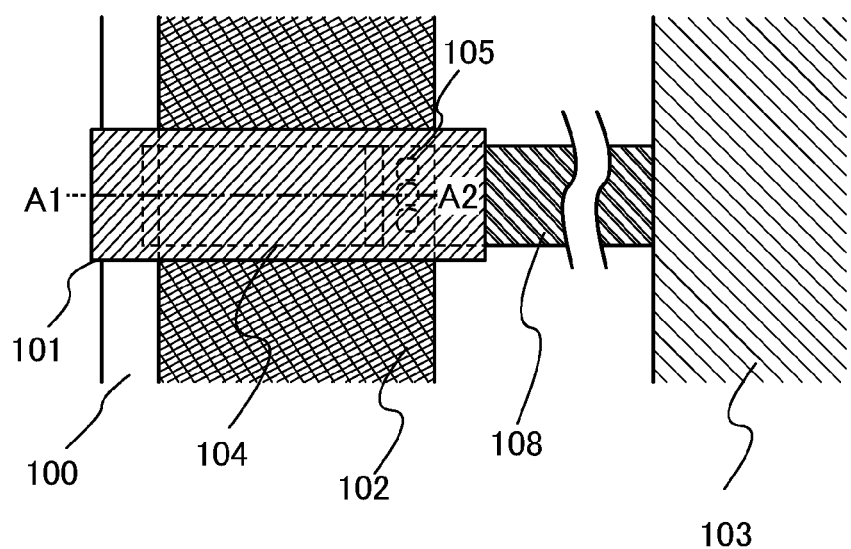
FIGS. 2A and 2B illustrate an example of a structure of the semiconductor device in Embodiment 1.
Figure 2B:
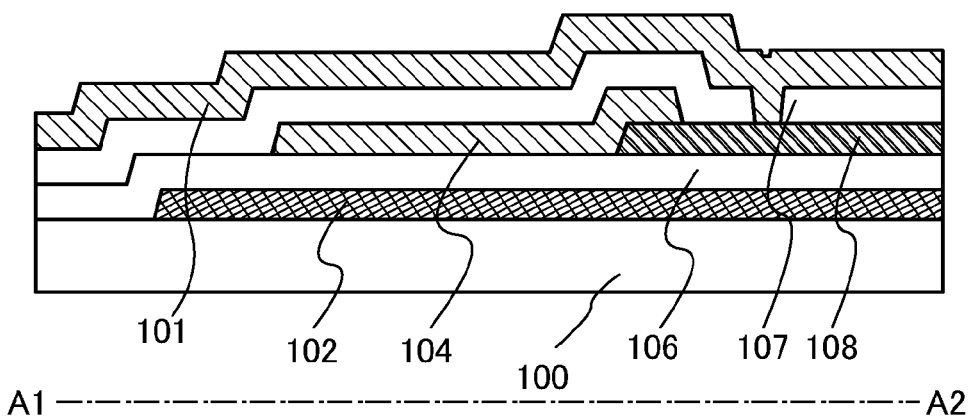

In FIGS. 1A and 1B, as an example, a semiconductor device having a structure in which, in the plane view, the oxide semiconductor layer 104 overlaps with the electrode 101 and the oxide semiconductor layer 104 overlaps with the wiring 102 is described. However, the structure of a semiconductor device is not limited to the structure illustrated in FIGS. 1A and 1B, and other structures can be applied to the semiconductor device of Embodiment 1. Another example of the structure of the semiconductor device in Embodiment 1 is described with reference to FIGS. 2A and 2B. FIGS. 2A and 2B are schematic views illustrating the example of the structure of the semiconductor device in Embodiment 1. FIG. 2A is a top view and FIG. 2B is a cross-sectional view taken along line A1-A2 of FIG. 2A.

A semiconductor device illustrated in FIGS. 2A and 2B includes the electrode 101, the wiring 102, the functional circuit 103, the oxide semiconductor layer 104, and a wiring 108 as illustrated in FIG. 2A, and further includes the insulating layer 106 and the insulating layer 107 as illustrated in FIG. 2B.

As illustrated in FIG. 2B, the wiring 102 is provided over the substrate 100; the insulating layer 106 is provided over the substrate 100 with the wiring 102 interposed therebetween; the oxide semiconductor layer 104 is provided over the insulating layer 106; the wiring 108 is provided over the insulating layer 106; the insulating layer 107 is provided over the insulating layer 106 with the oxide semiconductor layer 104 and the wiring 108 interposed therebetween; and the electrode 101 is provided over the insulating layer 107. That is, a structure in which, in the plane view, the oxide semiconductor layer 104 overlaps with the wiring 102 is obtained as illustrated in FIG. 2A.

The wiring 108 is electrically connected to the oxide semiconductor layer 104 and the electrode 101 is electrically connected to the wiring 108.

A signal is inputted to the functional circuit 103 via the electrode 101 and the wiring 108, and, in accordance with the signal inputted, the operation of the functional circuit 103 is controlled. Alternatively, voltage is applied to the functional circuit 103 via the electrode 101 and the wiring 108.

Note that the description of the other components of the semiconductor device illustrated in FIGS. 2A and 2B is the same as the description of corresponding components of the semiconductor device illustrated in FIGS. 1A and 1B. Therefore, the description of the corresponding components of the semiconductor device illustrated in FIGS. 1A and 1B is applied thereto as appropriate.

Figure 3A:
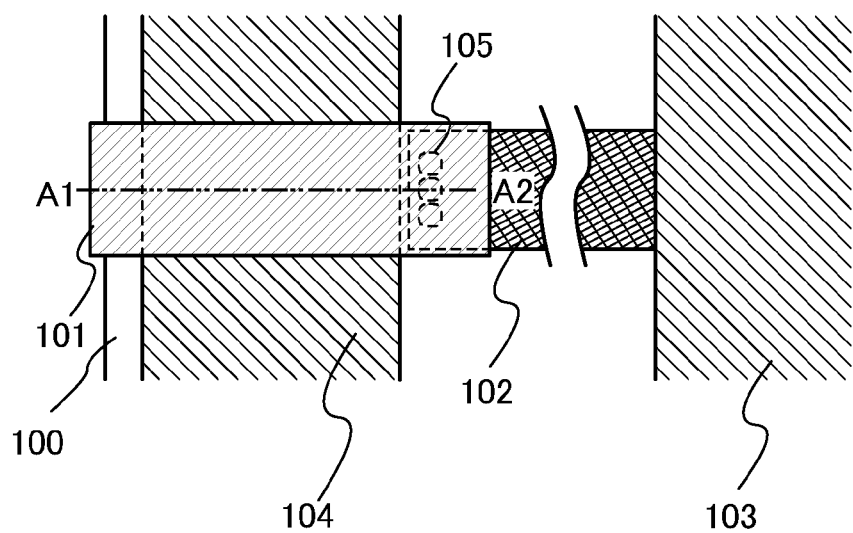
FIGS. 3A and 3B illustrate an example of a structure of the semiconductor device in Embodiment 1.
Figure 3B:
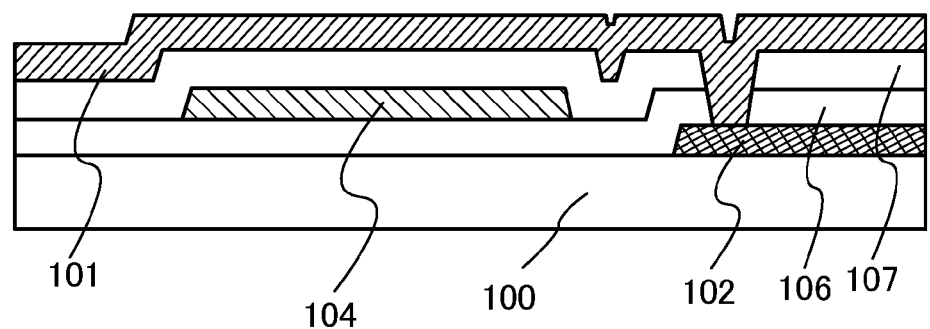

Another example of the structure of the semiconductor device in Embodiment 1 is described with reference to FIGS. 3A and 3B. FIGS. 3A and 3B are schematic views illustrating the example of the structure of the semiconductor device in Embodiment 1. FIG. 3A is a top view and FIG. 3B is a cross-sectional view taken along line A1-A2 of FIG. 3A.

A semiconductor device illustrated in FIGS. 3A and 3B includes the electrode 101, the wiring 102, the functional circuit 103, and the oxide semiconductor layer 104 as illustrated in FIG. 3A, and further includes the insulating layer 106 and the insulating layer 107 as illustrated in FIG. 3B.

As illustrated in FIG. 3B, the insulating layer 106 is provided over the substrate 100 with the wiring 102 interposed therebetween; the oxide semiconductor layer 104 is provided over the insulating layer 106; the insulating layer 107 is provided over the insulating layer 106 with the oxide semiconductor layer 104 interposed therebetween; and the electrode 101 is provided over the oxide semiconductor layer 104 with the insulating layer 107 interposed therebetween. That is, a structure in which, in the plane view, the oxide semiconductor layer 104 overlaps with the electrode 101 and the oxide semiconductor layer 104 does not overlap with the wiring 102 is obtained as illustrated in FIG. 3A. Note that the description of the other components of the semiconductor device illustrated in FIGS. 3A and 3B is the same as the description of corresponding components of the semiconductor device illustrated in FIGS. 1A and 1B. Therefore, the description of the corresponding components of the semiconductor device illustrated in FIGS. 1A and 1B is applied thereto as appropriate.

Figure 4A:
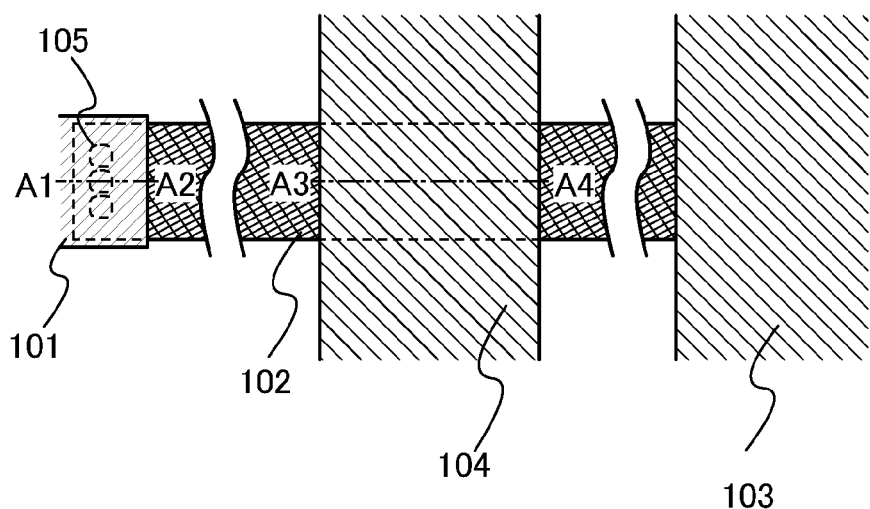
FIGS. 4A and 4B illustrate an example of a structure of the semiconductor device in Embodiment 1.
Figure 4B:
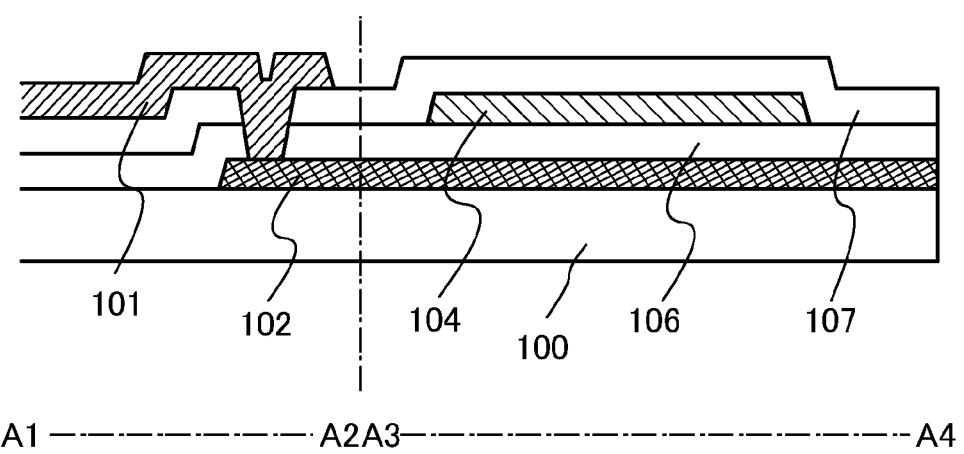

Another example of the structure of the semiconductor device in Embodiment 1 is described with reference to FIGS. 4A and 4B. FIGS. 4A and 4B are schematic views illustrating the example of the structure of the semiconductor device in Embodiment 1. FIG. 4A is a top view and FIG. 4B is a cross-sectional view taken along line A1-A2 and A3-A4 of FIG. 4A.

A semiconductor device illustrated in FIGS. 4A and 4B includes the electrode 101, the wiring 102, the functional circuit 103, and the oxide semiconductor layer 104 as illustrated in FIG. 4A, and further includes the insulating layer 106 and the insulating layer 107 as illustrated in FIG. 4B.

As illustrated in FIG. 4B, the insulating layer 106 is provided over the substrate 100 with the wiring 102 interposed therebetween; the oxide semiconductor layer 104 is provided over the wiring 102 with the insulating layer 106 interposed therebetween; the insulating layer 107 is provided over the insulating layer 106 with the oxide semiconductor layer 104 interposed therebetween; and the electrode 101 is provided over the insulating layer 107. That is, a structure in which, in the plane view, the oxide semiconductor layer 104 overlaps with the wiring 102 and the oxide semiconductor layer 104 does not overlap with the electrode 101 is obtained as illustrated in FIG. 4A. Note that the description of the other components of the semiconductor device illustrated in FIGS. 4A and 4B is the same as the description of corresponding components of the semiconductor device illustrated in FIGS. 1A and 1B. Therefore, the description of the corresponding components of the semiconductor device illustrated in FIGS. 1A and 1B is applied thereto as appropriate.

Note that the semiconductor devices illustrated in FIGS. 1A and 1B, FIGS. 2A and 2B, and FIGS. 4A and 4B each have a structure in which, in the plane view, the wiring 102 overlaps with the oxide semiconductor layer 104. Each of the semiconductor devices of Embodiment 1 does not necessarily include a structure in which the wiring overlaps with the oxide semiconductor layer; however, when the structure in which the wiring overlaps with the oxide semiconductor layer is included, deterioration of the oxide semiconductor layer due to incidence of light can be inhibited.

Figure 5A:
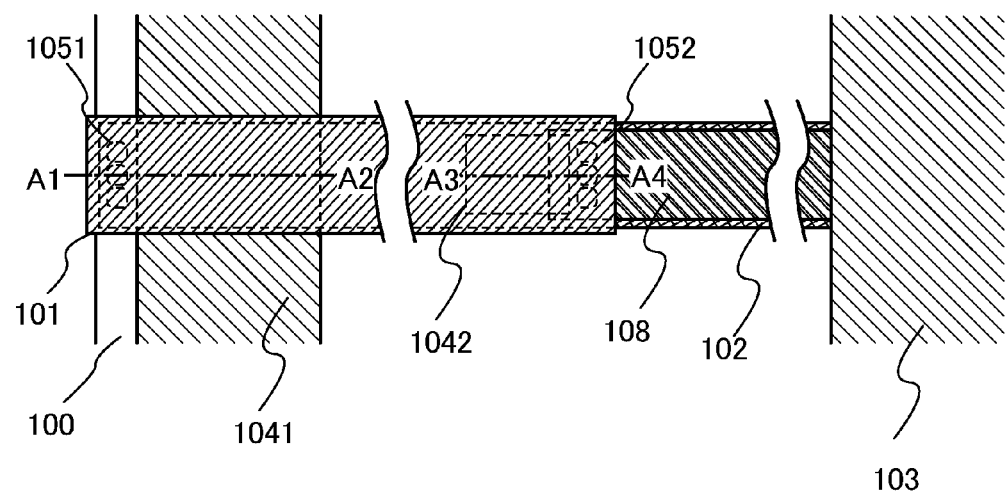
FIGS. 5A and 5B illustrate an example of a structure of the semiconductor device in Embodiment 1.
Figure 5B:
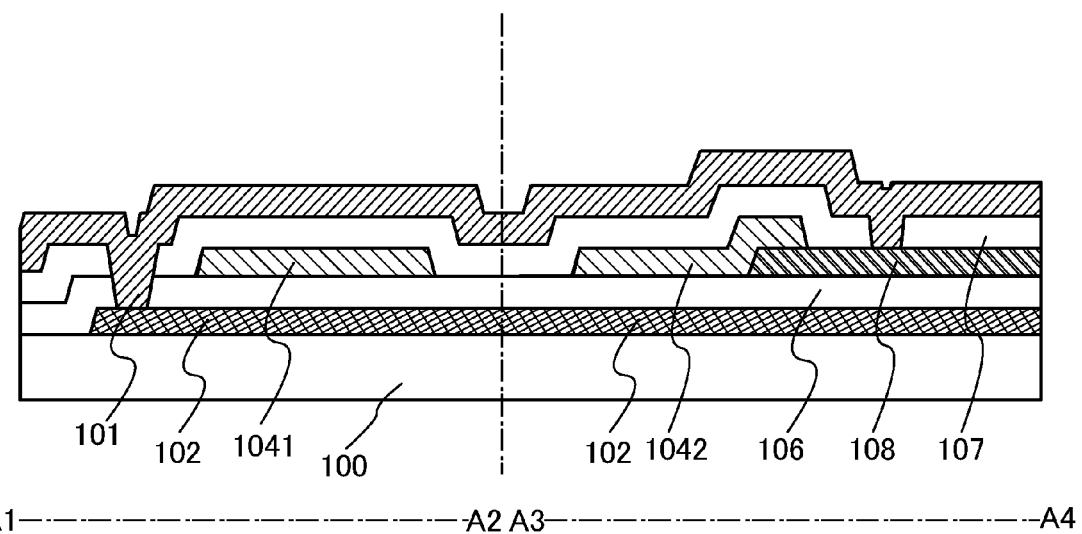

Another example of the structure of the semiconductor device in Embodiment 1 is described with reference to FIGS. 5A and 5B. FIGS. 5A and 5B are schematic views illustrating the example of the structure of the semiconductor device in Embodiment 1. FIG. 5A is a top view and FIG. 5B is a cross-sectional view taken along line A1-A2 and A3-A4 of FIG. 5A.

A semiconductor device illustrated in FIGS. 5A and 5B includes the electrode 101, the wiring 102, the functional circuit 103, an oxide semiconductor layer 1041, an oxide semiconductor layer 1042, and the wiring 108 as illustrated in FIG. 5A, and further includes the insulating layer 106 and the insulating layer 107 as illustrated in FIG. 5B.

As illustrated in FIG. 5B, the wiring 102 is provided over the substrate 100; the insulating layer 106 is provided over the substrate 100 with the wiring 102 interposed therebetween; the wiring 108 is provided over the insulating layer 106; the oxide semiconductor layer 1041 is provided over the wiring 102 with the insulating layer 106 interposed therebetween; the oxide semiconductor layer 1042 is provided over the wiring 102 with the insulating layer 106 and the wiring 108 interposed therebetween; the insulating layer 107 is provided over the insulating layer 106 with the oxide semiconductor layer 1041, the oxide semiconductor layer 1042, and the wiring 108 interposed therebetween; and the electrode 101 is provided over the insulating layer 107. That is, as illustrated in FIG. 5A, a structure in which, in the plane view, the oxide semiconductor layer 1041 overlaps with the electrode 101 and the wiring 102 and the oxide semiconductor layer 1042 overlaps with the wiring 102 and the electrode 101 is obtained.

The electrode 101 is electrically connected to the wiring 102 through an opening portion 1051 provided in the insulating layer 106 and the insulating layer 107. Further, the electrode 101 is electrically connected to the wiring 108 through an opening portion 1052 provided in the insulating layer 107.

The oxide semiconductor layer 1041 and the oxide semiconductor layer 1042 can be formed using a material which can also be used for the oxide semiconductor layer 104 illustrated in FIGS. 1A and 1B, for example.

Note that the description of the other components of the semiconductor device illustrated in FIGS. 5A and 5B is the same as the description of corresponding components of the semiconductor device illustrated in FIGS. 1A and 1B. Therefore, the description of the corresponding components of the semiconductor device illustrated in FIGS. 1A and 1B is applied thereto as appropriate.

As illustrated in FIGS. 5A and 5B as an example, the semiconductor device of Embodiment 1 can be formed to have a plurality of oxide semiconductor layers, and further, the semiconductor device of Embodiment 1 can be formed to have a structure including a plurality of capacitors including a plurality of oxide semiconductor layers, a conductive layer forming a wiring or an electrode, and an insulating layer provided between the oxide semiconductor layer and the conductive layer. Each of the capacitors has a function as part of a protection circuit. Further, the capacitor has a function as part of a filter circuit for reducing the adverse effects of noise. For example, one capacitor may serve as part of a filter circuit which functions when a signal of positive voltage is inputted or positive voltage is applied, and the other capacitor may serve as part of a filter circuit which functions when a signal of negative voltage is inputted or negative voltage is applied. Further, in the semiconductor device illustrated in FIGS. 5A and 5B, the conductivity types of the plurality of oxide semiconductor layers can be the same; thus, the increase of the number of steps can be prevented.

Figure 6A:
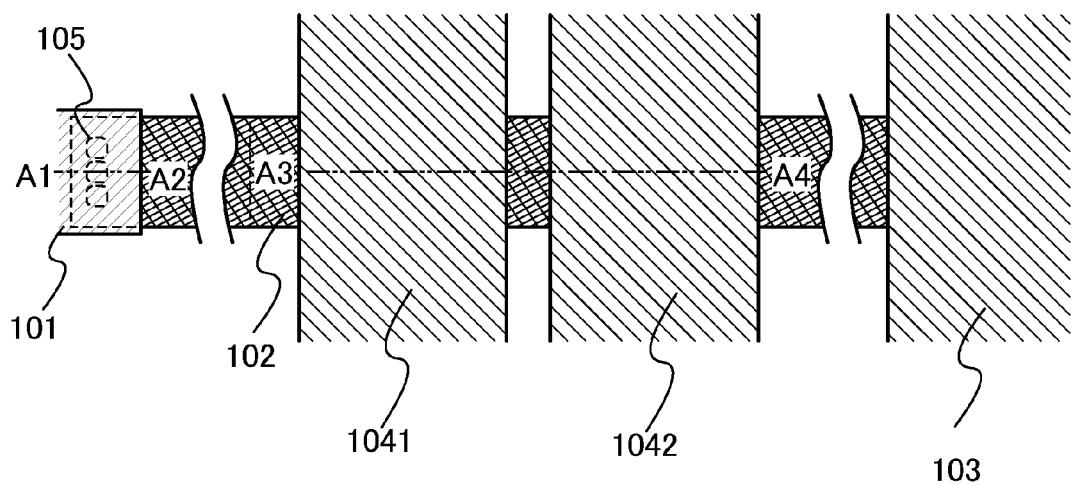
FIGS. 6A and 6B illustrate an example of a structure of the semiconductor device in Embodiment 1.
Figure 6B:
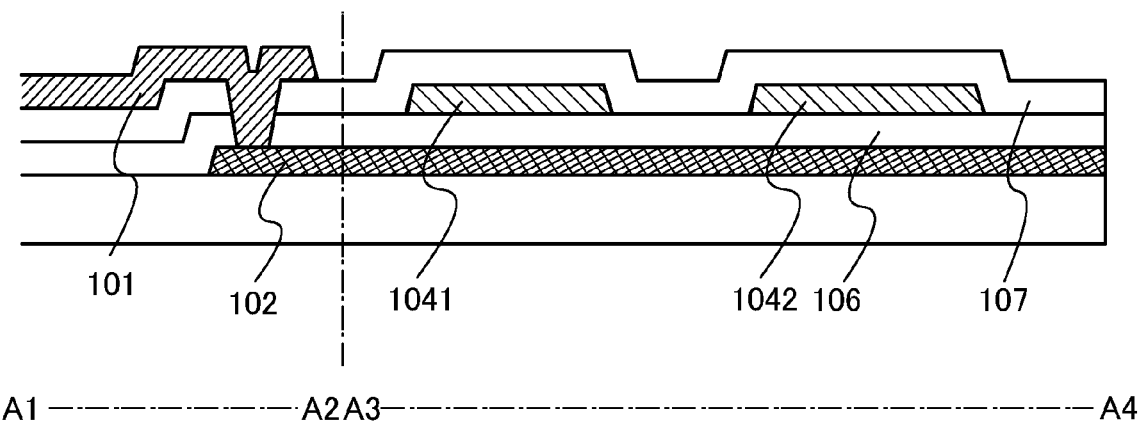

Another example of the structure of the semiconductor device in Embodiment 1 is described with reference to FIGS. 6A and 6B. FIGS. 6A and 6B are schematic views illustrating the example of the structure of the semiconductor device in Embodiment 1. FIG. 6A is a top view and FIG. 6B is a cross-sectional view taken along line A1-A2 and A3-A4 of FIG. 6A.

A semiconductor device illustrated in FIGS. 6A and 6B includes the electrode 101, the wiring 102, the functional circuit 103, the oxide semiconductor layer 1041, and the oxide semiconductor layer 1042 as illustrated in FIG. 6A, and further includes the insulating layer 106 and the insulating layer 107 as illustrated in FIG. 6B.

As illustrated in FIG. 6B, the wiring 102 is provided over the substrate 100; the insulating layer 106 is provided over the substrate 100 with the wiring 102 interposed therebetween; the oxide semiconductor layer 1041 and the oxide semiconductor layer 1042 are provided over the wiring 102 with the insulating layer 106 interposed therebetween; the insulating layer 107 is provided over the insulating layer 106 with the oxide semiconductor layer 1041 and the oxide semiconductor layer 1042 interposed therebetween; and the electrode 101 is provided over the insulating layer 107. That is, as illustrated in FIG. 6A, the semiconductor device illustrated in FIGS. 6A and 6B has a structure in which, in the plane view, the oxide semiconductor layer 1041 and the oxide semiconductor layer 1042 overlap with the wiring 102, and the oxide semiconductor layer 1041 and the oxide semiconductor layer 1042 do not overlap with the electrode 101. Note that the distance in the plane view between the oxide semiconductor layer 1041 and the oxide semiconductor layer 1042 illustrated in FIG. 6B can be set as appropriate. The semiconductor device of Embodiment 1 does not necessarily include a structure in which the wiring and the oxide semiconductor layer overlap with each other; however, when such a structure is included, deterioration of the oxide semiconductor layer due to incidence of light can be inhibited, which is preferable.

The oxide semiconductor layer 1041 and the oxide semiconductor layer 1042 can be formed using a material which can also be used for the oxide semiconductor layer 104 illustrated in FIGS. 1A and 1B, for example.

Note that the description of the other components of the semiconductor device illustrated in FIGS. 6A and 6B is the same as the description of corresponding components of the semiconductor device illustrated in FIGS. 1A and 1B. Therefore, the description of the corresponding components of the semiconductor device illustrated in FIGS. 1A and 1B is applied thereto as appropriate.

As illustrated in FIGS. 6A and 6B as an example, the semiconductor device of Embodiment 1 can be formed to have a plurality of oxide semiconductor layers, and further, the semiconductor device of Embodiment 1 can be formed to have a structure including a plurality of capacitors including a plurality of oxide semiconductor layers, a conductive layer forming a wiring or an electrode, and an insulating layer provided between the oxide semiconductor layer and the conductive layer. Each of the capacitors has a function as part of a protection circuit. Further, the capacitor has a function as part of a filter circuit for reducing the adverse effects of noise. For example, one capacitor may serve as part of a filter circuit which functions when a signal of positive voltage is inputted or positive voltage is applied, and the other capacitor may serve as part of the filter circuit which functions when a signal of negative voltage is inputted or negative voltage is applied.

Figure 7A:
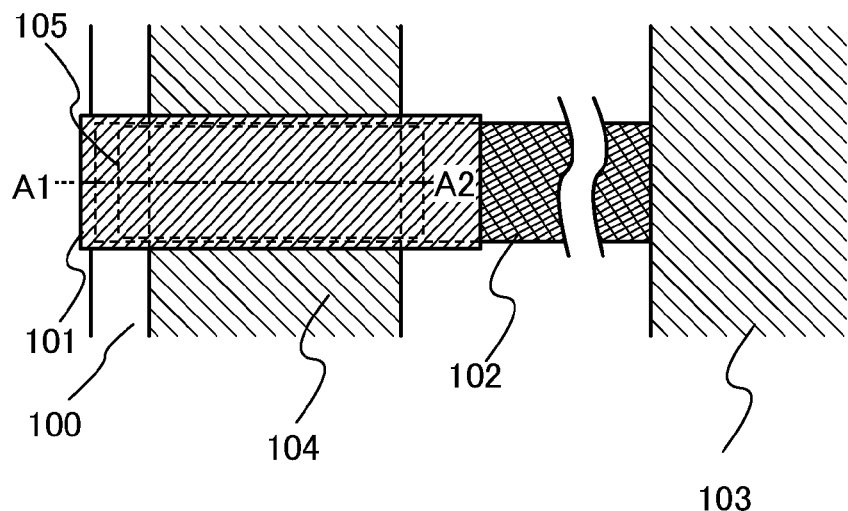
FIGS. 7A and 7B illustrate an example of a structure of the semiconductor device in Embodiment 1.
Figure 7B:
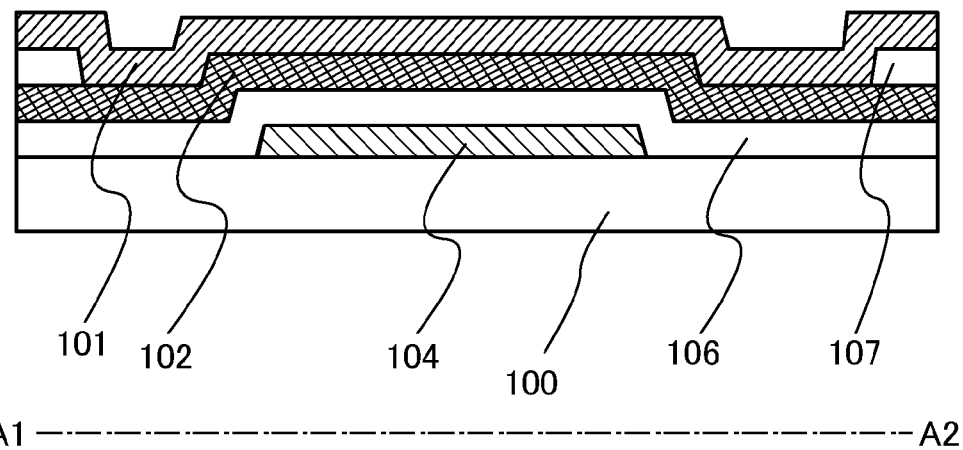

Another example of the structure of the semiconductor device in Embodiment 1 is described with reference to FIGS. 7A and 7B. FIGS. 7A and 7B are schematic views illustrating an example of the structure of the semiconductor device in Embodiment 1. FIG. 7A is a top view and FIG. 7B is a cross-sectional view taken along line A1-A2 of FIG. 7A.

A semiconductor device illustrated in FIGS. 7A and 7B includes the electrode 101, the wiring 102, the functional circuit 103, and the oxide semiconductor layer 104 as illustrated in FIG. 7A, and further includes the insulating layer 106 and the insulating layer 107 as illustrated in FIG. 7B.

As illustrated in FIG. 7B, the oxide semiconductor layer 104 is provided over the substrate 100; the insulating layer 106 is provided over the substrate 100 with the oxide semiconductor layer 104 interposed therebetween; the wiring 102 is provided over the oxide semiconductor layer 104 with the insulating layer 106 interposed therebetween; the insulating layer 107 is provided over the wiring 102; and the electrode 101 is provided over the wiring 102 and the insulating layer 107. That is, a structure in which, in the plane view, the oxide semiconductor layer 104 and the wiring 102 overlap with each other and the oxide semiconductor layer 104 and the electrode 101 overlap with each other is obtained as illustrated in FIG. 7A. Note that the description of the other components of the semiconductor device illustrated in FIGS. 7A and 7B is the same as the description of corresponding components of the semiconductor device illustrated in FIGS. 1A and 1B. Therefore, the description of the corresponding components of the semiconductor device illustrated in FIGS. 1A and 1B is applied thereto as appropriate.

Note that the semiconductor device illustrated in FIGS. 7A and 7B has a structure in which, in the plane view, the oxide semiconductor layer 104 overlaps with the wiring 102 and the oxide semiconductor layer 104 overlaps with the electrode 101. However, the semiconductor device of Embodiment 1 is not limited thereto. A structure in which the wiring 102 overlaps with the oxide semiconductor layer 104 and the electrode 101 does not overlap with the oxide semiconductor layer 104, or a structure in which the electrode 101 overlaps with the oxide semiconductor layer 104 and the wiring 102 overlaps with the oxide semiconductor layer 104 can be obtained.

Figure 8A:
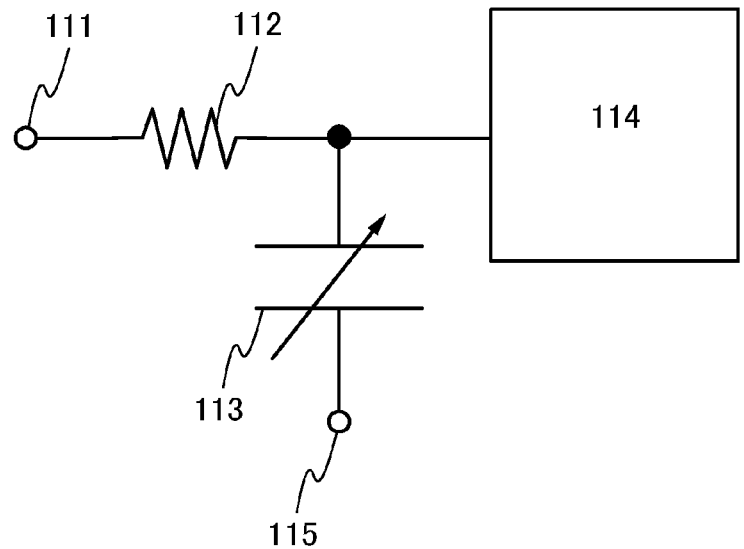
FIGS. 8A and 8B are circuit diagrams illustrating equivalent circuits of the semiconductor devices illustrated in FIGS. 1A and 1B, FIGS. 2A and 2B, FIGS. 3A and 3B, FIGS. 4A and 4B, FIGS. 5A and 5B, FIGS. 6A and 6B, and FIGS. 7A and 7B.
Figure 8B:
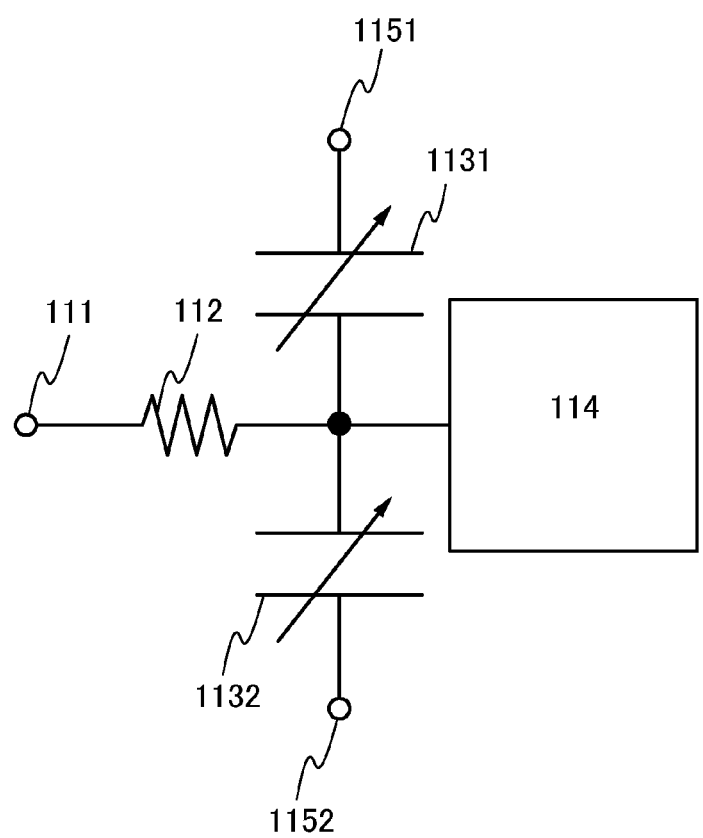

Equivalent circuits of semiconductor devices illustrated in FIGS. 1A and 1B, FIGS. 2A and 2B, FIGS. 3A and 3B, FIGS. 4A and 4B, FIGS. 5A and 5B, FIGS. 6A and 6B, and FIGS. 7A and 7B are described with reference to FIGS. 8A and 8B. FIGS. 8A and 8B are circuit diagrams illustrating the equivalent circuits of the semiconductor devices illustrated in FIGS. 1A and 1B, FIGS. 2A and 2B, FIGS. 3A and 3B, FIGS. 4A and 4B, FIGS. 5A and 5B, FIGS. 6A and 6B, and FIGS. 7A and 7B. FIG. 8A is a circuit diagram illustrating the equivalent circuit of the semiconductor device illustrated in each of FIGS. 1A and 1B, FIGS. 2A and 2B, FIGS. 3A and 3B, FIGS. 4A and 4B, and FIGS. 7A and 7B. FIG. 8B is a circuit diagram illustrating the equivalent circuit of the semiconductor device illustrated in each of FIGS. 5A and 5B and FIGS. 6A and 6B.

The equivalent circuit illustrated in FIG. 8A includes a terminal 111, a resistor 112, a capacitor 113, and a functional circuit 114.

The terminal 111 includes the electrode 101 in its part, and a signal is inputted or voltage is applied via the terminal 111.

The resistor 112 can be formed using wiring resistance of the wiring 102, for example. Further, the present invention is not limited thereto, and the resistor can be separately formed using, for example, a semiconductor material or the like in the semiconductor device of Embodiment 1.

The capacitor 113 includes a first terminal and a second terminal. The first terminal of the capacitor 113 is electrically connected to the terminal 111 via the resistor 112 and is electrically connected to the functional circuit 114. Given voltage is applied to the second terminal of the capacitor 113 via a terminal 115. The first terminal of the capacitor 113 is formed using one of a conductive layer and a semiconductor layer, for example. The second terminal of the capacitor 113 is formed using the other of the conductive layer and the semiconductor layer. As the conductive layer, for example, the electrode 101, the wiring 102, the wiring 108, or the like can be used. As the semiconductor layer, for example, the oxide semiconductor layer 104 can be used. Given voltage is applied to the second terminal of the capacitor 113. As the given voltage, for example, power supply voltage is used. The level of the power supply voltage can be set as appropriate so that a desired function can be obtained in accordance with a signal inputted. However, the present invention is not limited thereto, and the second terminal of the capacitor 113 can be set in a floating state. The capacitor 113 has a function as a variable capacitor.

As illustrated in FIG. 8A, the semiconductor device illustrated in each of FIGS. 1A and 1B, FIGS. 2A and 2B, FIGS. 3A and 3B, FIGS. 4A and 4B, and FIGS. 7A and 7B includes a filter circuit using a resistor and a capacitor.

Next, as an example of operation of the semiconductor device of Embodiment 1, operation of the semiconductor device whose equivalent circuit is illustrated in FIG. 8A is described. Here, the case where the absolute value of voltage of an input signal is smaller than or equal to a given value and the case where the absolute value of the voltage of the input signal is larger than the given value are separately described. Note that the given value can be set as appropriate in consideration of the specification of the functional circuit, or the like, for example.

The capacitance of the capacitor 113 is changed in accordance with voltage of an input signal. In the case where the absolute value of voltage of the input signal is smaller than or equal to a given value, the absolute value of voltage applied between the terminals of the capacitor 113 is smaller than a given value, and the capacitance of the capacitor 113 is smaller than a given value. Therefore, the delay time of an output signal with respect to the input signal of the filter circuit is shorter than given time. Thus, the effect of filtering is small. Note that the voltage applied to the capacitor, the capacitance of the capacitor, and the delay time can be set as appropriate in accordance with the specification of the semiconductor device.

In the case where the absolute value of voltage of an input signal is larger than a given value, the absolute value of voltage applied between the terminals of the capacitor 113 is larger than a given value, and the capacitance of the capacitor 113 is larger than a given value in accordance with the input signal, which results in a long delay of an output signal with respect to the input signal of the filter circuit. Thus, the effect of filtering with respect to noise is larger than that of the case where the absolute value of the voltage of the input signal is smaller than or equal to a given value. The above is the operation of the semiconductor device whose equivalent circuit is illustrated in FIG. 8A.

The equivalent circuit illustrated in FIG. 8B includes the terminal 111, the resistor 112, a capacitor 1131, a capacitor 1132, and the functional circuit 114.

The terminal 111 includes the electrode 101 in its part, and a signal is inputted or voltage is applied via the terminal 111.

The resistor 112 can be formed using wiring resistance of the wiring 102, for example. Further, the present invention is not limited thereto, and the resistor can be separately formed using, for example, a semiconductor material or the like in the semiconductor device of Embodiment 1.

The capacitor 1131 includes a first terminal and a second terminal. The first terminal of the capacitor 1131 is electrically connected to the terminal 111 via the resistor 112 and is electrically connected to the functional circuit 114. High power supply voltage is applied to the second terminal of the capacitor 1131 via a terminal 1151. The first terminal of the capacitor 1131 is formed using a conductive layer, for example. The second terminal of the capacitor 1131 is formed using a semiconductor layer, for example. As the conductive layer, the electrode 101, the wiring 102, the wiring 108, or the like can be used, for example. As the semiconductor layer, the oxide semiconductor layer 1041 can be used, for example. The capacitor 1131 has a function as a variable capacitor.

The capacitor 1132 includes a first terminal and a second terminal. The first terminal of the capacitor 1132 is electrically connected to the terminal 111 via the resistor 112 and is electrically connected to the functional circuit 114. Low power supply voltage is applied to the second terminal of the capacitor 1132 via a terminal 1152. The first terminal of the capacitor 1132 is formed using a semiconductor layer, for example. The second terminal of the capacitor 1132 is formed using a conductive layer, for example. As the conductive layer, the electrode 101, the wiring 102, the wiring 108, or the like can be used, for example. As the semiconductor layer, the oxide semiconductor layer 1042 can be used, for example. The capacitor 1132 has a function as a variable capacitor.

As illustrated in FIG. 8B, the semiconductor devices illustrated in FIGS. 5A and 5B and FIGS. 6A and 6B each include a filter circuit using a resistor and two capacitors.

Next, as an example of operation of the semiconductor device of Embodiment 1, operation of a semiconductor device whose equivalent circuit is illustrated in FIG. 8B is described. Here, the case where a signal is inputted via the terminal 111 is described as an example, and the case where the absolute value of voltage of an input signal is smaller than or equal to a given value and the case where the absolute value of the voltage of the input signal is larger than a given value are separately described. Note that the given value can be set as appropriate in consideration of the specification of the functional circuit or the like, for example.

The capacitance of each of the capacitor 1131 and the capacitor 1132 is changed in accordance with voltage of an input signal. In the case where the absolute value of the voltage of the input signal is smaller than or equal to a given value, voltage applied between the terminals of each of the capacitor 1131 and the capacitor 1132 is smaller than a given negative value, and the capacitance of each of the capacitor 1131 and the capacitor 1132 is smaller than a given value. Therefore, the delay time of an output signal with respect to the input signal of the filter circuit is shorter than given time. Thus, the effect of filtering is small. Note that the voltage applied to the capacitor, the capacitance of the capacitor, and the delay time can be set as appropriate in accordance with the specification of the semiconductor device.

In the case where the level of voltage of the input signal is higher than a given positive level, the level of voltage applied between the terminals of the capacitor 1131 is higher than a given positive level, and the capacitance of the capacitor 1131 is larger than a given value in accordance with the input signal, which results in a long delay of the output signal with respect to the input signal of a filter circuit. Thus, the effect of filtering with respect to noise is larger than that of the case where the level of voltage of the input signal is lower than or equal to a given positive level or higher than or equal to a given negative level.

In the case where the level of voltage of the input signal is lower than a given negative level, the level of voltage applied between the terminals of the capacitor 1132 is higher than a given positive level, and the capacitance of the capacitor 1132 is larger than a given value in accordance with the input signal, which results in a long delay of the output signal with respect to the input signal of the filter circuit. Thus, the effect of filtering with respect to noise is larger than that of the case where the level of voltage of the input signal is lower than or equal to a given positive level or higher than or equal to a given negative level. The above is the operation of the semiconductor device whose equivalent circuit is illustrated in FIG. 8B.

As described above, in the case where a signal with voltage whose absolute value is smaller than or equal to a given value is inputted, the capacitance of a capacitor is made small, so that the delay of a signal inputted to a functional circuit is made shorter. In addition, in the case where a signal with voltage whose absolute value is larger than a given value is inputted, the capacitance of the capacitor is made large, so that the delay of a signal inputted to a functional circuit is increased. Accordingly, adverse effects on actual operation can be reduced, and adverse effects on an input signal due to noise can be reduced in the case where the noise is generated, for example. Note that the present invention is not limited to the case where a signal is used, and in the case where voltage is applied via a terminal electrode, adverse effects on the voltage due to noise can also be reduced.

A functional circuit including a semiconductor element using an oxide semiconductor often needs a comparatively higher level of operating voltage than a functional circuit including a semiconductor element using a polycrystalline semiconductor, for example. Therefore, the absolute value of voltage of an input signal tends to be large. However, as in the semiconductor device of Embodiment 1, a filter circuit using a capacitor is provided between a functional circuit and a terminal electrode which are electrically connected to each other, whereby adverse effects of noise can be reduced even in a functional circuit including a semiconductor element using an oxide semiconductor.

Further, voltage-capacitance characteristics of a capacitor using a semiconductor layer are inspected by calculation. Note that TCAD software ATLAS, which is made by Silvaco Data Systems Inc., is used for the calculation. Further, in the calculation, a MIS capacitor using a semiconductor layer is used as the capacitor, for example. Table 1 shows main parameters used for the calculation.

TABLE 1

| dielectric constant of an insulating layer | 4 |
|---|---|
| dielectric constant of a semiconductor layer | 10 |
| film thickness of an insulating layer | 0.1 [μm] |
| film thickness of a semiconductor layer | 2.0 [μm] |
| electron affinity of a semiconductor layer | 4.2 [eV] |
| band gap | 1.1 [eV], 3.0 [eV] |
| effective density of state of a conduction band | $2.8 \times 10^{19}$ [cm$^{-3}$] |
| effective density of state of a valence band | $1.04 \times 10^{19}$ [cm$^{-3}$] |

As illustrated in Table 1, two band gaps (a band gap is also referred to as $E_g$), 3.0 eV and 1.1 eV, are used. The equation of $E_g$=3.0 eV is an example of a band gap in the case where, as one oxide semiconductor, an amorphous oxide semiconductor is used for a semiconductor layer. The equation of $E_g$=1.1 eV is an example of a band gap in the case where a silicon semiconductor is used for a semiconductor layer as a comparative example. Further, measurement frequency is set to $1 \times 10^6$ kHz. Furthermore, an n-type semiconductor layer is used.

Figure 9:
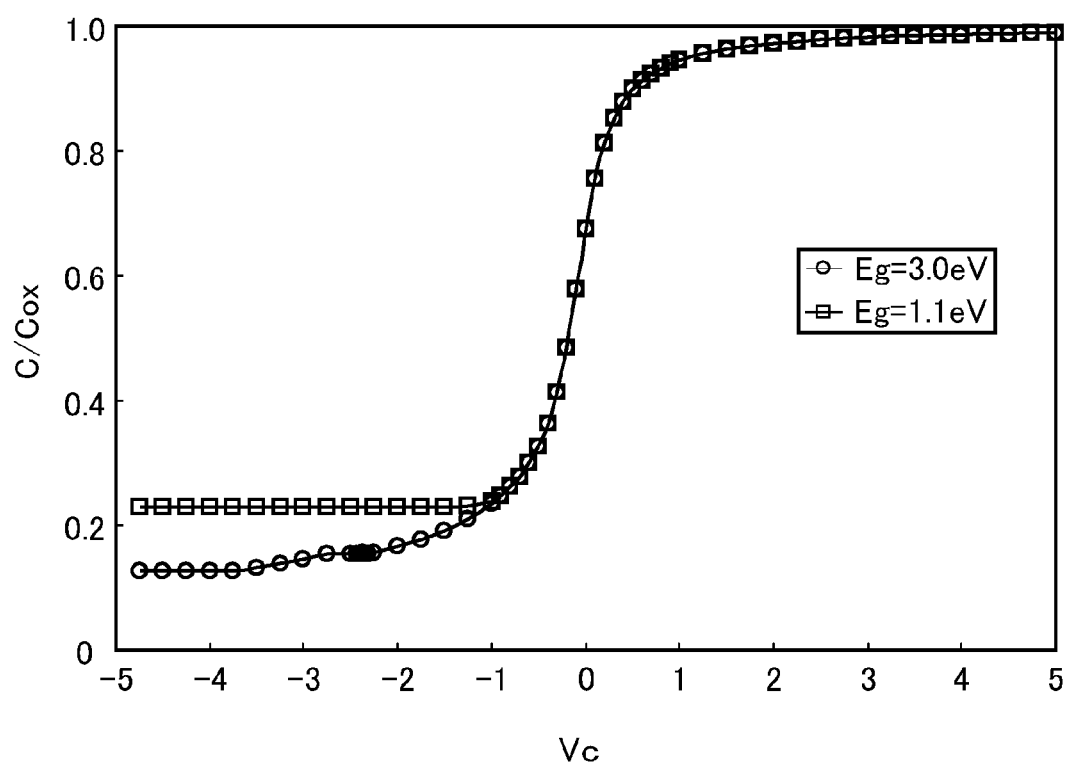
FIG. 9 is a graph illustrating the inspection result of voltage-capacitance characteristics of a capacitor in Embodiment 1.

The inspection results of voltage-capacitance characteristics of the capacitor are described with reference to FIG. 9. FIG. 9 is a graph illustrating the calculation result of voltage-capacitance characteristics of a capacitor of Embodiment 1. In FIG. 9, the horizontal axis indicates voltage applied to a capacitor (such voltage is also referred to as $V_c$), and the vertical axis indicates C divided by $C_{ox}$, where C represents the total capacitance and $C_{ox}$ represents the capacitance of an insulating layer.

As illustrated in FIG. 9, the voltage-capacitance characteristics are assumed characteristics of a device which is designed using the above parameters or the like. For example, on the negative voltage side where voltage is lower than or equal to –1 V, $C/C_{ox}$ of $E_g$=3.0 eV converges to approximately 0.13, and $C/C_{ox}$ of $E_g$=1.1 eV converges to approximately 0.24. Thus, the capacitance of $E_g$=3.0 eV is smaller than the capacitance of $E_g$=1.1 eV. Further, on the positive voltage side, a capacitance of both $E_g$=3.0 eV and $E_g$=1.1 eV becomes larger as voltage becomes higher, and $C/C_{ox}$ converges to 1. Accordingly, it is apparent that capacitors using semiconductor layers have characteristics such that capacitances are large in a storage state and the capacitances are small in a reverse state. Further, the capacitance of a capacitor using a semiconductor with a band gap of 3.0 eV is smaller than the capacitance of a capacitor using a semiconductor with a band gap of 1.1 eV, in a reverse state. The capacitance of a capacitor in a reverse state is equal to a capacitance obtained by connecting a capacitor of an insulating layer and a capacitor of a depletion layer in a semiconductor layer in series.

Thus, when a capacitor using a semiconductor layer is used for a filter circuit, it is apparent that the capacitor is preferably set in a reverse state in the case of inputting a normal signal with voltage whose absolute value is smaller than or equal to a given value, and that the capacitor is preferably set in a storage state in the case of inputting a signal with voltage whose absolute value is larger than a given value. However, the present invention is not necessarily limited thereto.

Figure 10:
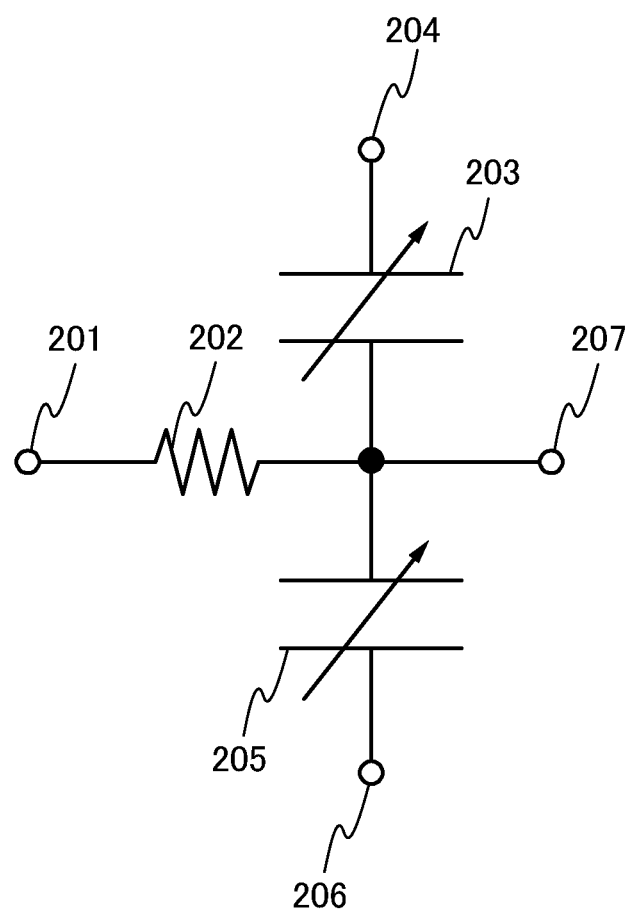
FIG. 10 is a circuit diagram illustrating a circuit model of a filter circuit whose function is to be inspected in Embodiment 1.

Further, the function of a filter circuit using a capacitor including a semiconductor layer is inspected by calculation. First, the circuit model of a filter circuit used for the calculation is described with reference to FIG. 10. FIG. 10 is a circuit diagram illustrating the circuit model of the filter circuit whose function is to be inspected in Embodiment 1.

The circuit model illustrated in FIG. 10 includes a terminal 201, a resistor 202, a capacitor 203, a terminal 204, a capacitor 205, a terminal 206, and a terminal 207.

In the circuit model illustrated in FIG. 10, an input signal (also referred to as IN) is inputted via the terminal 201. The input signal is inputted to a filter circuit including the resistor 202, the capacitor 203, and the capacitor 205, and an output signal (also referred to as OUT) of the filter circuit is outputted via the terminal 207.

Further, in the circuit model illustrated in FIG. 10, high power supply voltage is applied via the terminal 204, and low power supply voltage is applied via the terminal 206.

The inspection is performed using the circuit model illustrated in FIG. 10. For the calculation, TCAD software ATLAS, which is made by Silvaco Data Systems Inc., is used. Further, in the calculation, a MIS capacitor using a semiconductor layer is used as the capacitor, for example. Furthermore, in the calculation, the parameters illustrated in Table 1 are used as appropriate.

The calculation is performed for the cases where the following signals are inputted as input signals: a first digital signal (also referred to as DS1) in which voltage at a high level (also referred to as H) is 5 V and voltage at a low level (also referred to as L) is 0 V (H=5 V and L=0 V); a second digital signal (also referred to as DS2) in which voltage at a high level is 15 V and voltage at a low level is 10 V; and a third digital signal (also referred to as DS3) in which voltage at a high level is −5 V and voltage at a low level is −10 V. Further, in the calculation, $V_{dd}$=8V and $V_{ss}$=−3V are used such that the capacitor 203 and the capacitor 205 are set in a reverse state in the case where the first digital signal is inputted; the capacitor 205 is set in a storage state in the case where the second digital signal is inputted; and the capacitor 203 is set in a storage state in the case where the third digital signal is inputted. Furthermore, in the calculation, the thickness of the semiconductor layer, the carrier density of the semiconductor layer, and the like are set such that $C/C_{ox}$ at a band gap of 3.0 eV is set to 0.13 and $C/C_{ox}$ at a band gap of 1.1 eV is set to 0.24 in a reverse state. Note that an n-type semiconductor layer is used as the semiconductor layer.

The calculation results are described with reference to FIGS. 11A and 11B, FIGS. 12A and 12B, and FIGS. 13A and 13B. FIGS. 11A and 11B, FIGS. 12A and 12B, and FIGS. 13A and 13B are graphs illustrating input/output characteristics obtained by the calculation with the use of the circuit model illustrated in FIG. 10.

Figure 11A:
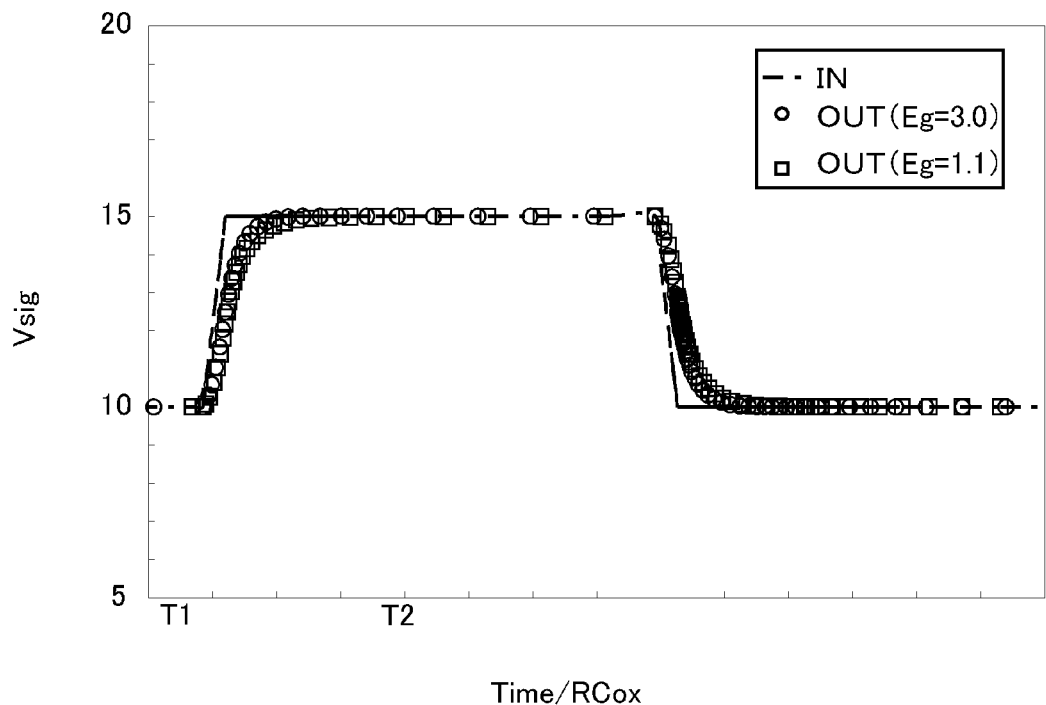
FIGS. 11A and 11B are graphs illustrating input/output characteristics of the case where a first digital signal is inputted in inspecting a circuit model illustrated in FIG. 10 by calculation.
Figure 11B:
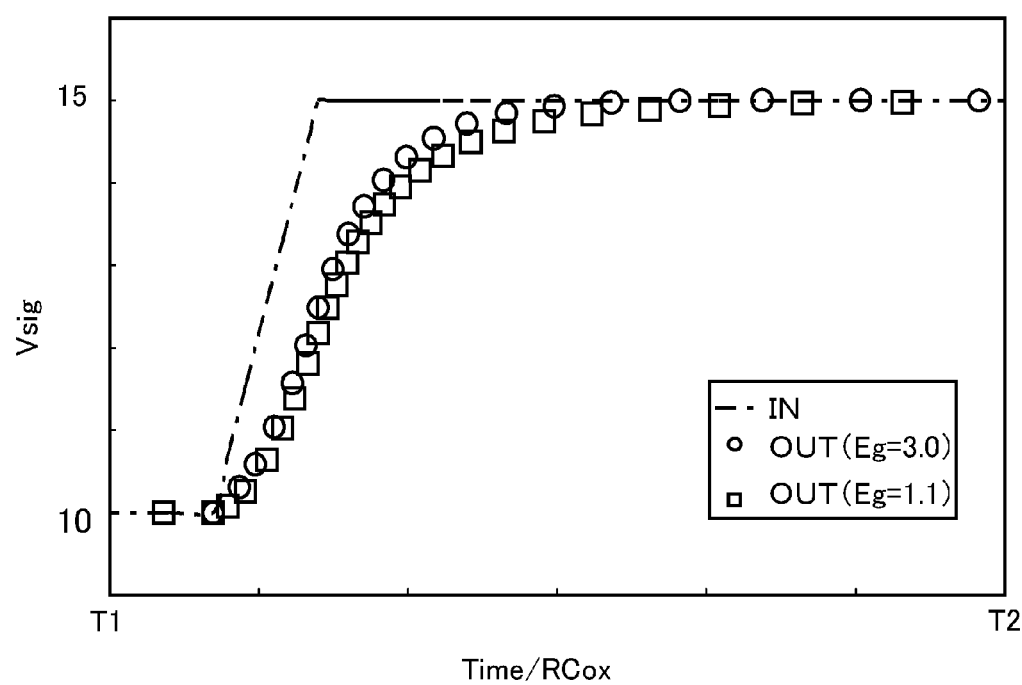

FIG. 11A is a graph illustrating input/output characteristics of the case where the first digital signal is inputted. The horizontal axis indicates time divided by $RC_{ox}$, where $RC_{ox}$ is obtained by multiplying the resistance (R) of the resistor 202 by the capacitance of the insulating layer ($C_{ox}$), and the vertical axis indicates signal voltage (also referred to as $V_{sig}$). Further, FIG. 11B is an enlarged view of a graph of FIG. 11A between T1 and T2. Note that in the calculation, the area of the capacitance of the insulating layer and the resistance of the resistor 202 are set so that $RC_{ox}$=2.83 µs.

Figure 12A:
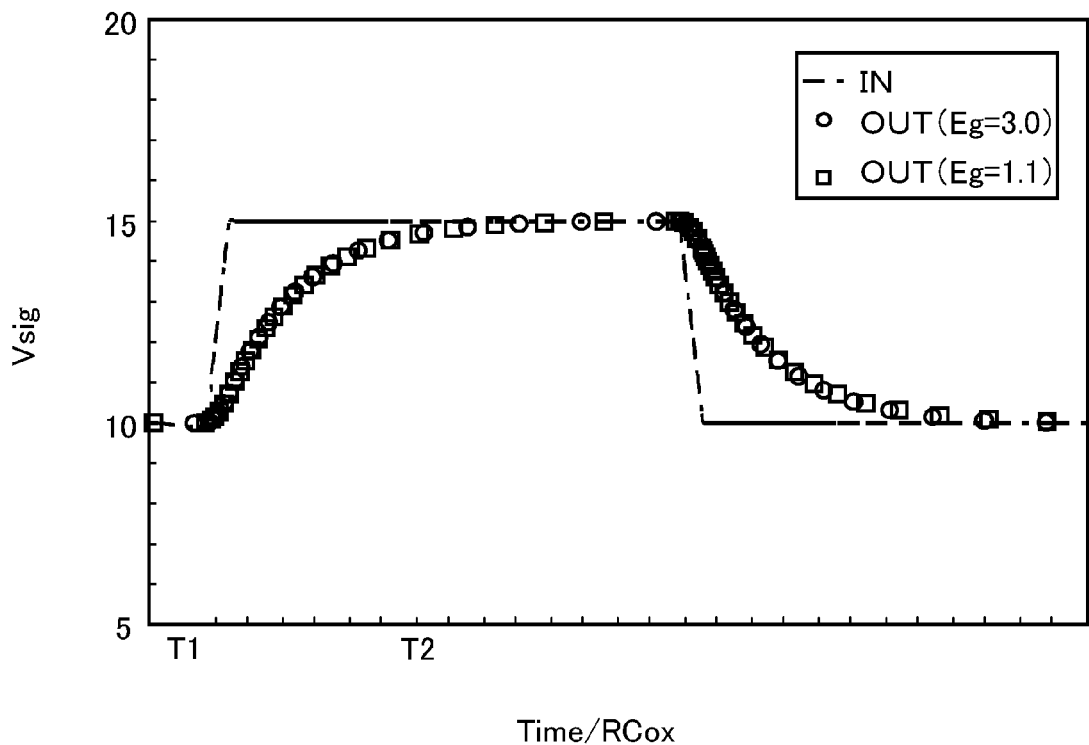
FIGS. 12A and 12B are graphs illustrating input/output characteristics of the case where a second digital signal is inputted in inspecting a circuit model illustrated in FIG. 10 by calculation.
Figure 12B:
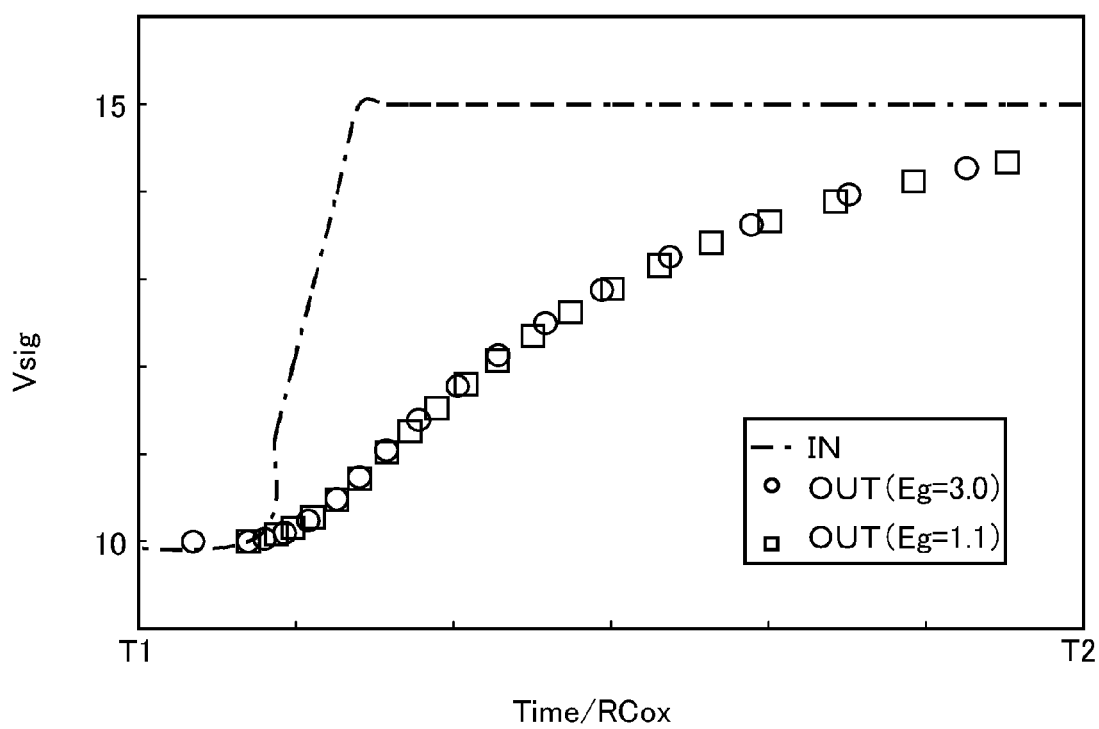

FIG. 12A is a graph illustrating input/output characteristics of the case where the second digital signal is inputted. The horizontal axis indicates time divided by $RC_{ox}$, where $RC_{ox}$ is obtained by multiplying the resistance (R) of the resistor 202 by the capacitance of the insulating layer ($C_{ox}$), and the vertical axis indicates voltage. Further, FIG. 12B is an enlarged view of a graph of FIG. 12A between T1 and T2.

Figure 13A:
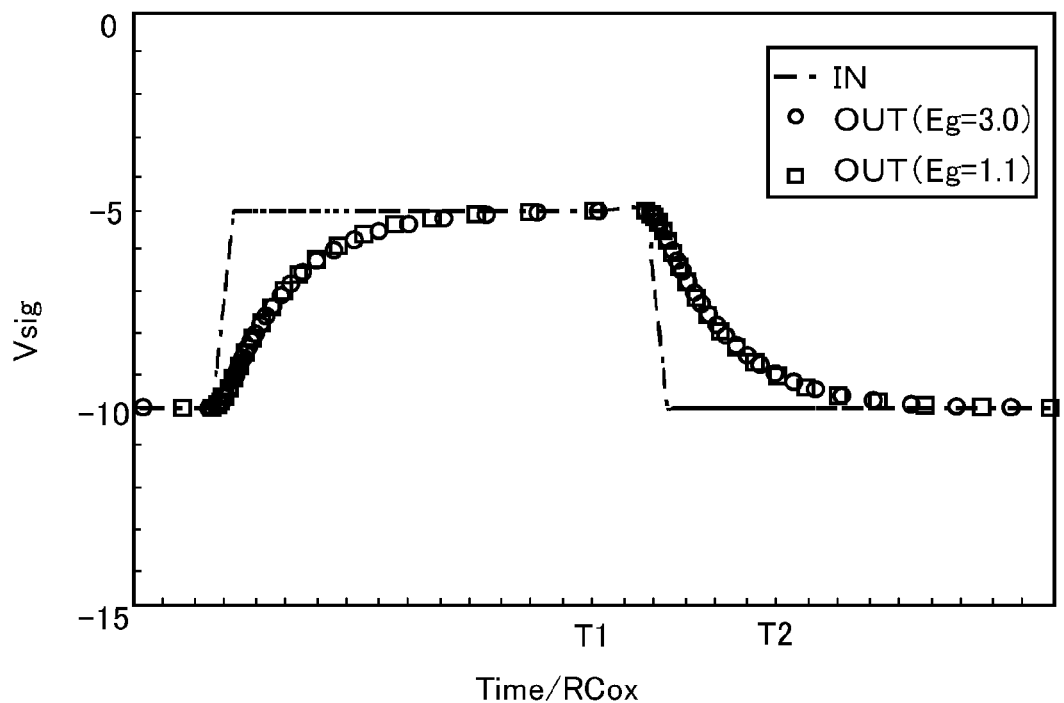
FIGS. 13A and 13B are graphs illustrating input/output characteristics of the case where a third digital signal is inputted in inspecting a circuit model illustrated in FIG. 10 by calculation.
Figure 13B:
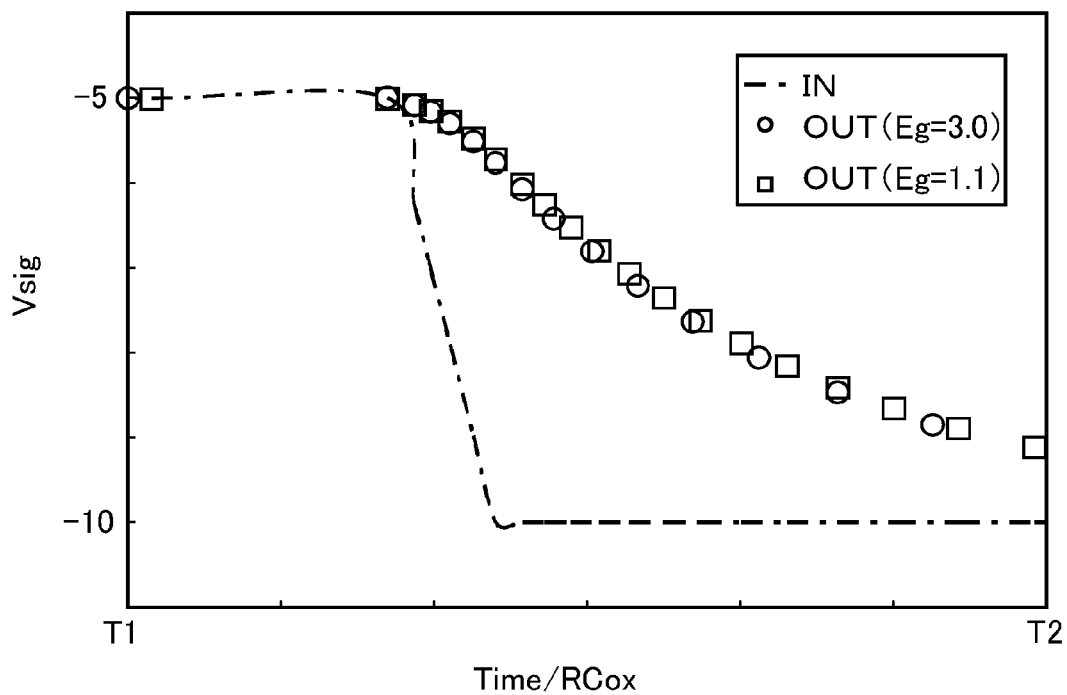

FIG. 13A is a graph illustrating input/output characteristics of the case where the third digital signal is inputted. The horizontal axis indicates time divided by $RC_{ox}$, where $RC_{ox}$ is obtained by multiplying the resistance (R) of the resistor 202 by the capacitance of the insulating layer ($C_{ox}$), and the vertical axis indicates voltage. Further, FIG. 13B is an enlarged view of a graph of FIG. 13A between T1 and T2.

Note that the horizontal axes of FIG. 11A, FIG. 12A, and FIG. 13A each have divisions for equal values. Further, the horizontal axes of FIG. 11B, FIG. 12B, and FIG. 13B each have divisions for equal values.

In the case where the first digital signal is inputted, as illustrated in FIGS. 11A and 11B, the delay of rise time or fall time of an output signal (also referred to as OUT) of $E_g$=3.0 eV is shorter than the delay of rise time or fall time of an output signal of $E_g$=1.1 eV. This is because, in a reverse state, the capacitance of $E_g$=3.0 eV is smaller than the capacitance of $E_g$=1.1 eV as illustrated in FIG. 9.

In the case where the second digital signal is inputted, as illustrated in FIGS. 12A and 12B, the delay of rise time of an output signal of $E_g$=3.0 eV and an output signal of $E_g$=1.1 eV is longer than the delay of rise time of the case where the first digital signal is inputted. This is because, as illustrated in FIG. 9, in a storage state, each of the capacitance of $E_g$=3.0 eV and the capacitance of $E_g$=1.1 eV increases to a given value as voltage becomes higher.

In the case where the third digital signal is inputted, as illustrated in FIGS. 13A and 13B, the delay of fall time of an output signal of $E_g$=3.0 eV and an output signal of $E_g$=1.1 eV is longer than the delay of fall time of the case where the first digital signal is inputted. This is because, as illustrated in FIG. 9, in a storage state, the capacitance at $E_g$=3.0 eV and the capacitance at $E_g$=1.1 eV increases to a given value as voltage becomes higher.

Table 2 summarizes delay time of output signals of the cases where the first to third digital signals are inputted. Note that, in Table 2, "tf" indicates fall time and "tr" indicates rise time. Further, average delay time is also represented by (tf+tr)/2. Note that the delay time is defined as time which is needed for an output signal to change from 10% to 90% of the amplitude of an input signal. Further, values shown in Table 2 are obtained by dividing each delay time by $RC_{ox}$.

TABLE 2

|  |  | tf | tr | (tf + tr)/2 |
| --- | --- | --- | --- | --- |
| DS1 | OUT (Eg = 3.0) | 0.598 | 0.600 | 0.599 |
|  | OUT (Eg = 1.1) | 0.676 | 0.712 | 0.694 |
| DS2 | OUT (Eg = 3.0) | 2.396 | 2.403 | 2.399 |
|  | OUT (Eg = 1.1) | 2.465 | 2.439 | 2.452 |
| DS3 | OUT (Eg = 3.0) | 2.406 | 2.396 | 2.401 |
|  | OUT (Eg = 1.1) | 2.438 | 2.472 | 2.455 |

As shown in Table 2, average delay time of the case where the first digital signal (DS1) is inputted is shorter than average delay time of the case where the second digital signal (DS2) and the third digital signal (DS3) are inputted. Further, in the case where the first digital signal is inputted, average delay time at $E_g$=3.0 eV is shorter than average delay time of an output signal at $E_g$=1.1 eV.

From the above inspection results, a filter circuit using a capacitor including an oxide semiconductor layer can reduce the delay of an output signal in the case where a signal with voltage whose absolute value is in a given range is inputted, and can delay an output signal in the case where a signal with voltage whose absolute value is out of the given range is inputted. Accordingly, adverse effects on actual operation can be reduced. For example, in the case where a signal with voltage whose absolute value is larger than a given value is inputted due to noise or the like, adverse effects of noise can be reduced.

Note that, for example, even in the case where an oxide semiconductor layer is subjected to heat treatment, the inspection results which are similar to those of the above characteristics can be obtained as a matter of course.

Further, as described above, delay time is determined depending on the resistance and the capacitance. Therefore, for example, the value of an input signal and the levels of high power supply voltage and low power supply voltage are set as appropriate in accordance with the specification of a functional circuit. Accordingly, filtering characteristics which are similar to those of the filter circuit used for the calculation can be obtained as a matter of course.

(Embodiment 2)

In Embodiment 2, a display device which is one embodiment of the present invention is described.

Figure 14:
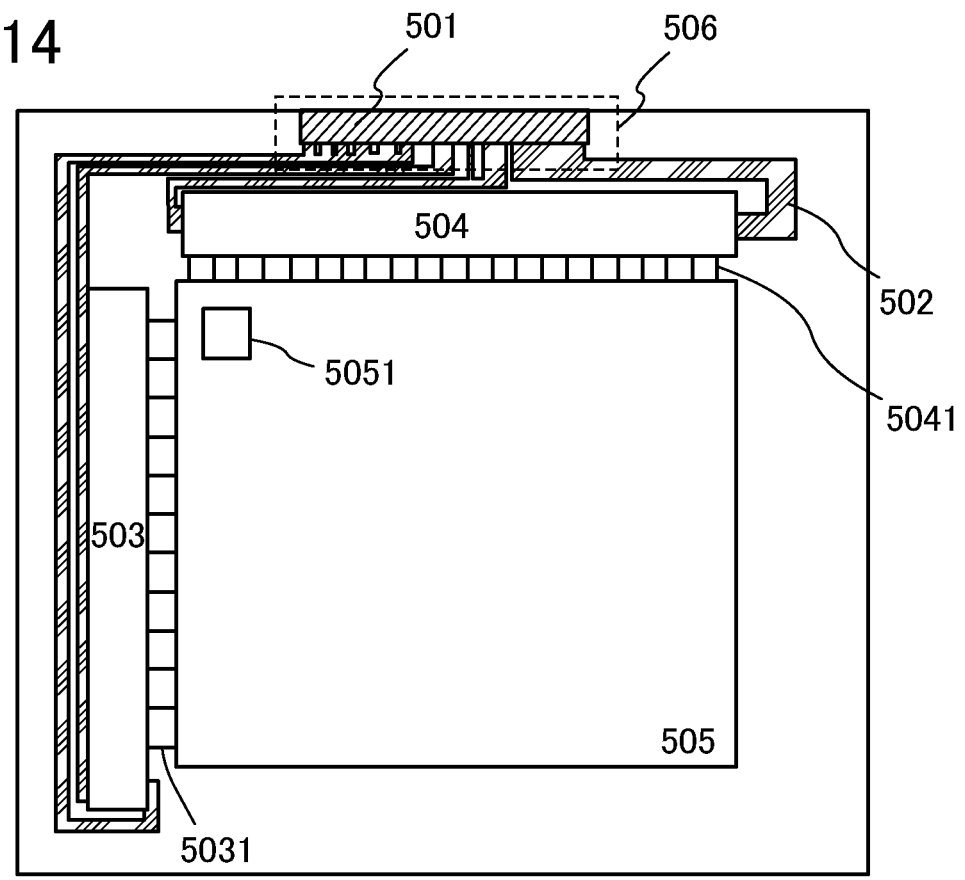
FIG. 14 illustrates an example of a structure of a display device in Embodiment 2.

The structure of the display device of Embodiment 2 is described with reference to FIG. 14. FIG. 14 illustrates an example of the structure of the display device of Embodiment 2.

The display device illustrated in FIG. 14 includes a terminal electrode 501, a wiring 502, a scan line driver circuit 503, scan lines 5031, a signal line driver circuit 504, signal lines 5041, and a pixel portion 505.

The terminal electrode 501 is provided in a terminal portion 506 and has a function as part of a signal input terminal to which, for example, a scan signal, a video signal, or the like are inputted, and also has a function as part of a power supply terminal to which power supply voltage is applied.

The scan line driver circuit 503 is electrically connected to the terminal electrode 501 via the wiring 502. For example, a signal such as a control signal is inputted or power supply voltage is applied from the terminal portion 506 to the scan line driver circuit 503. In addition, a scan signal is outputted at timing in accordance with the signal inputted, via the scan line 5031.

The signal line driver circuit 504 is electrically connected to the terminal electrode 501 via the wiring 502. For example, a signal such as a control signal or a video signal is inputted or power supply voltage is applied from the terminal portion 506 to the signal line driver circuit 504. In addition, a video signal is outputted at timing in accordance with the signal inputted, via the signal line 5041.

The pixel portion 505 includes a plurality of pixels 5051. Each of the pixels 5051 is electrically connected to any of the scan lines 5031 and any of the signal lines 5041, so that a scan signal and a video signal are inputted.

Figure 15A:
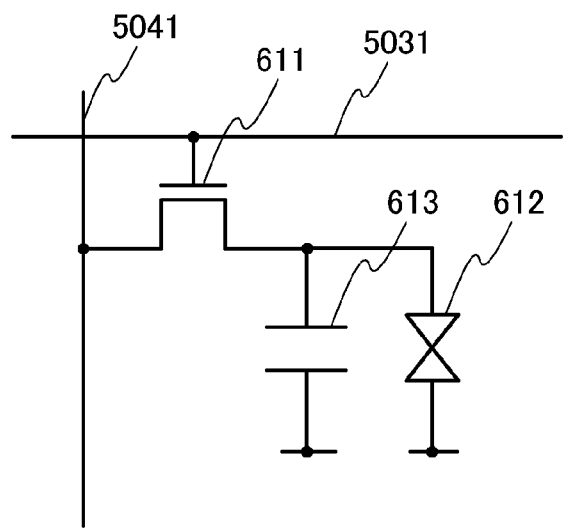
FIGS. 15A and 15B are circuit diagrams each illustrating an example of the circuit configuration of a pixel of the display device illustrated in FIG. 14.
Figure 15B:
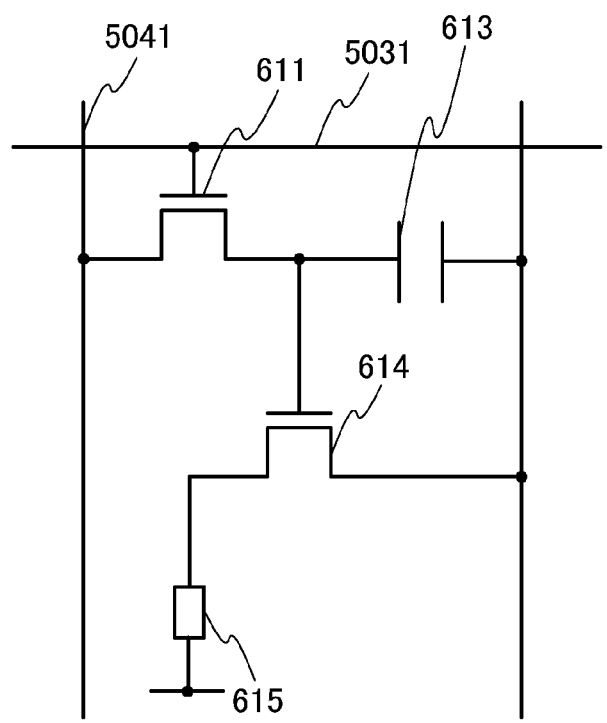

Examples of a circuit configuration of the pixel 5051 are described with reference to FIGS. 15A and 15B. FIGS. 15A and 15B illustrate examples of the circuit configuration of the pixel 5051.

A pixel illustrated in FIG. 15A includes a transistor 611, a liquid crystal element 612, and a capacitor 613.

The transistor 611 includes at least three terminals: a gate terminal, a source terminal, and a drain terminal.

Note that, in this specification, a gate terminal refers to part of a gate electrode and a conductive layer to be a wiring electrically connected to a gate electrode (such a wiring is also referred to as a gate wiring) or the entire gate electrode and conductive layer to be a wiring electrically connected to a gate electrode. Further, a source terminal refers to part of a source electrode and a layer (including a conductive layer or the like) to be a wiring electrically connected to a source electrode (such a wiring is also referred to as a source wiring) or the entire source electrode and layer (including a conductive layer or the like) to be a wiring electrically connected to a source electrode. Furthermore, a drain terminal refers to part of a drain electrode and a layer (including a conductive layer or the like) to be a wiring electrically connected to a drain electrode (such a wiring is also referred to as a drain wiring) or the entire drain electrode and layer (including a conductive layer or the like) to be a wiring electrically connected to a drain electrode.

Further, in this specification, a source terminal and a drain terminal of a transistor may change depending on the structure, the operating condition, or the like of the transistor; therefore, it is difficult to define which is a source terminal or a drain terminal in terminals of the transistor other than a gate terminal. Thus, in this specification, in a plurality of terminals, a terminal to be one of a source terminal or a drain terminal is referred to as one of the source terminal and the drain terminal, whereas a terminal to be the other of the source terminal or the drain terminal is referred to as the other of the source terminal and the drain terminal.

The transistor 611 has a function as a selection switch. Further, a gate terminal of the transistor 611 is electrically connected to the scan line 5031 illustrated in FIGS. 15A and 15B, and one of the source terminal and the drain terminal of the transistor 611 is electrically connected to the signal line 5041.

The liquid crystal element 612 has a first terminal and a second terminal. The first terminal of the liquid crystal element 612 is electrically connected to the other of the source terminal and the drain terminal of the transistor 611. Voltage at a given level is applied to the second terminal of the liquid crystal element 612. The liquid crystal element 612 can include a first electrode which serves as part of or the entire first terminal, a second electrode which serves as part of or the entire second terminal, and a layer including liquid crystal molecules whose transmittance is changed by application of voltage between the first electrode and the second electrode (such a layer is referred to as a liquid crystal layer).

The following are examples of the liquid crystal layer, a liquid crystal material which can be used for the liquid crystal layer, or a liquid crystal mode which can be used for the liquid crystal element 612 including the liquid crystal layer: a nematic liquid crystal, a cholesteric liquid crystal, a smectic liquid crystal, a discotic liquid crystal, a thermotropic liquid crystal, a lyotropic liquid crystal, a low molecular liquid crystal, a high molecular liquid crystal, a PDLC (a polymer dispersed liquid crystal), a ferroelectric liquid crystal, an anti-ferroelectric liquid crystal, a main chain type liquid crystal, a side chain type polymer liquid crystal, a PALC (a plasma addressed liquid crystal), a banana-shaped liquid crystal, a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned micro-cell) mode, an OCB (optical compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a guest-host mode, a blue-phase mode, and the like.

The capacitor 613 has a first terminal and a second terminal. The first terminal of the capacitor 613 is electrically connected to the other of the source and the drain of the transistor 611. Voltage at a given level is applied to the second terminal of the capacitor 613. The capacitor 613 includes a first electrode which serves as part of or the entire first terminal, a second electrode which serves as part of or the entire second terminal, and an insulating layer. The capacitor 613 has a function as a storage capacitor. Note that although the capacitor 613 is not necessarily provided, the capacitor 613 can inhibit adverse effects of leakage current of the transistor 611.

Next, operation of the pixel illustrated in FIG. 15A is described.

First, when the scan line 5031 is selected with the scan line driver circuit 503 illustrated in FIG. 14, a scan signal is inputted from the scan line driver circuit 503, thereby turning the transistor 611 on.

At this time, a potential of the first terminal of the liquid crystal element 612 and a potential of the first terminal of the capacitor 613 each be a potential in accordance with a video signal inputted from the signal line driver circuit 504. The alignment of the liquid crystal element 612 is controlled in accordance with voltage applied between the first terminal and the second terminal, and an image is displayed with the pixel in accordance with the transmissivity of the liquid crystal element 612. The above operation is sequentially performed every scan line 5031, so that data is written to all the pixels. The above is the operation of the pixel illustrated in FIG. 15A.

Note that the circuit configuration of a pixel in the display device of Embodiment 2 is not limited to the circuit configuration of the pixel illustrated in FIG. 15A. For example, the circuit configuration of the pixel illustrated in FIG. 15A, which is provided with another switching element (including a transistor), a resistor, another capacitor, or the like, can be used.

Further, the circuit configuration of the pixel in the display device of Embodiment 2 is not limited to the circuit configuration of the pixel illustrated in FIG. 15A, and a different circuit configuration can be used. Another example of the circuit configuration of the pixel in the display device of Embodiment 2 is described with reference to FIG. 15B. FIG. 15B is a circuit diagram illustrating the example of the circuit configuration of the pixel in the display device of Embodiment 2.

The pixel illustrated in FIG. 15B includes the transistor 611, the capacitor 613, a transistor 614, and a light-emitting element 615.

The gate terminal of the transistor 611 is electrically connected to the scan line 5031, and one of the source terminal and the drain terminal of the transistor 611 is electrically connected to the signal line 5041.

The capacitor 613 includes the first terminal and the second terminal. The first terminal of the capacitor 613 is electrically connected to the other of the source terminal and the drain terminal of the transistor 611, and first voltage is applied to the second terminal of capacitor 613. The capacitor 613 has a function as a storage capacitor. Note that although the capacitor 613 is not necessarily provided, with the capacitor 613, the ON state of the transistor 614 can be held for a certain period of time.

A gate terminal of the transistor 614 is electrically connected to the other of the source terminal and the drain terminal of the transistor 611, and the first voltage is applied to one of the source terminal and the drain terminal of the transistor 614.

The light-emitting element 615 has a first terminal and a second terminal. The first terminal of the light-emitting element 615 is electrically connected to the other of the source terminal and the drain terminal of the transistor 614. Second voltage is applied to the second terminal of the light-emitting element 615. The light-emitting element 615 includes a first electrode which serves as part of or the entire first terminal, a second electrode which serves as part of or the entire second terminal, and an electroluminescence layer which emits light by application of voltage between the first electrode and the second electrode, for example. As the light-emitting element 615, an EL (also referred to as electroluminescence) element can be used, for example. As the EL element, an organic EL element or an inorganic EL element can be used, for example.

Note that the first voltage is one of high power supply voltage and low power supply voltage, and the second voltage is the other of the high power supply voltage and low power supply voltage. Which of the first voltage and the second voltage is high power supply voltage or low power supply voltage is set in accordance with, for example, the polarity of the transistor 614. For example, in the case where the transistor 614 is a p-channel transistor, the first voltage is often set to high power supply voltage, and the second voltage is often set to low power supply voltage. In the case where the transistor 614 is an n-channel transistor, the first voltage is often set to low power supply voltage, and the second voltage is often set to high power supply voltage.

At least one of the first electrode and the second electrode of the light-emitting element 615 may be formed using a conductive material having a light-transmitting property. Thus, a light-emitting element having a top emission structure in which light is extracted through a surface opposite to the substrate, having a bottom emission structure in which light is extracted through a surface on the substrate side, or having a dual emission structure in which light is extracted through both the surface opposite to the substrate and the surface on the substrate side can be obtained. As the conductive material having a light-transmitting property, a conductive material having a light-transmitting property, such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added, can be used.

The electroluminescence layer may be formed using either a single layer or a stack including a plurality of layers. In the case where the electroluminescence layer is formed using a plurality of layers, an electron-injecting layer, an electron-transporting layer, an electroluminescence layer, a hole-transporting layer, and a hole-injecting layer are stacked in that order over the first electrode. It is not necessary to form all of these layers. The electroluminescence layer can be formed using an organic compound or an inorganic compound.

Next, the operation of the pixel illustrated in FIG. 15B is described.

First, when the scan line 5031 is selected with the scan line driver circuit 503 illustrated in FIG. 14, a scan signal is inputted from the scan line driver circuit 503, thereby turning the transistor 611 on.

At this time, a potential of the gate terminal of the transistor 614 and a potential of the first terminal of the capacitor 613 each be a potential in accordance with a video signal inputted from the signal line driver circuit 504. The transistor 614 is turned on, and current flows between the source terminal and the drain terminal of the transistor 614. Further, voltage at a given level is applied between the first terminal and the second terminal of the light-emitting element 615 in accordance with the amount of current that flows through the transistor 614, and an image is displayed with the pixel. The above operation is sequentially performed every scan line 5031, so that data is written to all the pixels. The above is the operation of the pixel illustrated in FIG. 15B.

In the case where a data signal inputted from the signal line 5041 to the pixel is a digital signal, the pixel is brought into a light-emitting state or a non-light-emitting state by switching on and off of the transistor. Thus, grayscale can be displayed using an area grayscale method or a time ratio grayscale method. An area grayscale method refers to a driving method in which one pixel is divided into a plurality of subpixels and the subpixels each having the structure illustrated in FIG. 15B are independently driven based on data signals so that grayscale is expressed. Further, a time ratio grayscale method refers to a driving method in which a period during which a pixel emits light is controlled, so that the grayscale is expressed.

The response speed of the light-emitting element 615 is higher than that of the liquid crystal element 612 illustrated in FIG. 15A, or the like, for example. Therefore, the light-emitting element 615 is suitable for a time ratio grayscale method. Specifically, in the case of displaying an image with a time ratio grayscale method, one frame period is divided into a plurality of subframe periods. Then, in accordance with a video signal, the light-emitting element in the pixel is brought into a light-emitting state or a non-light-emitting state in each subframe period. By the division of one frame period into a plurality of subframe periods, the total length of time in which a pixel actually emits light in one frame period can be controlled by a video signal, so that the grayscale can be expressed.

Figure 16A:
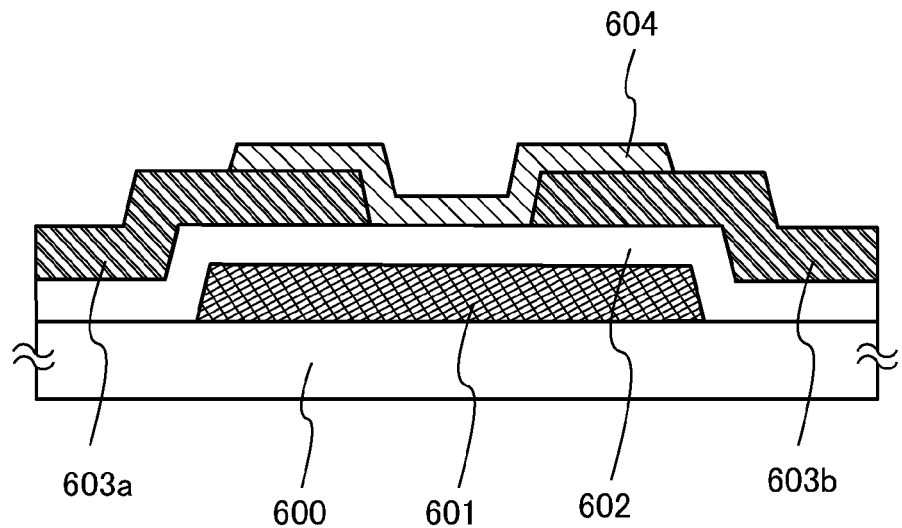
FIGS. 16A and 16B are cross-sectional views each illustrating an example of a structure of a transistor in a pixel of the display device illustrated in FIG. 14.
Figure 16B:
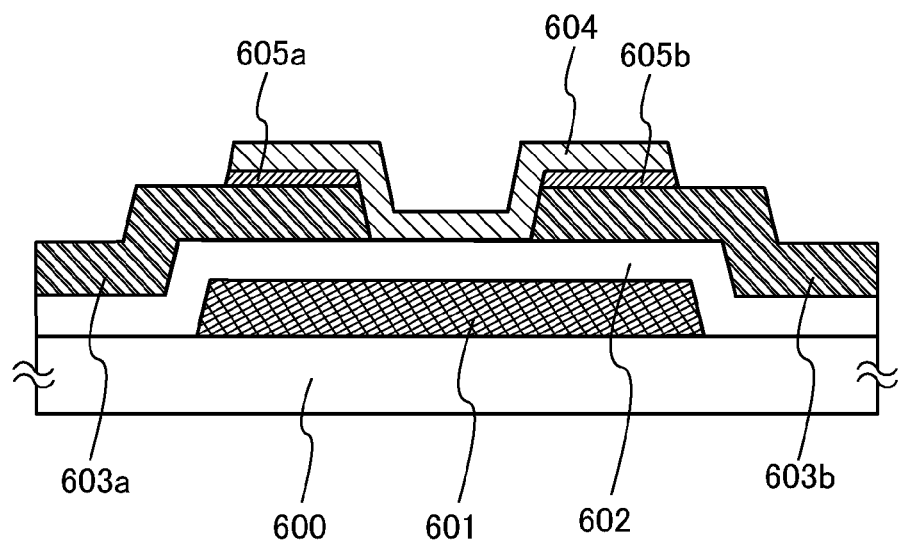

Next, examples of a structure of a transistor in a driver circuit such as the scan line driver circuit 503 or the signal line driver circuit 504, or a structure of a transistor in the pixel 5051 of the display device illustrated in FIG. 14 are described with reference to FIGS. 16A and 16B. FIGS. 16A and 16B are cross-sectional views each illustrating an example of the structure of the transistor in the pixel of the display device illustrated in FIG. 14.

A transistor illustrated in FIG. 16A includes a conductive layer 601, an insulating layer 602, a conductive layer 603a, a conductive layer 603b, and a semiconductor layer 604.

The conductive layer 601 is provided over a formation surface (in FIG. 16A, a substrate 600). The conductive layer 601 has a function as a gate electrode. Further, the conductive layer 601 and the semiconductor layer 604 are arranged to overlap with each other in the plane view, whereby the conductive layer 601 can have a function as a light-blocking layer which reduces light that enters the semiconductor layer 604. With the conductive layer 601 functioning as a light-blocking layer, deterioration of the semiconductor layer 604 due to light can be suppressed. Therefore, a desired function can be obtained even when the semiconductor layer 604 is formed using an oxide semiconductor material.

The insulating layer 602 is provided over the conductive layer 601. The insulating layer 602 has a function as a gate insulating layer.

The conductive layer 603a and the conductive layer 603b are provided over parts of the insulating layer 602. The conductive layer 603a has a function as one of a source electrode and a drain electrode, and the conductive layer 603b has a function as the other of the source electrode and the drain electrode. For example, in the case where the conductive layer 603a has a function as the source electrode, the conductive layer 603b has a function as the drain electrode.

In the transistor illustrated in FIG. 16A, the conductive layer 603a and the conductive layer 603b are provided over the conductive layer 601 with the insulating layer 602 interposed therebetween. However, the present invention is not limited thereto. For example, a semiconductor device of Embodiment 2 may have a structure in which the conductive layer 603a and the conductive layer 603b are provided over parts of the insulating layer 602, below which the conductive layer 601 is not formed.

The semiconductor layer 604 is provided over the insulating layer 602 with the conductive layer 603a and the conductive layer 603b interposed therebetween. The semiconductor layer 604 is a layer in which a channel is formed (such a layer is also referred to as a channel formation layer).

Further, the structure of the transistor of Embodiment 2 is not limited to the structure illustrated in FIG. 16A and may be a structure illustrated in FIG. 16B.

A transistor illustrated in FIG. 16B includes the conductive layer 601, the insulating layer 602, the conductive layer 603a, the conductive layer 603b, the semiconductor layer 604, a buffer layer 605a, and a buffer layer 605b.

The transistor illustrated in FIG. 16B has a structure in which the buffer layers are added to the structure of the transistor illustrated in FIG. 16A. Therefore, the description of the components of the transistor illustrated in FIG. 16A is applied to the corresponding components of the transistor illustrated in FIG. 16B as appropriate. Components of the transistor illustrated in FIG. 16B which are different from those of the transistor illustrated in FIG. 16A are described below.

The buffer layer 605a is provided over the conductive layer 603a, and the buffer layer 605b is provided over the conductive layer 603b. The buffer layer 605a and the buffer layer 605b each function as a layer which facilitates electrical connection between the conductive layer 603a or the conductive layer 603b and the semiconductor layer 604. Note that the buffer layer 605a and the buffer layer 605b are not necessarily provided over the conductive layer 603a and the conductive layer 603b, and may be electrically connected to the conductive layer 603a and the conductive layer 603b.

The buffer layer 605a and the buffer layer 605b can be formed using the same material and the same manufacturing method as the semiconductor layer 604, for example. Further, the buffer layer 605a and the buffer layer 605b preferably have the same conductivity as the semiconductor layer 604 or have higher conductivity than the semiconductor layer 604. For example, a semiconductor film is formed, and a resist mask is selectively formed over the semiconductor film by a photolithography step so that the semiconductor film is etched, whereby the buffer layer 605a and the buffer layer 605b can be formed.

The transistor illustrated in FIG. 16B is a so-called a bottom-contact transistor in which a semiconductor layer to be a channel formation layer is provided above a source electrode and a drain electrode. With the bottom-contact transistor, a large contact area of the source electrode and the drain electrode with the semiconductor layer can be obtained. Note that the transistor of Embodiment 2 is not limited to a bottom-contact transistor, and can be a so-called top-contact transistor in which a source electrode and a drain electrode are provided over a semiconductor layer to be a channel formation layer.

The transistors illustrated in FIGS. 16A and 16B are so-called bottom-gate transistors in each of which a source electrode, a drain electrode, and a channel formation layer are provided over a gate electrode. With the bottom-gate transistor, a gate insulating layer and a semiconductor layer can be formed successively.

Figure 17:
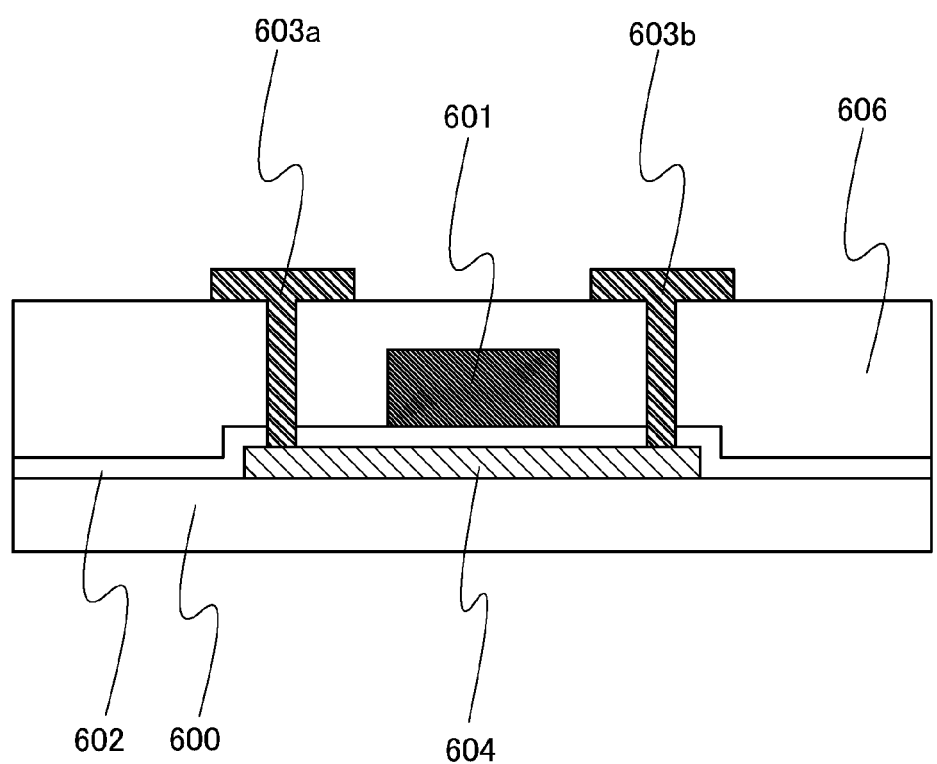
FIG. 17 is a cross-sectional view illustrating an example of a structure of a transistor in a pixel of the display device illustrated in FIG. 14.

Note that the structure of the semiconductor device of Embodiment 2 is not limited to a bottom-gate structure, and can be a top-gate structure. The structure of a top-gate transistor is described with reference to FIG. 17. FIG. 17 is a cross-sectional view illustrating an example of the structure of a transistor in the pixel of the display device illustrated in FIG. 14.

The transistor illustrated in FIG. 17 includes the conductive layer 601, the insulating layer 602, the conductive layer 603a, the conductive layer 603b, and the semiconductor layer 604.

The semiconductor layer 604 is provided over a formation surface (in FIG. 17, the substrate 600). The semiconductor layer 604 is a layer in which a channel is formed (such a layer is also referred to as a channel formation layer).

The insulating layer 602 is provided over the substrate 600 with the semiconductor layer 604 interposed therebetween. The insulating layer 602 has a function as a gate insulating layer.

The conductive layer 601 is provided over the semiconductor layer 604 with the insulating layer 602 interposed therebetween. The conductive layer 601 has a function as a gate electrode.

The insulating layer 606 is provided over the insulating layer 602 with the conductive layer 601 interposed therebetween. The insulating layer 606 has a function as a protective layer which protects the conductive layer 601.

The conductive layer 603a and the conductive layer 603b are provided over parts of the insulating layer 606. The conductive layer 603a is electrically connected to the semiconductor layer 604 through an opening portion provided in the insulating layer 602 and the insulating layer 606. The conductive layer 603b is electrically connected to the semiconductor layer 604 through an opening portion provided in the insulating layer 602 and the insulating layer 606. The conductive layer 603a has a function as one of the source electrode and the drain electrode, and the conductive layer 603b has a function as the other of the source electrode and the drain electrode. For example, in the case where the conductive layer 603a has a function as the source electrode, the conductive layer 603b has a function as the drain electrode.

Figure 18A:
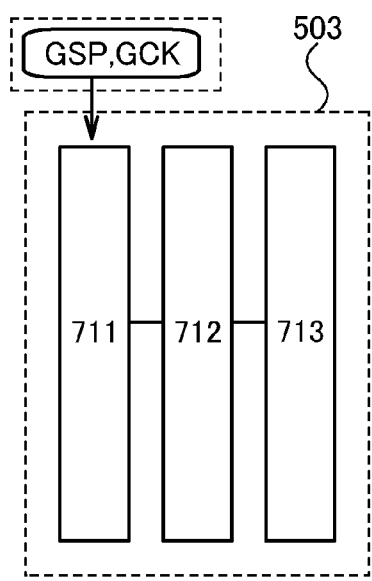
FIGS. 18A and 18B are block diagrams each illustrating a structure of a driver circuit of the display device illustrated in FIG. 14.
Figure 18B:
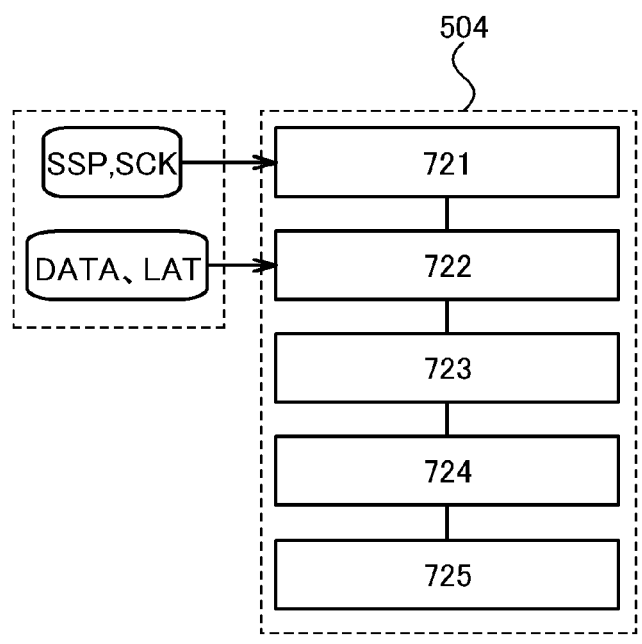

Next, examples of structures of the scan line driver circuit 503 and the signal line driver circuit 504 in the display device illustrated in FIG. 14 are described with reference to FIGS. 18A and 18B. FIGS. 18A and 18B illustrate examples of the structures of the driver circuits in the display device illustrated in FIG. 14. FIG. 18A is a block diagram illustrating an example of a structure of the scan line driver circuit, and FIG. 18B is a block diagram illustrating an example of the structure of the signal line driver circuit.

The scan line driver circuit 503 illustrated in FIG. 18A includes a shift register 711, a level shifter 712, and a buffer circuit 713.

A signal such as a gate start pulse (GSP) or a gate clock signal (GCK) is inputted to the shift register 711.

The level shifter 712 has a function of generating a plurality of signals which are different depending on use, in accordance with a signal inputted.

The buffer circuit 713 has a function of amplifying an output signal of the level shifter 712 which is inputted to the buffer circuit 713. For example, the buffer circuit 713 can have an operational amplifier or the like.

The signal line driver circuit 504 illustrated in FIG. 18B includes a shift register 721, a latch circuit 722, a level shifter 723, a buffer circuit 724 and a D/A converter circuit 725.

A signal such as a source start pulse (SSP) or a source clock signal (SCK) is inputted to the shift register 721.

Image data signals (DATA) and latch signals (LAT) are inputted to the latch circuit 722. The image data signals inputted are held for a certain period of time in the latch circuit, and the signals which had been held are simultaneously outputted to the pixel portion illustrated in FIG. 14. This is referred to as line sequential driving.

The level shifter 723 has a function of generating a plurality of signals which are different depending on use, in accordance with a signal inputted.

The buffer circuit 724 has a function of amplifying a signal inputted, and can have an operational amplifier or the like, for example.

The D/A converter circuit 725 has a function of converting a digital signal into an analog signal in the case where a signal inputted is a digital signal. Note that in the case where a signal inputted is an analog signal, the D/A converter circuit 725 is not necessarily provided.

The driver circuit can include a semiconductor element formed using an oxide semiconductor material, for example. As the semiconductor element, a transistor, a capacitor, a resistor, or the like can be given, for example. In the case where a transistor is used, for example, a transistor having the same structure as a transistor in a pixel can be used.

Figure 19A:
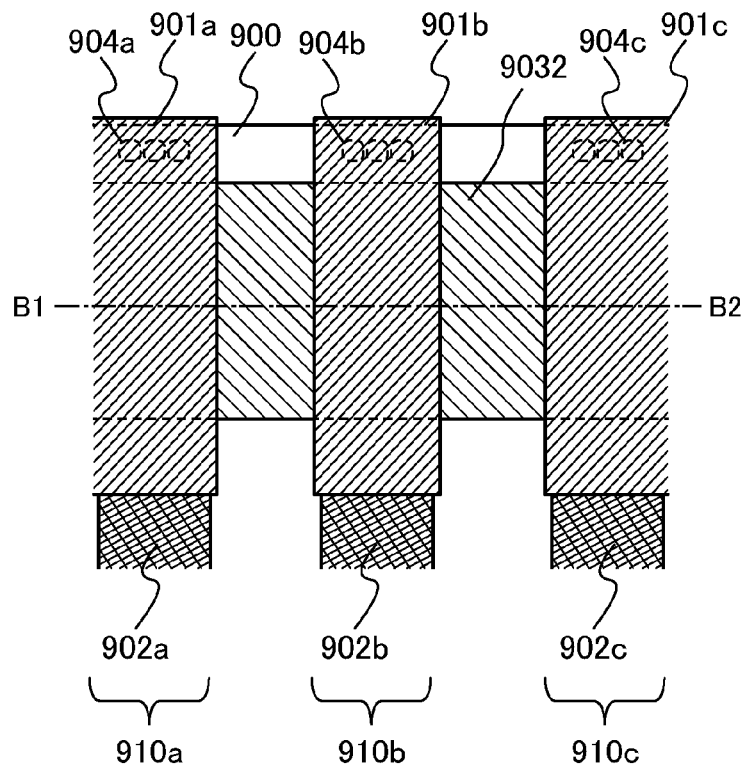
FIGS. 19A and 19B illustrate an example of a structure of a terminal portion of the display device illustrated in FIG. 14.
Figure 19B:
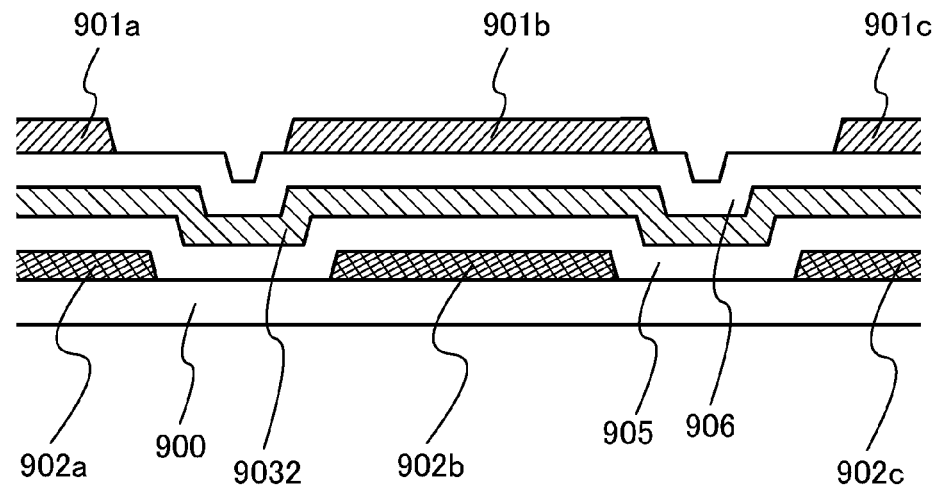

Next, an example of a structure of the terminal portion 506 is described with reference to FIGS. 19A and 19B. FIGS. 19A and 19B illustrate an example of the structure of the terminal portion 506 in the display device illustrated in FIG. 14. FIG. 19A is a top view and FIG. 19B is a cross-sectional view taken along line B1-B2 of FIG. 19A.

The terminal portion 506 illustrated in FIG. 19A includes a terminal 910a, a terminal 910b, and a terminal 910c. The terminal portion 506 further includes a semiconductor layer 9032, an insulating layer 905, and an insulating layer 906, as illustrated in FIG. 19B.

The terminal 910a includes a conductive layer 901a and a conductive layer 902a. The terminal 910b includes a conductive layer 901b and a conductive layer 902b. The terminal 910c includes a conductive layer 901c and a conductive layer 902c.

Further, as illustrated in FIG. 19B, the insulating layer 905 is provided over the conductive layer 902a, the conductive layer 902b, and the conductive layer 902c. The semiconductor layer 9032 is provided over the conductive layer 902a, the conductive layer 902b, and the conductive layer 902c with the insulating layer 905 interposed therebetween. The insulating layer 906 is provided over the semiconductor layer 9032. The conductive layer 901a, the conductive layer 901b, and the conductive layer 901c are provided over the semiconductor layer 9032 with the insulating layer 906 interposed therebetween. That is, a structure in which, in the plane view, the semiconductor layer 9032 overlaps with the conductive layer 901a, the conductive layer 901b, and the conductive layer 901c and the semiconductor layer 9032 overlaps with the conductive layer 902a, the conductive layer 902b, and the conductive layer 902c, is obtained.

The conductive layer 901a to the conductive layer 901c each have a function as a terminal electrode of a semiconductor device, for example. The conductive layer 901a to the conductive layer 901c can be formed using a material which can be applied to a conductive film used for the conductive layer 601 illustrated in FIGS. 16A and 16B, for example. Therefore, the conductive layer 601 and the conductive layer 901a to the conductive layer 901c can be formed using one conductive film in the same step, for example.

The conductive layer 902a is electrically connected to the conductive layer 901a through an opening portion 904a. The conductive layer 902b is electrically connected to the conductive layer 901b through an opening portion 904b. The conductive layer 902c is electrically connected to the conductive layer 901c through an opening portion 904c. The conductive layer 902a to the conductive layer 902c each have a function as, for example, a wiring for supplying a signal to the driver circuit or the pixel portion of the display device (such a wiring is also referred to as a signal line, a source line or a gate line), or a wiring for supplying power (such a wiring is also referred to as a power supply line). The conductive layer 902a to the conductive layer 902c can be formed using a material which can be applied to a conductive film used for the conductive layer 603a and the conductive layer 603b which are illustrated in FIGS. 16A and 16B, for example. Therefore, the conductive layer 603a, the conductive layer 603b, and the conductive layer 902a to the conductive layer 902c can be formed using one conductive film in the same step, for example.

The semiconductor layer 9032 can be formed using a material which can be applied to a semiconductor film used for the semiconductor layer 604 illustrated in FIGS. 16A and 16B, for example. Therefore, the semiconductor layer 604 and the semiconductor layer 9032 can be formed using one semiconductor film in the same step, for example.

The insulating layer 905 and the insulating layer 906 can each be formed using an insulating layer or the like including silicon or the like, for example. Therefore, the insulating layer 602 functioning as a gate insulating layer of the transistor which is illustrated in FIGS. 16A and 16B and the insulating layer 905 functioning as a dielectric layer can be formed using one insulating film, for example.

As illustrated in FIGS. 19A and 19B as an example, the semiconductor device of Embodiment 2 includes a capacitor formed using an oxide semiconductor layer, a conductive layer forming a wiring or an electrode, and an insulating layer provided between the oxide semiconductor layer and the conductive layer. The capacitor has a function as a filter circuit for reducing the adverse effects of noise.

Further, the semiconductor device of Embodiment 2 includes a plurality of capacitors each formed using the oxide semiconductor layer, the conductive layer forming a wiring or an electrode, and the insulating layer provided between the oxide semiconductor layer and the conductive layer. In addition, the oxide semiconductor layer is provided as a continuous oxide semiconductor layer between a plurality of terminals. Therefore, it is not necessary to perform minute patterning, whereby a manufacturing process can be simplified. Note that the structure is not limited to the structure illustrated in FIGS. 19A and 19B, and the display device of Embodiment 2 can have a structure in which an oxide semiconductor layer is provided every terminal.

Next, the operation of the terminal portion in the display device of Embodiment 2 is described. Here, the operation of the terminal portion when a signal is inputted to the terminal portion is described. The case where the absolute value of voltage of an input signal is smaller than or equal to a given value and the case where the absolute value of the voltage of the input signal is larger than the given value are separately described. Note that the given value can be set as appropriate in consideration of the specification of the functional circuit, or the like, for example.

The capacitance of the capacitor is changed in accordance with voltage of an input signal. In the case where the absolute value of voltage of an input signal is smaller than or equal to a given value, the capacitance of the capacitor is smaller than a given value, which results in a small delay of an output signal with respect to the input signal of the filter circuit. Thus, the effect of filtering is small. Note that the given value of an absolute value of voltage applied to the capacitor, the given value of capacitance of the capacitor, and the given value of delay time can be set as appropriate in accordance with the specification of the semiconductor device.

In the case where the absolute value of voltage of an input signal is larger than a given value, the absolute value of voltage applied between the terminals of the capacitor is larger than a given value, and the capacitance of the capacitor is larger than a given value in accordance with the input signal, which results in a long delay of an output signal with respect to the input signal of the filter circuit. Thus, the effect of filtering with respect to noise is larger than that of the case where the absolute value of voltage of the input signal is smaller than or equal to a given value. The above is the operation of the semiconductor device of Embodiment 2.

As described above, the capacitance of a capacitor is made low in the case where a signal with voltage whose absolute value is smaller than or equal to a given value is inputted, so that the delay of a signal inputted to a functional circuit is reduced. In addition, the capacitance of a capacitor is made high in the case where a signal with voltage whose absolute value is larger than or equal to a given value is inputted, so that the delay of a signal inputted to a functional circuit is increased. Accordingly, adverse effects on actual operation can be reduced, and adverse effects on an input signal due to the noise can be reduced in the case where noise is generated, for example.

A driver circuit or a pixel portion which includes a semiconductor element using an oxide semiconductor often needs a comparatively higher level of operating voltage than a functional circuit including a semiconductor element using a polycrystalline semiconductor, for example. Therefore, the amplitude of an input signal tends to be high. However, as in the semiconductor device of Embodiment 2, a filter circuit using a capacitor is provided between a terminal electrode and a driver circuit or a pixel portion of a display device which are electrically connected to each other, whereby adverse effects of noise can be reduced even in a display device including a semiconductor element using an oxide semiconductor.

Note that Embodiment 2 can be combined with any of Embodiment 1 and Embodiments 3 to 6, as appropriate.

(Embodiment 3)

In Embodiment 3, a method for manufacturing a display device which is an embodiment of the present invention is described.

As an example of a method for manufacturing a display device of Embodiment 3, a method for manufacturing a terminal portion and a semiconductor element portion included in a pixel, a driver circuit, and the like is described with reference to FIGS. 20A and 20B, FIGS. 21A and 21B, and FIGS. 22A and 22B. FIGS. 20A and 20B, FIGS. 21A and 21B, and FIGS. 22A and 22B are cross-sectional views illustrating the example of the method for manufacturing a terminal portion and a semiconductor element portion of the display device of Embodiment 3. Note that in the method for manufacturing a terminal portion and a semiconductor element portion of the display device, which is illustrated in FIGS. 20A and 20B, FIGS. 21A and 21B, and FIGS. 22A and 22B, the case of forming a transistor as a semiconductor element is described as an example.

Figure 20A:
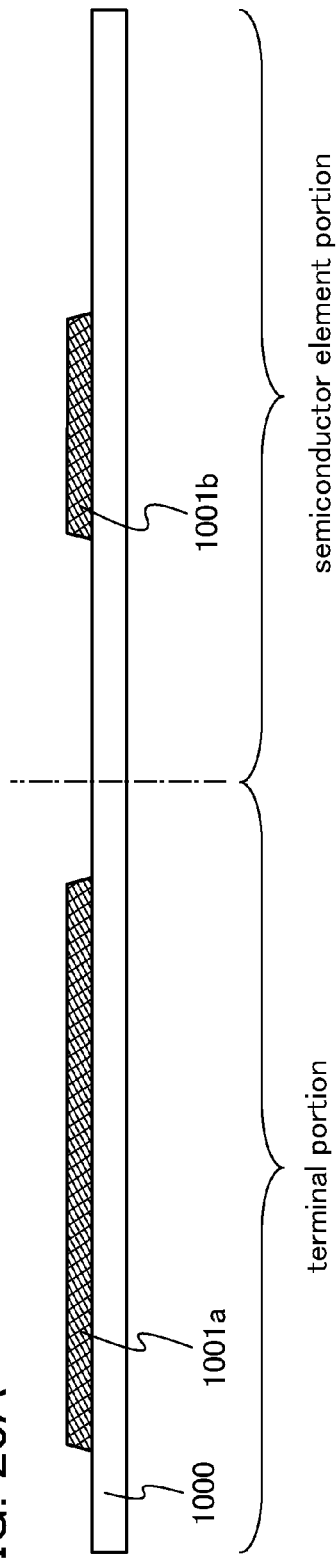
FIGS. 20A and 20B are cross-sectional views illustrating an example of a method for manufacturing a terminal portion and a semiconductor element portion of a display device in Embodiment 3.

First, as illustrated in FIG. 20A, a substrate 1000 is prepared, and a conductive layer 1001a and a conductive layer 1001b are formed over the substrate 1000. For example, a conductive film is formed over the substrate 1000, and the conductive film is selectively etched, whereby the conductive layer 1001a and the conductive layer 1001b can be formed.

As the substrate 1000, a glass substrate, a quartz substrate, a ceramic substrate, a sapphire substrate, or the like can be used, for example. As the glass substrate, a non-alkali glass substrate or the like can be used. As the non-alkali glass substrate, a substrate using barium borosilicate glass, aluminoborosilicate glass, aluminosilicate glass, or the like is given. A plastic substrate can be alternatively used as the substrate 1000 if it can withstand the temperature of each treatment used for manufacturing the semiconductor device. Further, in the case where a surface is subjected to insulation treatment, a semiconductor substrate, a metal substrate, a stainless steel substrate, or the like can be alternatively used.

The conductive film can be formed using, for example, a conductive film including a conductive material such as molybdenum, titanium, chromium, tantalum, tungsten, aluminum, copper, neodymium, or scandium, or an alloy material which contains any of these materials as a main component. Further, for example, a sputtering method can be used for forming the conductive film. Furthermore, for example, a resist mask is formed over the conductive film by a photolithography step and the conductive film is selectively etched, whereby the conductive layer 1001a and the conductive layer 1001b can be formed.

Examples of a sputtering method include an RF sputtering method in which a high-frequency power source is used as a sputtering power source, a DC sputtering method, and a pulsed DC sputtering method in which a bias is applied in a pulsed manner.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering in which voltage is also applied to a substrate during deposition.

Note that for the etching, either dry etching or wet etching can be used. As an etching apparatus used for the dry etching, an etching apparatus using a reactive ion etching method (an RIE method), or a dry etching apparatus using a high-density plasma source such as ECR (electron cyclotron resonance) or ICP (inductively coupled plasma) can be used. Furthermore, as a dry etching apparatus by which electric discharge is likely to be homogeneous in a large area as compared to the case of an ICP etching apparatus, there is an ECCP (enhanced capacitively coupled plasma) mode etching apparatus in which an upper electrode is grounded, a power source with a frequency of 13.56 MHz is connected to a lower electrode, and a power source with a frequency of 3.2 MHz is connected to the lower electrode. This ECCP mode etching apparatus can be applied even when, as the substrate, a substrate, the size of which exceeds 3 m of the tenth generation, is used, for example.

The conductive film can be formed using a stacked-layer film in which conductive films including any of the above materials are stacked. Here, there is a problem in that an aluminum film alone has low heat resistance, high tendency to corrosion, or the like. Therefore, in the case where the conductive layer 1001a and the conductive layer 1001b are formed using an aluminum film as one of the conductive films, for example, the conductive film is preferably formed using a stacked-layer film in which the aluminum film and a heat-resistant conductive film are stacked, whereby heat resistance, corrosion resistance, or the like can be increased more than a conductive film formed using only an aluminum film. The heat-resistant conductive film can be formed using an element selected from titanium, tantalum, tungsten, molybdenum, chromium, neodymium, and scandium, an alloy containing any of the elements, an alloy film combining any of the elements, or a nitride containing any of the elements.

Examples of the conductive film having a stacked-layer structure include the following: a conductive film in which a molybdenum film is stacked over an aluminum film; a conductive film in which a molybdenum film is stacked over a copper film; a conductive film in which a titanium nitride film or a tantalum nitride film is stacked over a copper film; and a conductive film in which a titanium nitride film and a molybdenum film are stacked.

Figure 20B:
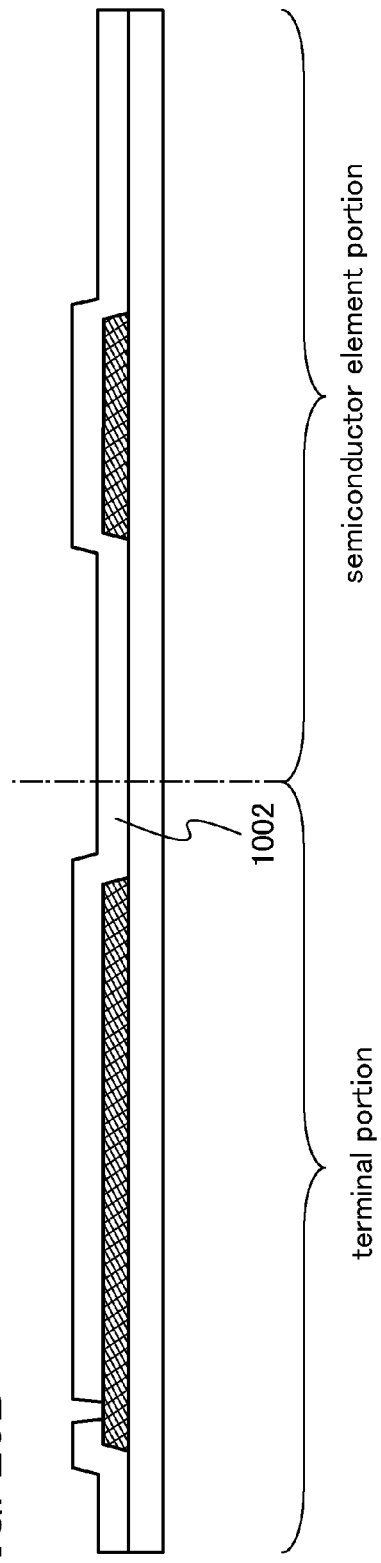

As illustrated in FIG. 20B, an insulating layer 1002 is formed over the substrate 1000, the conductive layer 1001a, and the conductive layer 1001b. Further, the insulating layer 1002 is selectively etched, whereby an opening portion is formed in the insulating layer 1002, so that part of the conductive layer 1001a is exposed.

The insulating layer 1002 can be formed using, for example, an insulating film including oxide, nitride, oxynitride, or nitride oxide of silicon, aluminum, yttrium, tantalum, or hafnium; or a compound containing at least two of such materials.

As illustrated in FIG. 21A, a conductive layer 1003a and a conductive layer 1003b are formed over part of the conductive layer 1001b with the insulating layer 1002 interposed therebetween. For example, a conductive film is formed over the insulating layer 1002 and the conductive film is selectively etched, whereby the conductive layer 1003a and the conductive layer 1003b can be formed.

The conductive layer 1003a and the conductive layer 1003b can be formed using a conductive film which is formed by, for example, a sputtering method, a vacuum evaporation method, or the like, using a material formed using a metal including an element selected from aluminum (Al), copper (Cu), titanium (Ti), tantalum (Ta), tungsten (W), molybdenum (Mo), chromium (Cr), neodymium (Nd), and scandium (Sc); an alloy including any of the above elements as its component; nitride including any of the above elements as its component; or the like. For example, a resist mask is selectively formed over the conductive film by a photolithography step and the conductive film is etched, whereby the conductive layer 1003a and the conductive layer 1003b can be formed.

For example, the conductive film can be formed using a single-layer film of a molybdenum film or a titanium film. Alternatively, the conductive film can be formed using a stacked-layer film, and for example, the conductive film can be formed using a stack including an aluminum film and a titanium film. A three-layer structure in which a titanium film, an aluminum film, and a titanium film are sequentially stacked may be used. A three-layer structure in which a molybdenum film, an aluminum film, and a molybdenum film are sequentially stacked may be used. As the aluminum films used for these stacked-layer structures, an aluminum film including neodymium (an Al—Nd film) may be used. Further, the conductive film can be formed using an aluminum film including silicon.

The conductive film may be formed using a material having high conductivity and a light-transmitting property. As such a material, indium tin oxide (ITO), indium tin oxide containing silicon oxide (ITSO), organoindium, organotin, zinc oxide (ZnO), or the like can be used, for example.

As illustrated in FIG. 21B, a semiconductor layer 1005a is formed over the conductive layer 1001a with the insulating layer 1002 interposed therebetween, and a semiconductor layer 1005b is formed over the conductive layer 1003a and the conductive layer 1003b and is formed over the conductive layer 1001b with the insulating layer 1002 interposed between the semiconductor layer 1005b and the conductive layer 1001b. For example, a semiconductor film is formed over the insulating layer 1002 and the semiconductor film is selectively etched, whereby the semiconductor layer 1005a and the semiconductor layer 1005b can be formed.

As a semiconductor film which can be used for forming the semiconductor layer 1005a and the semiconductor layer 1005b, an oxide semiconductor film or the like can be used, for example. As the oxide semiconductor film, an oxide semiconductor film and the like including any of Sn, In, and Zn can be given, for example. Further, in the case of using an oxide semiconductor film, an oxide semiconductor film including an amorphous component can be used. Furthermore, an oxide semiconductor film including a crystal grain (nanocrystal) can be used. At this time, the crystal grain (nanocrystal) in the oxide semiconductor film has a diameter of 1 nm to 10 nm, typically approximately 2 nm to 4 nm.

As an oxide semiconductor, an oxide semiconductor whose composition formula is represented by $InMO_3(ZnO)_m$ (m>0) can be alternatively used, for example. It is particularly preferable to use an In—Ga—Zn—O-based oxide semiconductor among oxide semiconductors whose composition formulas are represented by $InMO_3(ZnO)_m$ (m>0). Note that M represents one or more of metal elements selected from gallium (Ga), iron (Fe), nickel (Ni), manganese (Mn), or cobalt (Co). As an example, M may be Ga or may include the above metal element in addition to Ga, for example, M may be Ga and Ni, or Ga and Fe. Moreover, in the above oxide semiconductors, in some cases, a transition metal element such as Fe or Ni or an oxide of the transition metal is contained as an impurity element in addition to a metal element contained as M.

Note that in the case of using an In—Ga—Zn—O-based non-single-crystal film, after an In—Ga—Zn—O-based non-single-crystal film is formed, heat treatment is preferably performed at 100° C. to 600° C., typically 200° C. to 400° C. For example, heat treatment is performed at 350° C. for one hour under the atmospheric air or a nitrogen atmosphere, whereby rearrangement of an In—Ga—Zn—O-based oxide semiconductor film is performed at the atomic level. By the heat treatment (including optical annealing or the like), strain energy which inhibits carrier movement in the oxide semiconductor film can be released. Note that there is no particular limitation on timing of the above heat treatment as long as the heat treatment is performed after formation of the oxide semiconductor film. Further, since the terminal portion in the display device of Embodiment 3 has a structure in which, in the plane view, the oxide semiconductor layer overlaps with the conductive layer, the oxide semiconductor layer can be heated efficiently by heat treatment. Furthermore, for example, when the terminal portion in the display device of Embodiment 3 has a structure in which the oxide semiconductor layer is in contact with the conductive layer in a manner similar to the semiconductor device illustrated in FIGS. 2A and 2B of Embodiment 1, the oxide semiconductor layer can be heated more efficiently by heat treatment.

The In—Ga—Zn—O-based non-single-crystal film is subjected to heat treatment at 200° C. to 500° C., typically 300° C. to 400° C. for 10 minutes to 100 minutes after being formed by a sputtering method, for example. By X-ray diffraction (XRD) analysis after heat treatment, an amorphous structure is observed as a crystal structure of the In—Ga—Zn—O-based non-single-crystal film even after heat treatment.

As the oxide semiconductor film, any of the following oxide semiconductor films can be applied in addition to the above: an In—Sn—Zn—O-based oxide semiconductor film; an Al—In—Zn—O-based oxide semiconductor film; a Ga—Sn—Zn—O-based oxide semiconductor film; an Al—Ga—Zn—O-based oxide semiconductor film; an Al—Sn—Zn—O-based oxide semiconductor film; an In—Zn—O-based oxide semiconductor film; a Sn—Zn—O-based oxide semiconductor film; an Al—Zn—O-based oxide semiconductor film; an In—O-based oxide semiconductor film; a Sn—O-based oxide semiconductor film; and a Zn—O-based oxide semiconductor film.

For example, a resist mask is selectively formed over a semiconductor film by a photolithography step and then the semiconductor film is etched, whereby the semiconductor layer 1005a and the semiconductor layer 1005b can be formed.

Figure 22A:
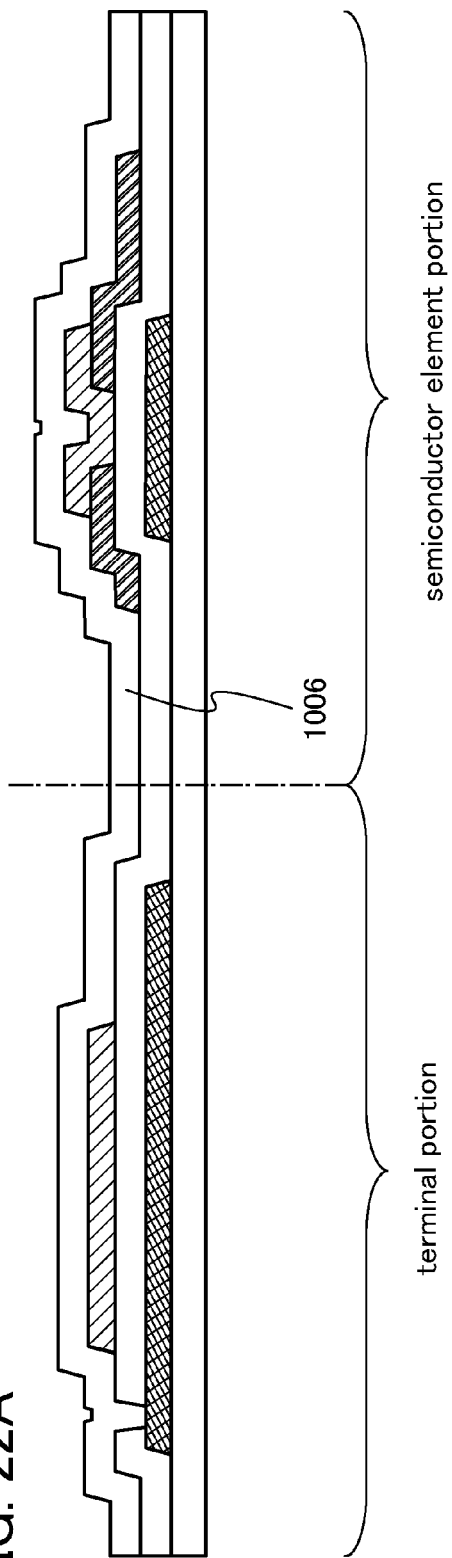
FIGS. 22A and 22B are cross-sectional views illustrating an example of a method for manufacturing a terminal portion and a semiconductor element portion of the display device in Embodiment 3.

As illustrated in FIG. 22A, an insulating layer 1006 is formed over the insulating layer 1002 with the conductive layer 1003a, the conductive layer 1003b, the semiconductor layer 1005a, and the semiconductor layer 1005b interposed therebetween. Preferably, the insulating layer 1006 is formed over the top surfaces and the side surfaces of the conductive layer 1003a and the conductive layer 1003b, and on the top surfaces and the side surfaces of the semiconductor layer 1005a and the semiconductor layer 1005b.

The insulating layer 1006 can have a function as a dielectric layer of a capacitor in the terminal portion, and can have a function as a protective layer of a transistor in the semiconductor element portion, for example. The insulating layer 1006 can be formed using a material which can be used for the insulating layer 1002, for example.

Figure 22B:
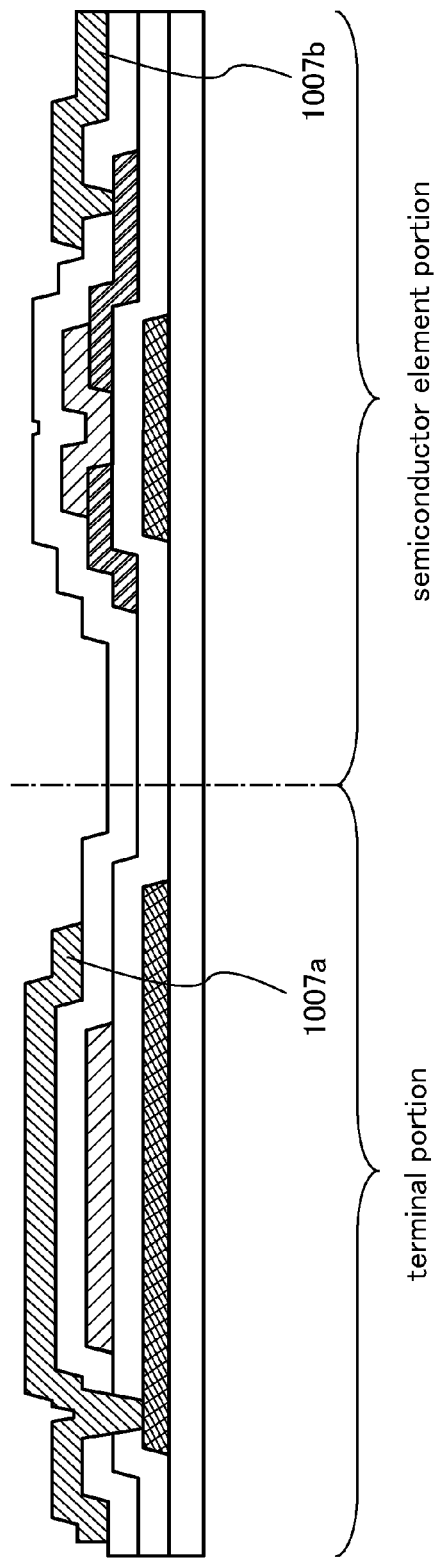

As illustrated in FIG. 22B, a conductive layer 1007a is formed to be electrically connected to the conductive layer 1001a through an opening portion provided in the insulating layer 1002 and the insulating layer 1006, and a conductive layer 1007b is formed to be electrically connected to the conductive layer 1003b through an opening portion provided in the insulating layer 1006. For example, a conductive film is formed over the insulating layer 1006 and the conductive film is selectively etched, whereby the conductive layer 1007a and the conductive layer 1007b can be formed.

At this time, the conductive layer 1007a is preferably formed over the semiconductor layer 1005a with the insulating layer 1006 interposed therebetween, whereby a capacitor can be formed using the semiconductor layer 1005a, the insulating layer 1006, and the conductive layer 1007a.

The conductive layer 1007a and the conductive layer 1007b can be formed using a conductive film having a light-transmitting property including indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like.

For example, a resist mask is selectively formed over a conductive film by a photolithography step and the conductive film is etched, whereby the conductive layer 1007a and the conductive layer 1007b can be formed.

Through the above steps, the terminal portion and the semiconductor element portion can be formed.

As illustrated in FIGS. 20A and 20B, FIGS. 21A and 21B, and FIGS. 22A and 22B as an example, according to the method for manufacturing the display device of Embodiment 3, a semiconductor element in a semiconductor element portion included in a pixel portion, a capacitor in a terminal portion, and the like can be formed through the same steps. Thus, the increase of the number of manufacturing steps can be prevented.

Note that Embodiment 3 can be combined with any of Embodiments 1 and 2 and Embodiments 4 to 6, as appropriate.

(Embodiment 4)

Figure 23A:
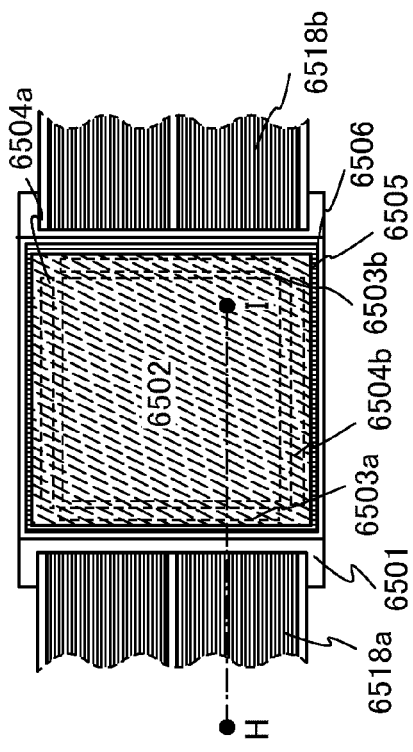
FIGS. 23A and 23B illustrate an example of a structure of a light-emitting panel in Embodiment 4.
Figure 23B:
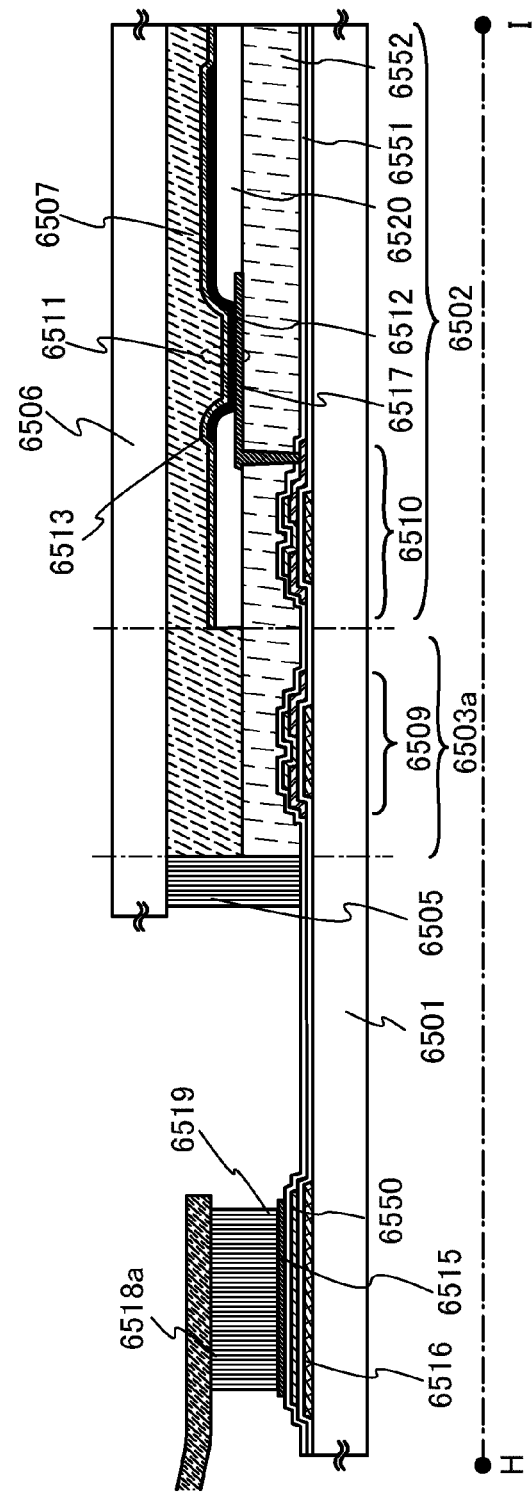

In Embodiment 4, as one mode of a display device according to an embodiment of the present invention, an appearance and a cross section of a light-emitting panel is described with reference to FIGS. 23A and 23B. FIGS. 23A and 23B illustrate an example of a structure of a light-emitting panel in Embodiment 4. FIG. 23A is a top view and FIG. 23B is a cross-sectional view taken along line H-I of FIG. 23A.

The light-emitting panel illustrated in FIGS. 23A and 23B includes a pixel portion 6502, signal line driver circuits 6503a and 6503b, and scan line driver circuits 6504a and 6504b over a first substrate 6501, and a sealant 6505 is provided to surround the pixel portion 6502, the signal line driver circuits 6503a and 6503b, and the scan line driver circuits 6504a and 6504b. A second substrate 6506 is provided over the pixel portion 6502, the signal line driver circuits 6503a and 6503b, and the scan line driver circuits 6504a and 6504b. Accordingly, the pixel portion 6502, the signal line driver circuits 6503a and 6503b, and the scan line driver circuits 6504a and 6504b are sealed together with a filler 6507, by the first substrate 6501, the sealant 6505, and the second substrate 6506. In such a manner, it is preferable that the pixel portion 6502, the signal line driver circuits 6503a and 6503b, and the scan line driver circuits 6504a and 6504b be packed (sealed) with a protective film (such as an attachment film or an ultraviolet curable resin film) or a cover material with high air-tightness and little degasification so as not to be exposed to the air.

The pixel portion 6502, the signal line driver circuits 6503a and 6503b, and the scan line driver circuits 6504a and 6504b provided over the first substrate 6501 each include a plurality of TFTs, and a TFT 6510 included in the pixel portion 6502 and a TFT 6509 included in the signal line driver circuit 6503a are illustrated as an example in FIG. 23B. As a TFT included in each of the pixel portion 6502, the signal line driver circuits 6503a and 6503b, and the scan line driver circuits 6504a and 6504b, any of the transistors in above Embodiments can be used. In the semiconductor device illustrated in FIGS. 23A and 23B, the structure illustrated in FIG. 16A is used as an example of a transistor. As a specific description thereof, the description of FIG. 16A is applied thereto as appropriate. Note that in FIGS. 23A and 23B, the TFTs 6509 and 6510 are n-channel TFTs.

In the light-emitting panel illustrated in FIGS. 23A and 23B, in order to reduce surface unevenness of the TFT and improve the reliability of the TFT, the TFT is covered with insulating layers (insulating layers 6551 and 6552) functioning as a protective layer and a planarizing insulating film.

Here, the insulating layer 6551 having a stacked-layer structure is formed as the protective layer. As a first layer of the insulating layer 6551, a silicon oxide film is formed by a sputtering method. The use of the silicon oxide film as the protective layer is effective in preventing hillocks in an aluminum film used as a source electrode and a drain electrode.

Moreover, as a second layer of the insulating layer 6551, a silicon nitride film is formed by a sputtering method. The use of the silicon nitride film as the protective layer can prevent mobile ions such as sodium from entering the semiconductor region and changing electric characteristics of the TFT.

Further, after the protective layer is formed, annealing (250° C. to 400° C.) may be performed on the semiconductor layer.

In addition, the insulating layer 6552 is formed as the planarizing insulating film. An organic material having heat resistance, such as polyimide, acrylic, benzocyclobutene, polyamide, or epoxy can be used for the insulating layer 6552. Other than such organic materials, it is also possible to use a low-dielectric constant material (a low-k material), a siloxane-based resin, phosphosilicate glass (PSG), borophosphosilicate glass (BPSG), or the like. Note that the insulating layer 6552 may be formed using a stack including a plurality of insulating films formed using these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the method of forming the insulating layer 6552, and the insulating layer 6552 can be formed by any of the following methods and means depending on its material: a sputtering method, an SOG method, spin coating, dipping, spray coating, a droplet discharging method (e.g., an ink jet method, screen printing, or offset printing), a doctor knife, a roll coater, a curtain coater, a knife coater, and the like. In the case where the insulating layer 6552 is formed using a material solution, the semiconductor layer may be annealed (at 300° C. to 400° C.) at the same time of a baking step. The step of baking the insulating layer 6552 serves to anneal the semiconductor layer, whereby the display device can be efficiently manufactured.

Further, a light-emitting element 6511 is provided over the TFT 6510. The light-emitting element 6511 is electrically connected to a source electrode or a drain electrode of the TFT 6510, and has a stacked-layer structure including a first electrode 6517 as a pixel electrode, an electroluminescence layer 6512, and a second electrode 6513. Note that the light-emitting element 6511 is not limited to the structure illustrated in FIGS. 23A and 23B. In a display device of Embodiment 4, the structure of the light-emitting element 6511 can be changed as appropriate in accordance with a direction of light emitted from the light-emitting element 6511, or the like.

A partition wall 6520 is provided over the first electrode 6517. Further, the light-emitting panel illustrated in FIGS. 23A and 23B includes the electroluminescence layer 6512 so as to be electrically connected to the first electrode 6517 through an opening portion provided in the partition wall 6520, and includes the second electrode 6513 over the electroluminescence layer 6512. The partition wall 6520 is preferably formed using a photosensitive material. An opening portion is preferably formed in a layer of the photosensitive material over the first electrode 6517 such that a sidewall of the opening portion is formed as an inclined surface with continuous curvature, whereby the partition wall 6520 is preferably formed.

The electroluminescence layer 6512 can be formed using the same material as the electroluminescence layer included in the light-emitting element 615 illustrated in FIG. 15B. The electroluminescence layer 6512 may be formed using a single layer or a stack including a plurality of layers.

In the light-emitting panel illustrated in FIGS. 23A and 23B, in order to prevent oxygen, hydrogen, moisture, carbon dioxide, or the like from entering the light-emitting element 6511, a protective layer may be formed over the second electrode 6513 and the partition wall 6520. The protective layer can be formed using a silicon nitride film, a silicon nitride oxide film, a DLC film, or the like.

Various signals and potentials are supplied from FPCs 6518a and 6518b to the signal line driver circuits 6503a and 6503b, the scan line driver circuits 6504a and 6504b, or the pixel portion 6502.

In the light-emitting panel illustrated in FIGS. 23A and 23B, a connection terminal electrode 6515 is formed using the same conductive film as the first electrode 6517 included in the light-emitting element 6511, and a terminal electrode 6516 is formed using the same conductive film as gate electrodes included in the TFTs 6509 and 6510.

Further, a semiconductor layer 6550 is provided over the terminal electrode 6516. The semiconductor layer 6550 has a function as an electrode of a capacitor included in a filter circuit.

The connection terminal electrode 6515 is electrically connected to a terminal included in the FPC 6518a through an anisotropic conductive film 6519.

As a substrate to be placed in the direction in which light is emitted from the light-emitting element 6511, a substrate having a light-transmitting property is preferably used. The substrate having a light-transmitting property can be formed using a material having a light-transmitting property such as a glass plate, a plastic plate, a polyester film, or an acrylic film.

As the filler 6507, an ultraviolet curable resin or a thermosetting resin can be used, as well as an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In the display device illustrated in FIGS. 23A and 23B, nitrogen is used as the filler 6507 as an example.

As needed, an optical film such as a polarizing plate, a circularly polarizing plate (including an elliptically polarizing plate), a retardation plate (a quarter-wave plate or a half-wave plate), or a color filter may be provided for a surface to which light from the light-emitting element 6511 is emitted, as appropriate. Further, a polarizing plate or a circularly polarizing plate may be provided with an anti-reflection film. For example, anti-glare treatment by which reflected light can be diffused by unevenness on the surface so as to reduce the glare can be performed.

The structure of the signal line driver circuits 6503a and 6503b and the scan line driver circuits 6504a and 6504b are not limited to the structures illustrated in FIGS. 23A and 23B. In the display device of Embodiment 4, a structure in which a driver circuit including a semiconductor element formed using a single crystal semiconductor film or a polycrystalline semiconductor film is mounted on another substrate may be used. Further, all or part of the signal line driver circuits 6503a and 6503b, or all or part of the scan line driver circuits 6504a and 6504b may be separately formed and mounted.

Through the above steps, a highly reliable light-emitting panel can be manufactured.

Next, as one mode of the display device in Embodiment 4, an appearance and a cross section of a liquid crystal panel is described with reference to FIGS. 24A1, 24A2, and 24B. FIGS. 24A1, 24A2, and 24B illustrate an example of a structure of a liquid crystal panel in Embodiment 4. FIGS. 24A1 and 24A2 are top views and FIG. 24B is a cross-sectional view taken along line M-N of FIGS. 24A1 and 24A2.

The liquid crystal panel illustrated in FIGS. 24A1, 24A2, and 24B includes a pixel portion 6002, a signal line driver circuit 6003, and a scan line driver circuit 6004 over a first substrate 6001, and a sealant 6000 and a sealant 6005 are provided so as to surround the pixel portion 6002, the signal line driver circuit 6003, and the scan line driver circuit 6004. A second substrate 6006 is provided over the pixel portion 6002 and the scan line driver circuit 6004, and the pixel portion 6002, the scan line driver circuit 6004, and a liquid crystal layer 6008 are sealed with the first substrate 6001, the sealant 6000, the sealant 6005, and the second substrate 6006. TFTs 6010 and 6011 and a liquid crystal element 6013 are included, and, over the first substrate 6001, the TFTs 6010 and 6011 and the liquid crystal element 6013 are sealed with the sealant 6000 and the sealant 6005 between the first substrate 6001 and the second substrate 6006. Furthermore, in a region over the first substrate 6001 other than a region surrounded by the sealant 6000 and the sealant 6005, the signal line driver circuit 6003 provided over another substrate is mounted.

Note that the connection method of a driver circuit which is separately formed is not particularly limited, and a COG method, a wire bonding method, a TAB method, or the like can be used. FIG. 24A1 illustrates an example of mounting the signal line driver circuit 6003 by a COG method, and FIG. 24A2 illustrates an example of mounting the signal line driver circuit 6003 by a TAB method.

The pixel portion 6002 and the scan line driver circuit 6004, which are provided over the first substrate 6001, include a plurality of TFTs. FIG. 24B illustrates the TFT 6010 included in the pixel portion 6002 and the TFT 6011 included in the scan line driver circuit 6004.

As the TFTs 6010 and 6011, any of the TFTs having the structures described in above Embodiments can be used. In the liquid crystal panel illustrated in FIGS. 24A1, 24A2, and 24B, a TFT having the structure illustrated in FIG. 16A is used as an example of a TFT. Note that in the liquid crystal panel illustrated in FIGS. 24A1, 24A2, and 24B, the TFTs 6010 and 6011 are n-channel TFTs.

Further, a pixel electrode 6030 included in the liquid crystal element 6013 is electrically connected to a source electrode or a drain electrode of the TFT 6010. A counter electrode 6031 of the liquid crystal element 6013 is formed on the second substrate 6006. A portion where the pixel electrode 6030, the counter electrode 6031, and the liquid crystal layer 6008 overlap with each other corresponds to the liquid crystal element 6013. Note that the pixel electrode 6030 and the counter electrode 6031 are provided with an insulating layer 6032 and an insulating layer 6033, respectively, each of which has a function as an alignment film, and sandwich the liquid crystal layer 6008 with the insulating layer 6032 and the insulating layer 6033 interposed between the pixel electrode 6030 and the counter electrode 6031.

A spacer 6035 is a columnar partition wall obtained by selective etching of an insulating film, and is provided in order to control a distance (a cell gap) between the pixel electrode 6030 and the counter electrode 6031. Alternatively, a spherical spacer may be used. Further, the counter electrode 6031 is electrically connected to a common potential line provided over the same substrate as the TFT 6010. The counter electrode 6031 and the common potential line can be electrically connected to each other using a common connecting portion, with conductive particles which are arranged between the pair of substrates interposed therebetween. Note that the conductive particles are contained in the sealant 6005.

The liquid crystal panel illustrated in FIGS. 24A1, 24A2, and 24B is an example of a transmissive liquid crystal display panel; however, the present invention is not limited thereto. The liquid crystal display panel in Embodiment 4 may also be a reflective liquid crystal display panel or a semi-transmissive liquid crystal display panel.

The liquid crystal display panel in Embodiment 4 can have a structure in which a polarizing plate is provided on the outer side (on the viewing side) of the substrate and a coloring layer and an electrode used for a display element are provided in this order on the inner side thereof, or a structure in which a polarizing plate is provided on the inner side thereof. The stacked-layer structure of the polarizing plate and the coloring layer may be set as appropriate in accordance with the materials of the polarizing plate and the coloring layer and the condition of the manufacturing process. Further, a light-blocking film serving as a black matrix may be provided.

In the liquid crystal display panel illustrated in FIGS. 24A1, 24A2, and 24B, in order to reduce surface unevenness of the TFTs and to improve the reliability of the TFTs, the TFTs are covered with insulating layers (an insulating layer 6020 and an insulating layer 6021) functioning as a protective layer and a planarizing insulating film.

Here, the insulating layer 6020 having a stacked-layer structure is formed as the protective layer. Here, a silicon oxide film is formed as a first layer of the insulating layer 6020 by a sputtering method. The use of the silicon oxide film as the protective layer is effective in preventing hillocks in an aluminum film used as a source electrode and a drain electrode.

Moreover, a silicon nitride film is formed by a sputtering method as a second layer of the insulating layer 6020. The use of the silicon nitride film as the protective layer can prevent mobile ions such as sodium from entering the semiconductor region and changing electric characteristics of the TFT.

Further, after the protective layer is formed, annealing (250° C. to 400° C.) may be performed on the semiconductor layer.

The insulating layer 6021 is formed as the planarizing insulating film. An organic material having heat resistance, such as polyimide, acrylic, benzocyclobutene, polyamide, or epoxy can be used for the insulating layer 6021. Other than such organic materials, it is also possible to use a low-dielectric constant material (a low-k material), a siloxane-based resin, phosphosilicate glass (PSG), borophosphosilicate glass (BPSG), or the like. Note that the insulating layer 6021 may be formed using a stack including a plurality of insulating films formed using these materials.

There is no particular limitation on the method of forming the insulating layer 6021, and the insulating layer 6021 can be formed by any of the following methods and means depending on its material: a sputtering method, an SOG method, spin coating, dipping, spray coating, a droplet discharging method (e.g., an ink jet method, screen printing, or offset printing), a doctor knife, a roll coater, a curtain coater, a knife coater, and the like. In the case where the insulating layer 6021 is formed using a material solution, the semiconductor layer may be annealed (at 300° C. to 400° C.) at the same time of a baking step. The step of baking the insulating layer 6021 serves to anneal the semiconductor layer, whereby a display device can be efficiently manufactured.

The pixel electrode 6030 or the counter electrode 6031 can be formed using a conductive material having a light-transmitting property such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added, for example.

In addition, a conductive composition containing a conductive high molecule (also referred to as a conductive polymer) can be used for forming the pixel electrode 6030 and the counter electrode 6031. The pixel electrode formed using the conductive composition preferably has a sheet resistance of less than or equal to 10000 ohms per square and a transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of more than two kinds of these materials, and the like can be given.

Various signals and potentials are supplied from an FPC 6018 to the signal line driver circuit 6003, which is separately formed, the scan line driver circuit 6004, or the pixel portion 6002.

Further, a connection terminal electrode 6015 is formed using the same conductive film as the pixel electrode 6030 included in the liquid crystal element 6013, and a terminal electrode 6016 is formed using the same conductive film as gate electrodes of the TFTs 6010 and 6011.

Further, a semiconductor layer 6050 is provided over the terminal electrode 6016. The semiconductor layer 6050 has a function as an electrode of a capacitor included in a filter circuit.

The connection terminal electrode 6015 is electrically connected to a terminal included in the FPC 6018 through an anisotropic conductive film 6019.

The liquid crystal panel illustrated in FIGS. 24A1, 24A2, and 24B has a structure in which the signal line driver circuit 6003 is separately formed and the signal line driver circuit 6003 is mounted on the first substrate 6001. However, the present invention is not limited thereto. In the liquid crystal panel of Embodiment 4, the scan line driver circuit may be formed separately and mounted, or only part of the signal line driver circuit or part of the scan line driver circuit may be formed separately and mounted.

A liquid crystal panel to which the semiconductor device, which is an embodiment of the present invention, is applied can be manufactured as illustrated in FIGS. 24A1, 24A2, and 24B as an example.

Figure 25:
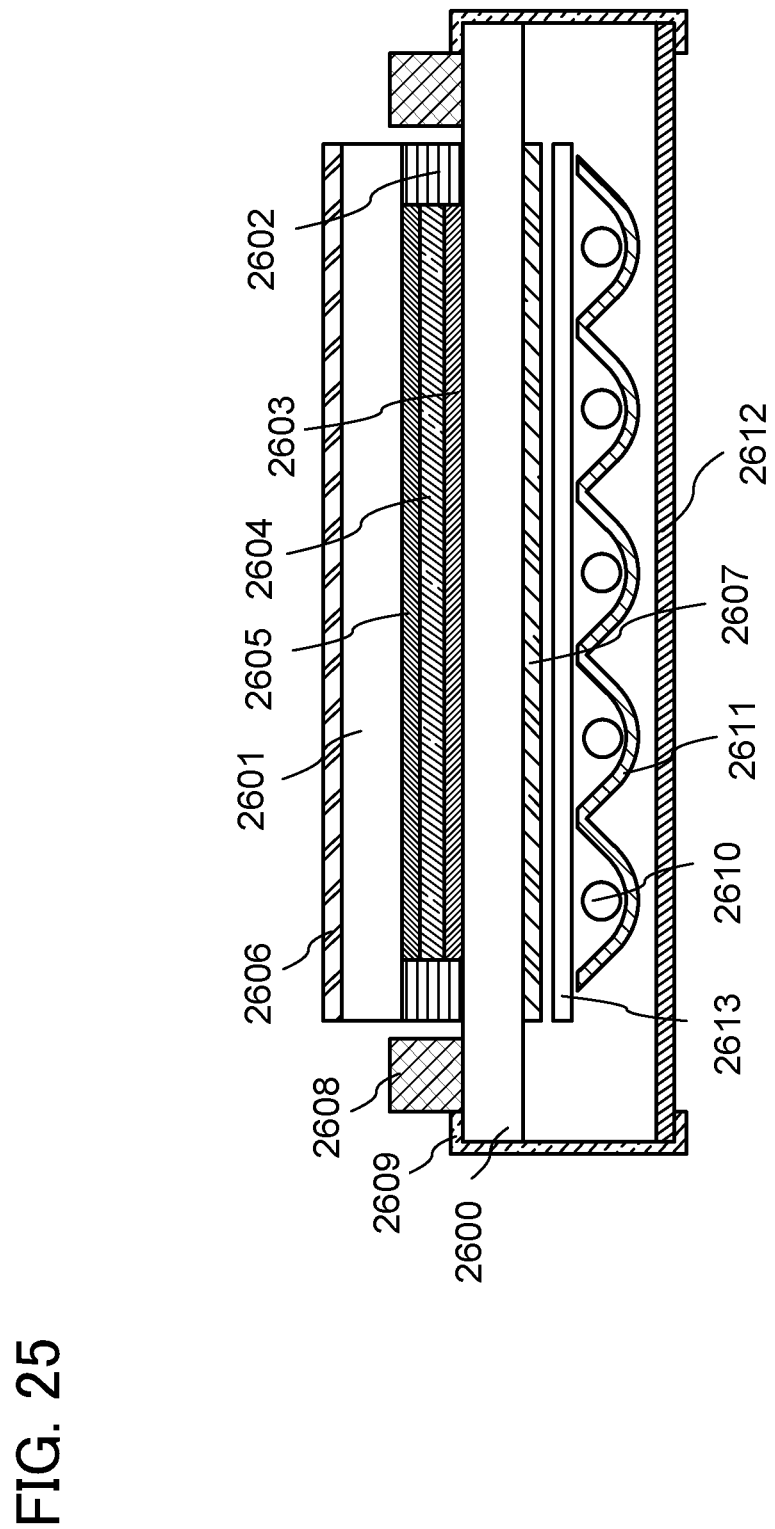
FIG. 25 illustrates an example of a liquid crystal display module in Embodiment 4.

An example of a liquid crystal display module using the liquid crystal panel is described with reference to FIG. 25. FIG. 25 illustrates an example of a liquid crystal display module of Embodiment 4.

A liquid crystal display module illustrated in FIG. 25 has a structure in which a TFT substrate 2600 and a counter substrate 2601 are fixed to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the RGB system, respective coloring layers corresponding to colors of red, green, and blue are provided for respective pixels. The outer sides of the TFT substrate 2600 and the counter substrate 2601 are provided with a polarizing plate 2606, a polarizing plate 2607, and a diffusing plate 2613. A light source includes a cold cathode tube 2610 and a reflective plate 2611. A circuit board 2612 is connected to a wiring circuit portion 2608 of the TFT substrate 2600 through a flexible wiring board 2609. The circuit board 2612 includes an external circuit such as a control circuit and a power source circuit. The polarizing plate and the liquid crystal layer may be stacked with a retardation plate therebetween.

Thus, a liquid crystal display module can be formed using the liquid crystal panel of Embodiment 4.

Note that the display device of Embodiment 4 includes a filter circuit provided with a capacitor including an oxide semiconductor layer in a connection portion with an FPC. Therefore, even in the case where a video signal has noise, for example, adverse effects of the noise can be reduced. Further, even in the case where a glass substrate, a plastic substrate, or the like is used as a substrate in the display device of Embodiment 4, adverse effects of charge which is charged in the substrate can be reduced. The same can be said for the case of using, for example, a substrate, the size of which exceeds 3 m of the tenth generation.

Note that Embodiment 4 can be combined with any of Embodiments 1 to 3 and Embodiments 5 and 6, as appropriate.

(Embodiment 5)

In Embodiment 5, electronic paper is described as an example of the display device which is an embodiment of the present invention.

A semiconductor device which is an embodiment of the present invention can be applied to electronic paper. Electronic paper is also referred to as an electrophoretic display device (an electrophoretic display) and has advantages of having high readability which is equivalent to normal paper and lower power consumption than other display devices, and being thin and lightweight.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

In this way, an electrophoretic display is a display that utilizes a so-called dielectrophoretic effect by which a substance that has a high dielectric constant moves to a region in which there is a high electric field. An electrophoretic display does not need to use a polarizing plate or a counter substrate, which is required in a liquid crystal display device, and both the thickness and weight of the electrophoretic display device can be reduced to a half of those of a liquid crystal display device.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, if a plurality of the above microcapsules is arranged as appropriate over an active matrix substrate so as to be interposed between two electrodes, an active matrix display device can be completed, and display can be performed by application of an electric field to the microcapsules.

Note that the first particles and the second particles in the microcapsules may each be formed of a single material selected from a conductive material, an insulating material, a semiconductor material, a magnetic material, a liquid crystal material, a ferroelectric material, an electroluminescence material, an electrochromic material, and a magnetophoretic material, or formed using a composite material of any of these.

Figure 26:
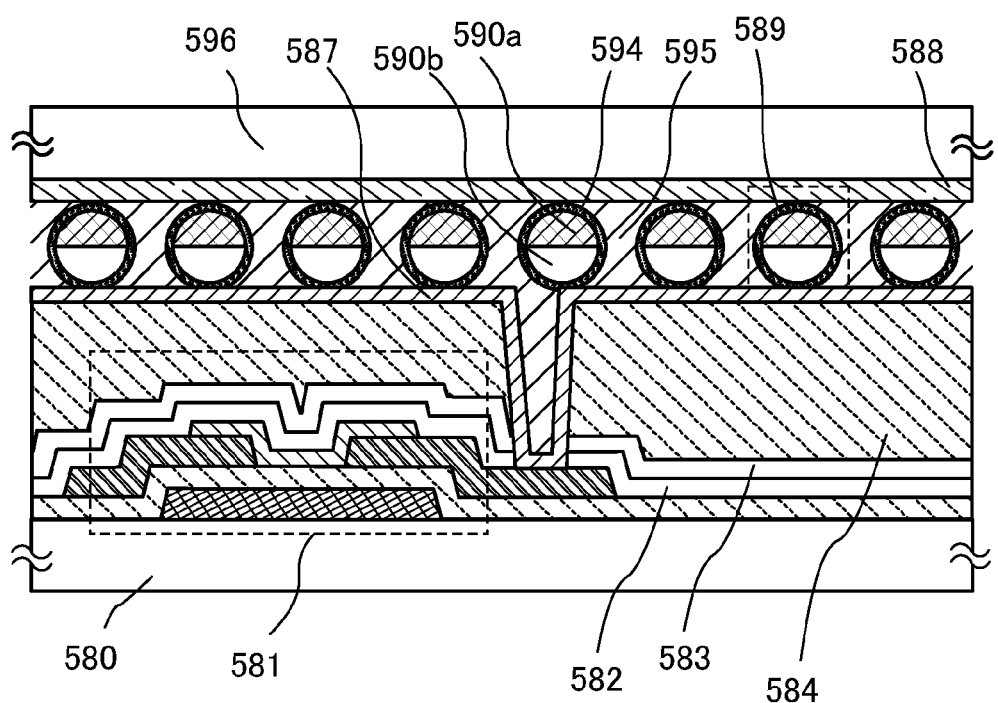
FIG. 26 is a cross-sectional view illustrating an example of a structure of electronic paper in Embodiment 5.

Next, a structure of electronic paper in Embodiment 5 is described with reference to FIG. 26. FIG. 26 is a cross-sectional view illustrating an example of a structure of electronic paper in Embodiment 5.

The electronic paper illustrated in FIG. 26 includes a TFT 581 over a substrate 580; an insulating layer 582, an insulating layer 583, and an insulating layer 584 which are stacked over the TFT 581; an electrode 587 which is in contact with a source electrode or a drain electrode of the TFT 581 through an opening portion provided in the insulating layers 582 to 584; between the electrode 587 and an electrode 588 provided on a substrate 596, spherical particles 589, each of which includes a black region 590a, a white region 590b, and in which a cavity 5904 filled with liquid is included around the black region 590a and the white region 590b; and a filler 595 provided around the spherical particles 589.

The TFT 581 can be formed using a semiconductor device which is an embodiment of the present invention. In the electronic paper illustrated in FIG. 26, as an example, the semiconductor device having the structure illustrated in FIG. 16A is applied.

A method of using the spherical particles 589 is called a twisting ball display method. In the twisting ball display system, spherical particles each colored in black and white are arranged between a first electrode and a second electrode which are electrodes used for a display element, and potential difference is generated between the first electrode and the second electrode to control orientation of the spherical particles; accordingly, display is performed.

Further, instead of the spherical element, an electrophoretic element can also be used. A microcapsule having a diameter of about 10 μm to 200 μm in which transparent liquid, positively charged white microparticles, and negatively charged black microparticles are encapsulated, is used. In the microcapsule provided between the first electrode and the second electrode, when an electric field is applied by the first electrode and the second electrode, the white microparticles and the black microparticles move to opposite directions to each other, so that white or black can be displayed. A display element using this principle is an electrophoretic display element. The electrophoretic display element has higher reflectance than a liquid crystal display element, and thus, an auxiliary light is unnecessary, power consumption is low, and a display portion can be recognized in a dim place. Further, even when power is not supplied to the display portion, an image which has been displayed once can be maintained. Accordingly, a displayed image can be stored even if a semiconductor device having a display function (which may simply be referred to as a display device or a semiconductor device provided with a display device) is distanced from an electric wave source.

As illustrated in FIG. 26 as an example, the electronic paper in Embodiment 5 can include a capacitor formed using an oxide semiconductor layer, a conductive layer forming a wiring or an electrode, and an insulating layer provided between the oxide semiconductor layer and the conductive layer, as in the terminal portion described in above Embodiments. The capacitor has a function as part of a protection circuit. The capacitor has a function as part of a filter circuit for reducing adverse effects of noise; therefore, also in the case where such a capacitor is used for electronic paper, adverse effects on actual operation can be similarly reduced, and adverse effects of noise can be reduced.

Figure 27:
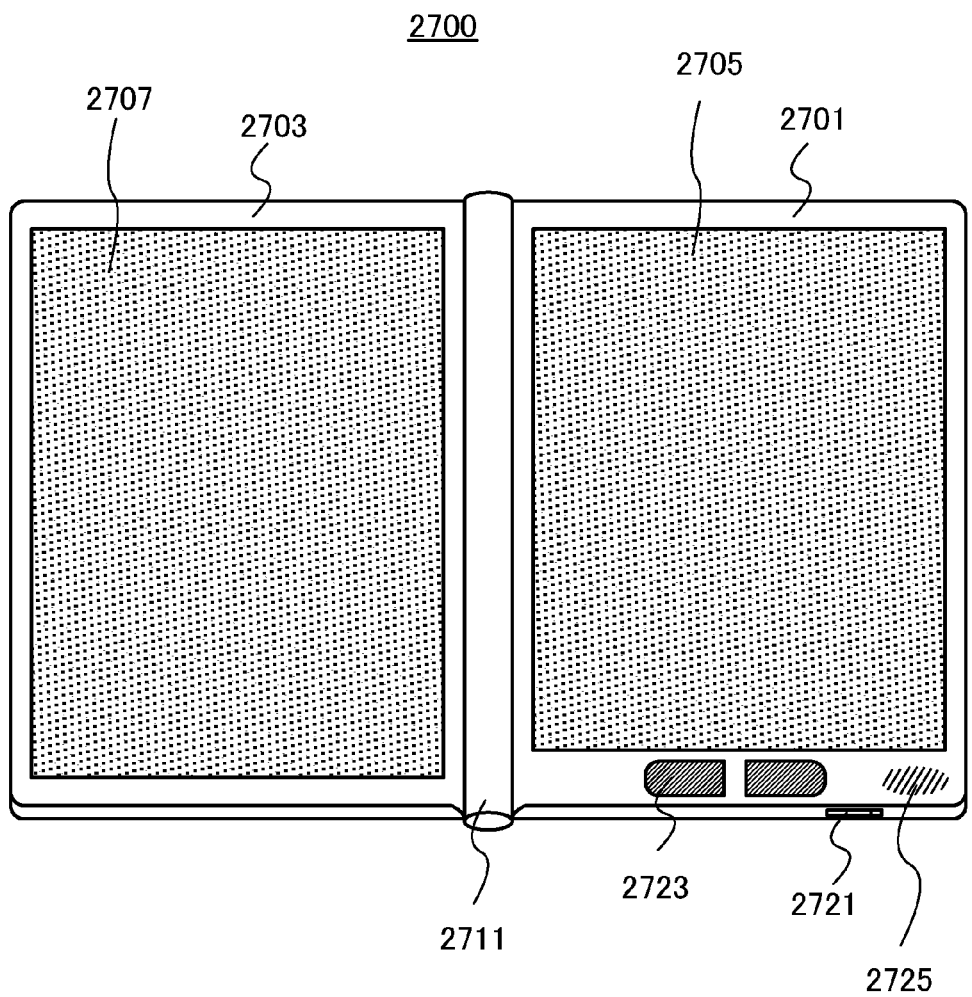
FIG. 27 illustrates an example of a structure of an e-book reader in Embodiment 5.

The electronic paper can be used in electronic appliances of various fields, which display information. For example, the electronic paper can be applied to e-book readers (electronic books), posters, advertisements on vehicles such as trains, or displays on a variety of cards such as credit cards. An example of such an electronic appliance is illustrated in FIG. 27. FIG. 27 illustrates an example of an e-book reader of Embodiment 5.

As illustrated in FIG. 27, an e-book reader 2700 has two housings: a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display different images, and for example, may display a series of images. In the case where the display portion 2705 and the display portion 2707 display different images, for example, text can be displayed on a display portion on the right side (the display portion 2705 in FIG. 27) and graphics can be displayed on a display portion on the left side (the display portion 2707 in FIG. 27).

FIG. 27 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an e-book server.

Note that Embodiment 5 can be combined with any of Embodiments 1 to 4 and Embodiment 6, as appropriate.
(Embodiment 6)

In Embodiment 6, electronic appliances each provided with a display device which is an embodiment of the present invention for a display portion is described.

Examples of a structure of an electronic appliance of Embodiment 6 are described with reference to FIGS. 28A and 28B, FIGS. 29A and 29B, and FIGS. 30A and 30B. FIGS. 28A and 28B, FIGS. 29A and 29B, and FIGS. 30A and 30B each illustrate an example of a structure of an electronic appliance of Embodiment 6.

A display device which is an embodiment of the present invention can be applied to a variety of electronic appliances (including game machines). Examples of electronic appliances are a television device (also referred to as a television or a television receiver), a monitor of a computer or the like, a camera such as a digital camera or a digital video camera, a digital photo frame, a mobile phone (also referred to as a mobile telephone or a mobile phone device), a portable game console, a portable information terminal, an audio reproducing device, a large-sized game machine such as a pachinko machine, and the like.

Figure 28A:
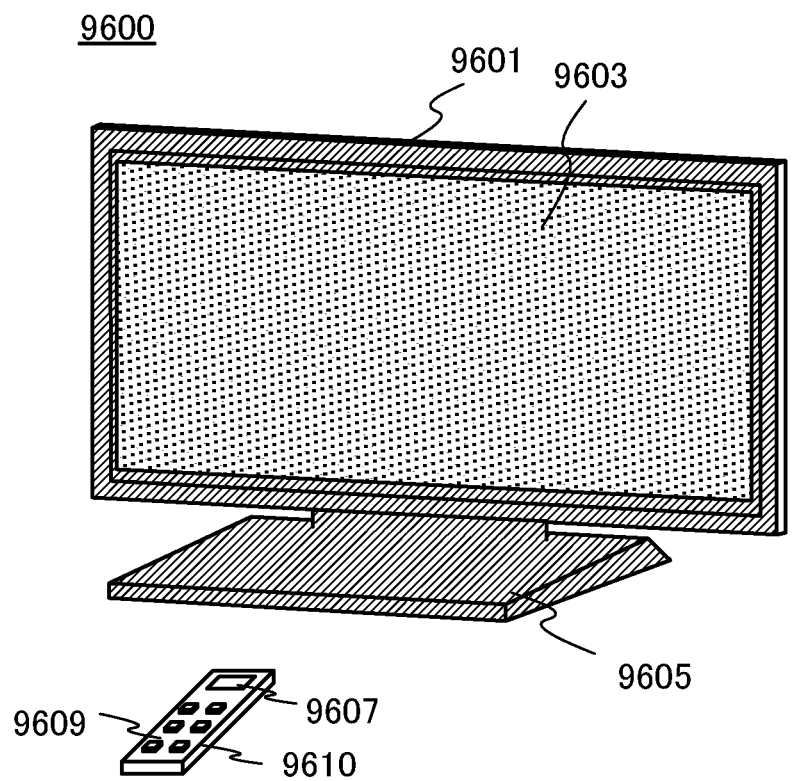
FIGS. 28A and 28B illustrate examples of a structure of an electronic appliance in Embodiment 6.

FIG. 28A illustrates an example of a television set. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data outputted from the remote controller 9610. For example, the housing 9601 may have a light-transmitting property by using the display device of any of above Embodiments for the display portion 9603.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 28B:
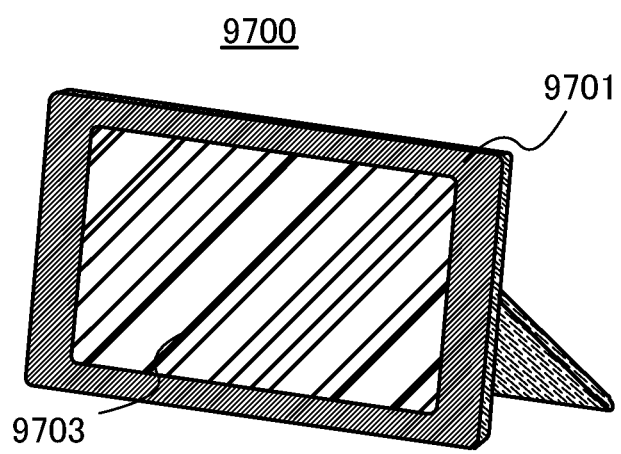

FIG. 28B illustrates an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 29A:
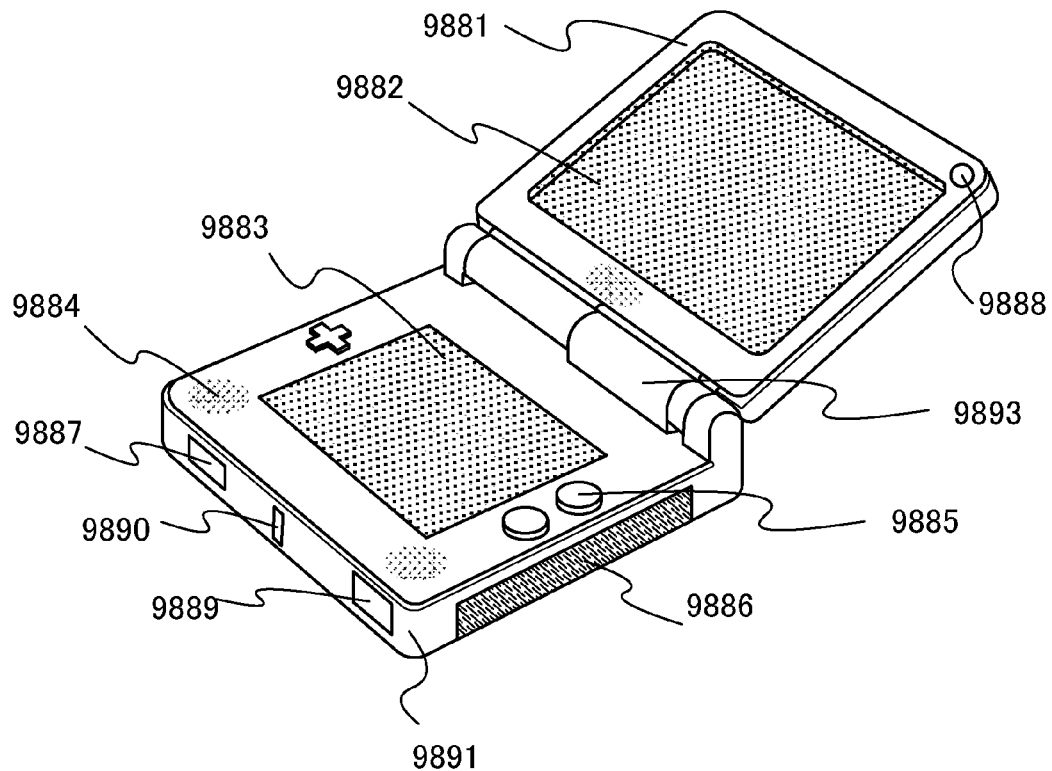
FIGS. 29A and 29B illustrate examples of a structure of the electronic appliance in Embodiment 6.

FIG. 29A is a portable game machine and includes two housings, a housing 9881 and a housing 9891, which are connected with a joint portion 9893 so that the portable game machine can be opened or folded. A display portion 9882 and a display portion 9883 are incorporated in the housing 9881 and the housing 9891, respectively. Moreover, the portable game machine illustrated in FIG. 29A is provided with a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. It is needless to say that the structure of the portable game machine is not limited to that described above. The portable game machine may have a structure in which additional accessory equipment is provided as appropriate as long as at least a display device is provided. The portable game machine in FIG. 29A has a function of reading a program or data stored in a recording medium to display it on the display portion, and a function of sharing information with another portable game machine by wireless communication. Note that a function of the portable game machine illustrated in FIG. 29A is not limited to those described above, and the portable game machine can have a variety of functions.

Figure 29B:
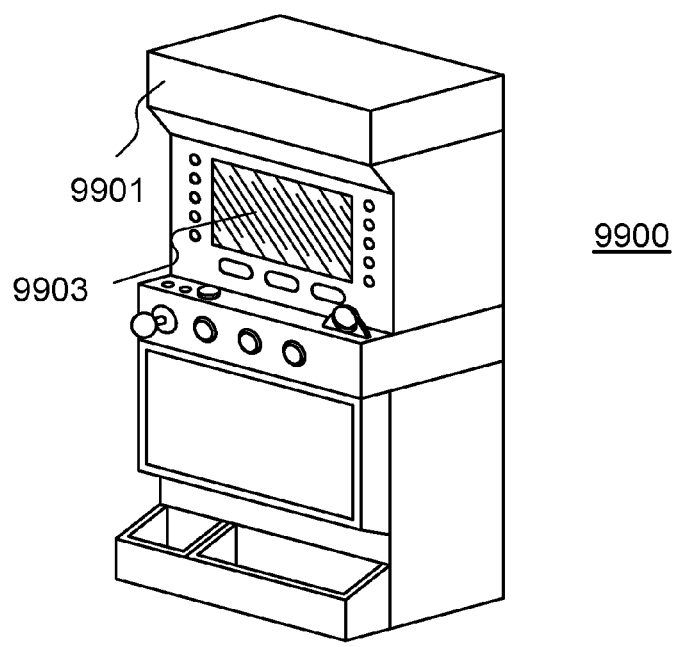

FIG. 29B illustrates an example of a slot machine which is a large-sized game machine. In the slot machine 9900, a display portion 9903 is incorporated in a housing 9901. In addition, the slot machine 9900 includes an operation means such as a start lever or a stop switch, a coin slot, a speaker, and the like. Needless to say, the structure of the slot machine 9900 is not limited to the above structure. The slot machine may have a structure in which additional accessory equipment is provided as appropriate as long as at least the display device according to the present invention is provided.

Figure 30A:
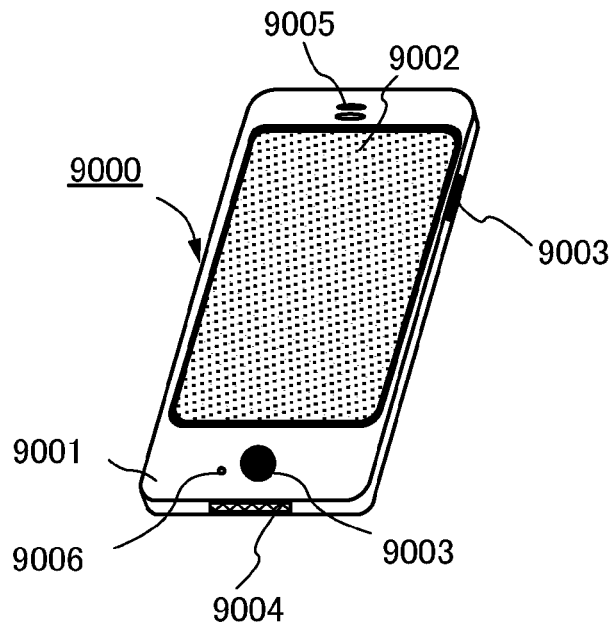
FIGS. 30A and 30B illustrate examples of a structure of the electronic appliance in Embodiment 6.

FIG. 30A illustrates an example of a mobile phone. A mobile phone 9000 is provided with a display portion 9002 incorporated into a housing 9001, an operation button 9003, an external connection port 9004, a speaker 9005, a microphone 9006, and the like.

When the display portion 9002 of the mobile phone 9000 illustrated in FIG. 30A is touched with a finger or the like, data can be input into the mobile phone 9000. Users can make a call or text messaging by touching the display portion 9002 with their fingers or the like.

There are mainly three screen modes of the display portion 9002. The first mode is a display mode mainly for displaying an image. The second mode is an input mode mainly for inputting data such as text. The third mode is a display-and-input mode in which two modes of the display mode and the input mode are combined.

For example, in the case of making a call or texting, a text input mode mainly for inputting text is selected for the display portion 9002 so that characters displayed on a screen can be input. In that case, it is preferable to display a keyboard or number buttons on almost all the area of the screen of the display portion 9002.

When a detection device including a sensor for detecting inclination, such as a gyroscope or an acceleration sensor, is provided inside the mobile phone 9000, display on the screen of the display portion 9002 can be automatically changed by determining the orientation of the mobile phone 9000 (whether the mobile phone 9000 stands upright or is laid down on its side).

The screen modes are changed by touching the display portion 9002 or using the operation buttons 9003 of the housing 9001. Alternatively, the screen modes may be changed depending on the kind of the image displayed on the display portion 9002. For example, when a signal of an image displayed on the display portion is a signal of moving image data, the screen mode is switched to the display mode. When the signal is a signal of text data, the screen mode is switched to the input mode.

Further, in the input mode, when input by touching the display portion 9002 is not performed for a certain period while a signal detected by an optical sensor in the display portion 9002 is detected, the screen mode may be controlled so as to be changed from the input mode to the display mode.

The display portion 9002 can also function as an image sensor. For example, an image of a palm print, a fingerprint, or the like is taken when the display portion 9002 is touched with a palm or a finger, whereby personal identification can be performed. Further, by providing a backlight or a sensing light source which emits a near-infrared light in the display portion, an image of a finger vein, a palm vein, or the like can be taken.

Figure 30B:
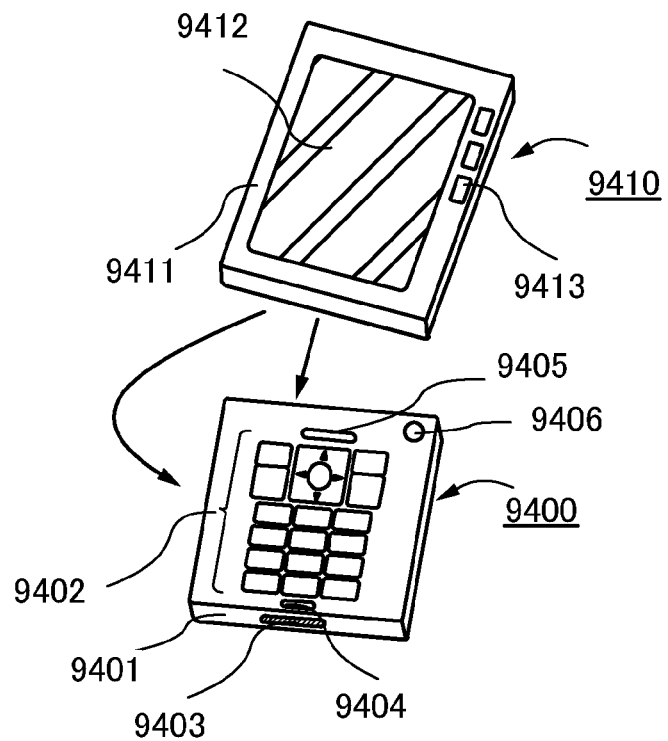

FIG. 30B also illustrates an example of a mobile phone. The mobile phone illustrated in FIG. 30B is provided with a display device 9410 having a display portion 9412 and operation buttons 9413 in a housing 9411 and a communication device 9400 having operation buttons 9402, an external input terminal 9403, a microphone 9404, a speaker 9405, and a light-emitting portion 9406 which emits light when receiving a call in a housing 9401. The display device 9410 having a display function can be detached from or attached to the communication device 9400 having a telephone function in two directions indicated by arrows. Accordingly, the display device 9410 and the communication device 9400 can be attached to each other along respective short axes or long axes. When only the display function is needed, the display device 9410 can be detached from the communication device 9400 and used alone. The communication device 9400 and the display device 9410 can transmit and receive images or input information to/from each other by wireless communication or wired communication, and each of the communication device 9400 and the display device 9410 has a rechargeable battery.

As described above as examples, the display device which is an embodiment of the present invention can be used for a variety of electronic appliances. Further, mounting of the display device which is an embodiment of the present invention can improve reliability of an electronic appliance.

Further, the display device which is an embodiment of the present invention is used for a display portion. Accordingly, even in the case where a housing has a light-transmitting property, reduction of a light-transmitting property can be suppressed. Moreover, even in the case where a housing has a light-transmitting property, overlap between a conductive layer and an oxide semiconductor layer in a plane view can suppress deterioration of the oxide semiconductor layer due to light incidence.

Note that Embodiment 6 can be combined with any of Embodiments 1 to 5, as appropriate.

This application is based on Japanese Patent Application serial no. 2009-078084 filed with Japan Patent Office on Mar. 27, 2009, the entire contents of which are hereby incorporated by reference.

What is claimed is:

1. A method for manufacturing a semiconductor device comprising:
    forming a first conductive layer and a second conductive layer over a substrate;
    forming a first insulating layer over the first conductive layer and the second conductive layer;
    forming an oxide semiconductor layer over the first insulating layer, wherein the oxide semiconductor layer continuously extends over the first conductive layer and the second conductive layer;
    forming a second insulating layer over the oxide semiconductor layer;
    forming a third conductive layer and a fourth conductive layer over the second insulating layer,
    wherein the third conductive layer, the first conductive layer and the oxide semiconductor layer overlap with each other;
    wherein the fourth conductive layer, the second conductive layer and the oxide semiconductor layer overlap with each other;
    wherein the third conductive layer contacts the first conductive layer through openings of the first insulating layer and the second insulating layer; and
    wherein the fourth conductive layer contacts the second conductive layer through openings of the first insulating layer and the second insulating layer.

2. The semiconductor device according to claim 1, wherein the third conductive layer extends in parallel with the first conductive layer.

3. The semiconductor device according to claim 1, wherein the fourth conductive layer extends in parallel with the second conductive layer.

4. The semiconductor device according to claim 1, wherein at least one of the first conductive layer and the second conductive layer is electrically connected to a scan line driver circuit over the substrate.

5. The semiconductor device according to claim 1, wherein at least one of the first conductive layer and the second conductive layer is electrically connected to a signal line driver circuit over the substrate.

6. The semiconductor device according to claim 1, wherein the semiconductor device is a display device.

7. The semiconductor device according to claim 1, wherein the semiconductor device is a liquid crystal device.

8. The semiconductor device according to claim 1, wherein the semiconductor device is an electroluminescence display device.

9. A method for manufacturing a semiconductor device comprising:
    forming a first conductive layer in a terminal portion and a second conductive layer in a pixel portion over a substrate;

forming a first insulating layer over the first conductive layer;

forming a first oxide semiconductor layer in the terminal portion and a second oxide semiconductor layer in the pixel portion, wherein the first oxide semiconductor layer overlaps with the first conductive layer with the first insulating layer interposed therebetween;

forming a second insulating layer over the first oxide semiconductor layer;

forming a third conductive layer over the second insulating layer, wherein the third conductive layer, the first conductive layer and the first oxide semiconductor layer overlap with each other;

wherein the third conductive layer contacts the first conductive layer through openings of the first insulating layer and the second insulating layer.

10. The semiconductor device according to claim 9, wherein the third conductive layer extends in parallel with the first conductive layer.

11. The semiconductor device according to claim 9, wherein the first conductive layer is electrically connected to a scan line driver circuit over the substrate.

12. The semiconductor device according to claim 9, wherein at least one of the first conductive layer and the second conductive layer is electrically connected to a signal line driver circuit over the substrate.

13. The semiconductor device according to claim 9, wherein the semiconductor device is a display device.

14. The semiconductor device according to claim 9, wherein the semiconductor device is a liquid crystal device.

15. The semiconductor device according to claim 9, wherein the semiconductor device is an electroluminescence display device.

* * * * *